United States Patent
Nakagawa et al.

(10) Patent No.: US 10,536,657 B2
(45) Date of Patent: Jan. 14, 2020

(54) IMAGING DEVICE AND ELECTRONIC DEVICE

(71) Applicant: SEMICONDUCTOR ENERGY LABORATORY CO., LTD., Atsugi-shi, Kanagawa-ken (JP)

(72) Inventors: Takashi Nakagawa, Kanagawa (JP); Munehiro Kozuma, Kanagawa (JP); Yoshiyuki Kurokawa, Kanagawa (JP); Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/081,322

(22) PCT Filed: Mar. 9, 2017

(86) PCT No.: PCT/IB2017/051375
§ 371 (c)(1),
(2) Date: Aug. 30, 2018

(87) PCT Pub. No.: WO2017/158478
PCT Pub. Date: Sep. 21, 2017

(65) Prior Publication Data
US 2019/0096206 A1 Mar. 28, 2019

(30) Foreign Application Priority Data
Mar. 18, 2016 (JP) .................. 2016-055039

(51) Int. Cl.
*H04N 5/369* (2011.01)
*H04N 5/232* (2006.01)
(Continued)

(52) U.S. Cl.
CPC ..... *H04N 5/3698* (2013.01); *G08B 13/19604* (2013.01); *H01L 27/14641* (2013.01);
(Continued)

(58) Field of Classification Search
CPC ......... H04N 5/23241; H04N 5/232411; H04N 5/23245; H04N 5/23254; H04N 5/3205;
(Continued)

(56) References Cited

U.S. PATENT DOCUMENTS 5,705,807 A   1/1998   Throngnumchai
7,674,650 B2  3/2010   Akimoto et al.
(Continued)

FOREIGN PATENT DOCUMENTS

JP   2007-096055 A   4/2007
JP   2011-119711 A   6/2011
(Continued)

OTHER PUBLICATIONS

International Search Report (Application No. PCT/IB2017/051375) dated Jun. 27, 2017.
(Continued)

*Primary Examiner* — Daniel M Pasiewicz
(74) *Attorney, Agent, or Firm* — Nixon Peabody LLP; Jeffrey L. Costellia

(57) ABSTRACT

An imaging device with low power consumption is provided. It includes a pixel capable of outputting difference data between two different frames, a circuit determining the significance of the difference data, a circuit controlling power supply, an A/D converter, and the like; obtains image data and then obtains difference data; and shuts off power supply to the A/D converter and the like in the case where it is determined that there is no difference, and continues or restarts the power supply to the A/D converter and the like when it is determined that there is a difference. Determining the significance of the difference data can be performed row by row in a pixel array or at nearly the same time in all the pixels included in the pixel array.

7 Claims, 39 Drawing Sheets

(51) Int. Cl.
*H04N 5/32* (2006.01)
*H04N 5/374* (2011.01)
*H04N 5/376* (2011.01)
*G08B 13/196* (2006.01)
*H01L 27/146* (2006.01)
*H04N 5/3745* (2011.01)
*H04N 5/378* (2011.01)

(52) U.S. Cl.
CPC ..... *H04N 5/23245* (2013.01); *H04N 5/23254* (2013.01); *H04N 5/232411* (2018.08); *H04N 5/3205* (2013.01); *H04N 5/376* (2013.01); *H04N 5/3741* (2013.01); *H04N 5/3742* (2013.01); *H04N 5/37452* (2013.01); *H04N 5/378* (2013.01)

(58) Field of Classification Search
CPC .. H04N 5/3698; H04N 5/3741; H04N 5/3742; H04N 5/376; H04N 5/378; G08B 13/19604
See application file for complete search history.

(56) References Cited

U.S. PATENT DOCUMENTS

| | | | |
|---|---|---|---|
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 8,362,538 B2 | 1/2013 | Koyama et al. |
| 8,378,391 B2 | 2/2013 | Koyama et al. |
| 8,410,838 B2 | 4/2013 | Kato et al. |
| 8,455,868 B2 | 6/2013 | Yamazaki et al. |
| 8,466,463 B2 | 6/2013 | Akimoto et al. |
| 8,575,985 B2 | 11/2013 | Ohmaru et al. |
| 8,629,069 B2 | 1/2014 | Akimoto et al. |
| 8,669,550 B2 | 3/2014 | Akimoto et al. |
| 8,705,292 B2 | 4/2014 | Fujita |
| 8,754,693 B2 | 6/2014 | Nishijima |
| 8,785,928 B2 | 7/2014 | Yamazaki et al. |
| 8,790,959 B2 | 7/2014 | Akimoto et al. |
| 8,796,069 B2 | 8/2014 | Akimoto et al. |
| 8,916,869 B2 | 12/2014 | Koyama et al. |
| 9,099,562 B2 | 8/2015 | Akimoto et al. |
| 9,207,751 B2 | 12/2015 | Nishijima |
| 9,331,112 B2 | 5/2016 | Koyama et al. |
| 9,343,120 B2 | 5/2016 | Shionoiri et al. |
| 9,349,735 B2 | 5/2016 | Yamazaki et al. |
| 9,384,813 B2 | 7/2016 | Aoki et al. |
| 9,477,294 B2 | 10/2016 | Nishijima et al. |
| 9,705,398 B2 | 7/2017 | Takahashi |
| 9,773,814 B2 | 9/2017 | Koyama et al. |
| 9,860,465 B2 | 1/2018 | Ohmaru |
| 9,876,946 B2 | 1/2018 | Ikeda |
| 9,887,218 B2 | 2/2018 | Ohmaru |
| 9,912,897 B2 | 3/2018 | Okamoto et al. |
| 10,021,329 B2 | 7/2018 | Ohmaru |
| 2008/0308805 A1 | 12/2008 | Akimoto et al. |
| 2011/0104851 A1 | 5/2011 | Akimoto et al. |
| 2011/0121290 A1 | 5/2011 | Akimoto et al. |
| 2013/0016035 A1 | 1/2013 | Ikeda |
| 2013/0222584 A1* | 8/2013 | Aoki ..................... H04N 5/335 348/143 |
| 2015/0332568 A1 | 11/2015 | Kurokawa |
| 2015/0340513 A1 | 11/2015 | Akimoto et al. |
| 2016/0021314 A1* | 1/2016 | Kurokawa ........... G09G 3/3233 348/333.01 |
| 2016/0037106 A1* | 2/2016 | Ohmaru ............... H04N 5/3698 348/143 |
| 2016/0094796 A1* | 3/2016 | Govil .................. H04N 5/3456 348/295 |
| 2016/0260718 A1 | 9/2016 | Yamazaki et al. |
| 2016/0329368 A1* | 11/2016 | Ohmaru ........... H01L 27/14616 |
| 2016/0356645 A1 | 12/2016 | Yoneda et al. |
| 2017/0365209 A1 | 12/2017 | Kurokawa |
| 2018/0184030 A1 | 6/2018 | Ikeda |

FOREIGN PATENT DOCUMENTS

| | | |
|---|---|---|
| JP | 2013-211840 A | 10/2013 |
| JP | 2014-116762 A | 6/2014 |
| JP | 2016-027694 A | 2/2016 |
| WO | WO-2014/087840 | 6/2014 |

OTHER PUBLICATIONS

Written Opinion (Application No. PCT/IB2017/051375) dated Jun. 27, 2017.

* cited by examiner

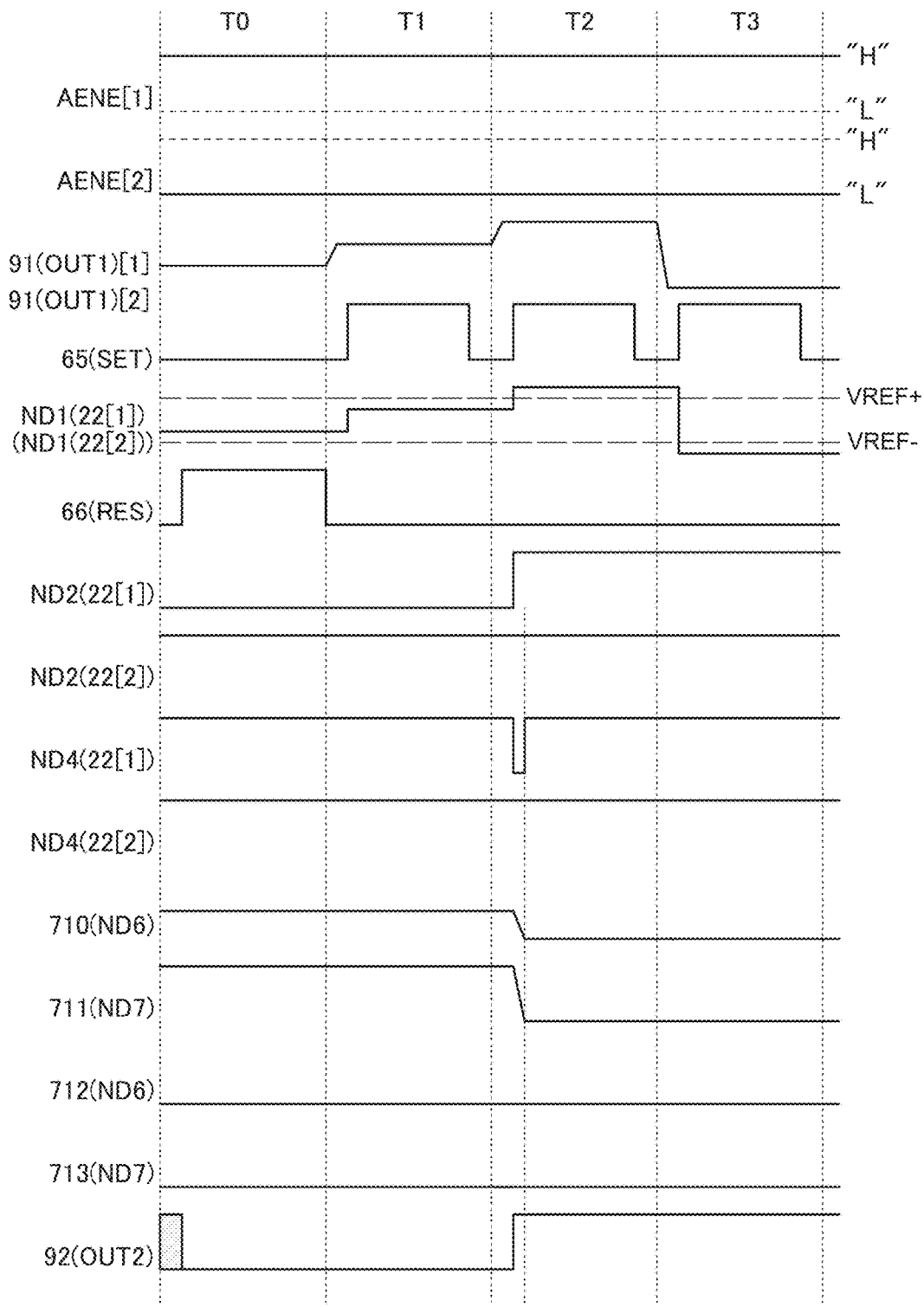

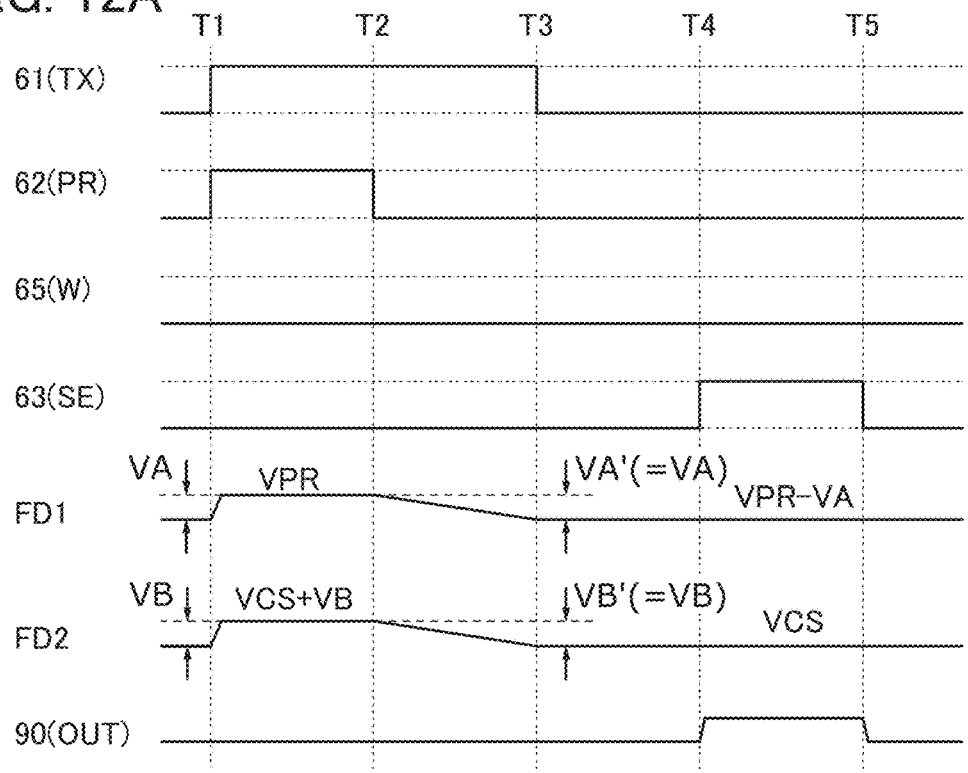
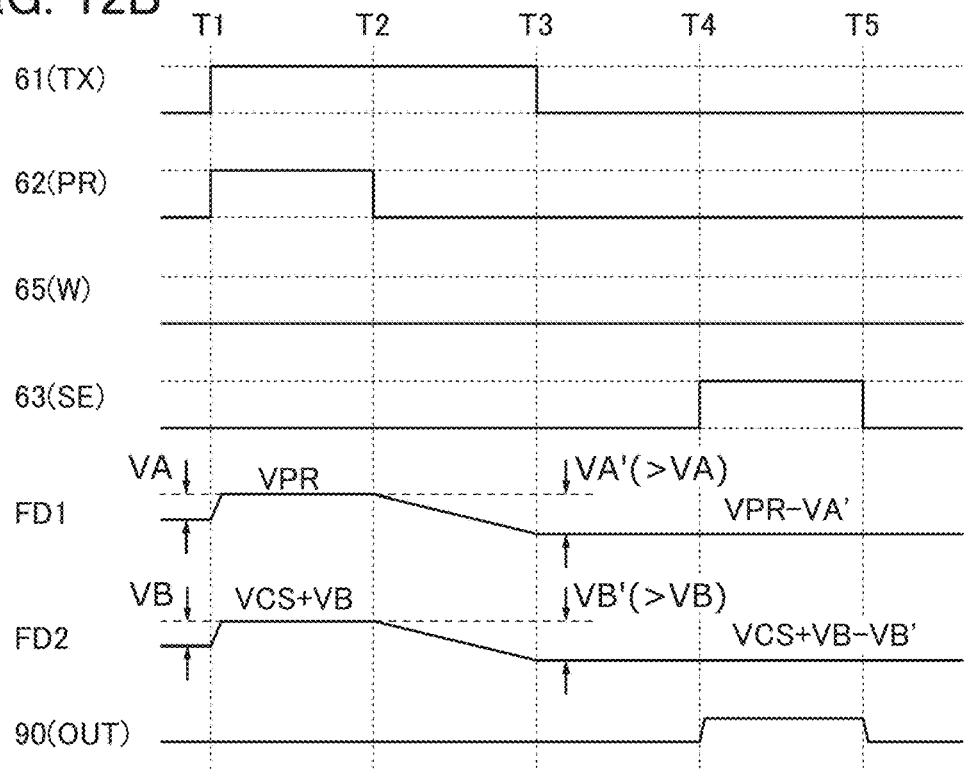

FIG. 25A
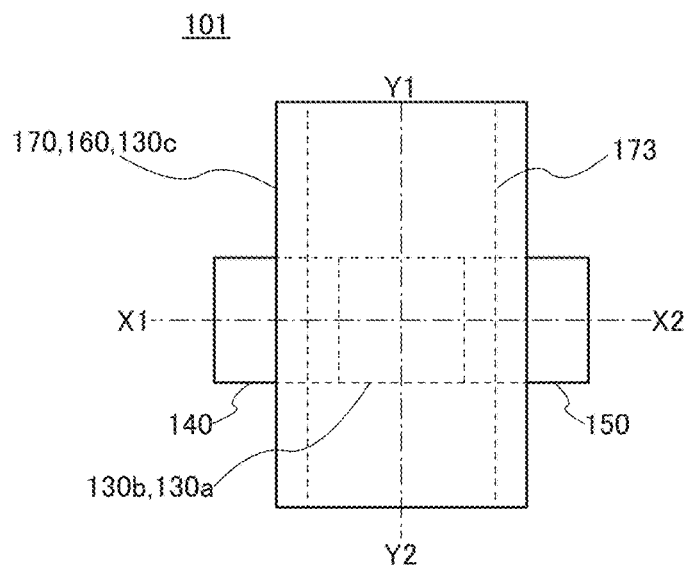
FIG. 25B
FIG. 25C
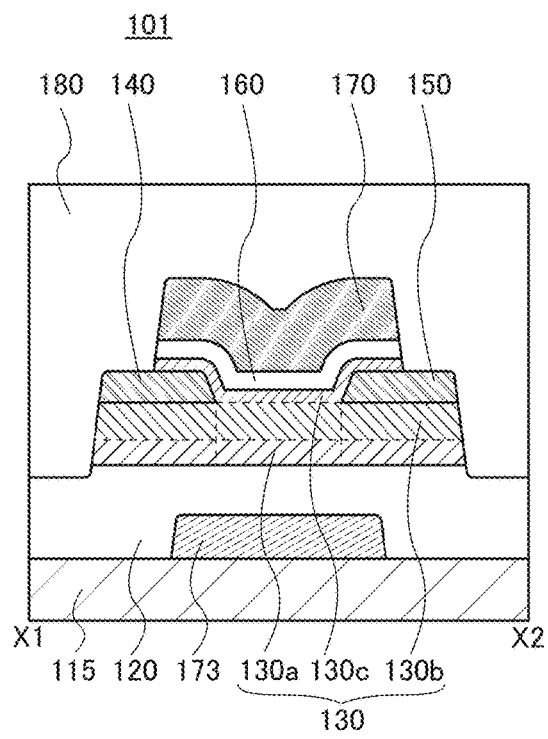
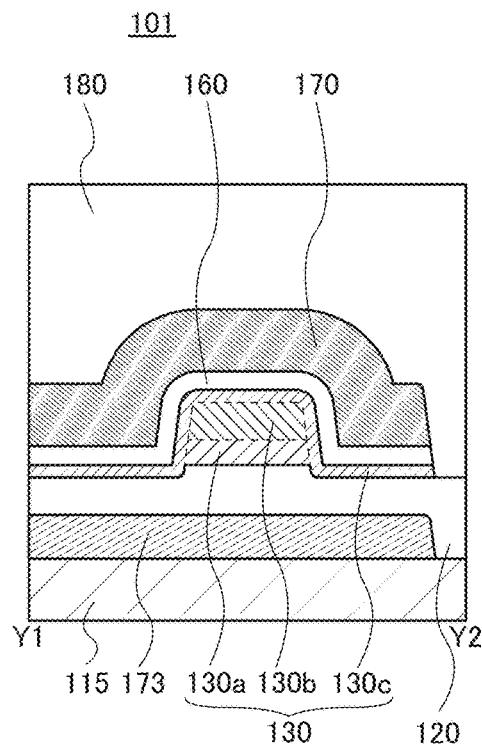

FIG. 30A
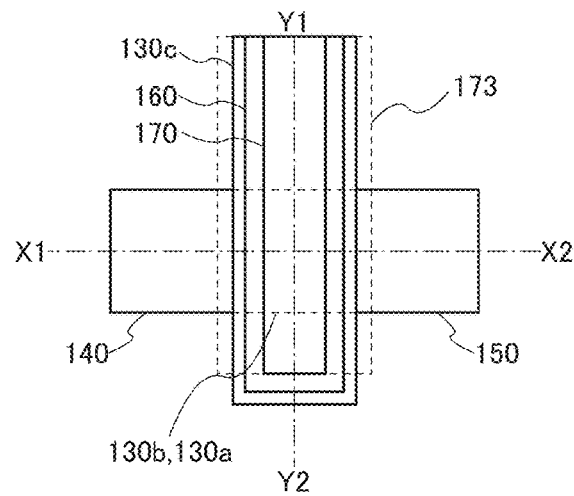
FIG. 30B
FIG. 30C
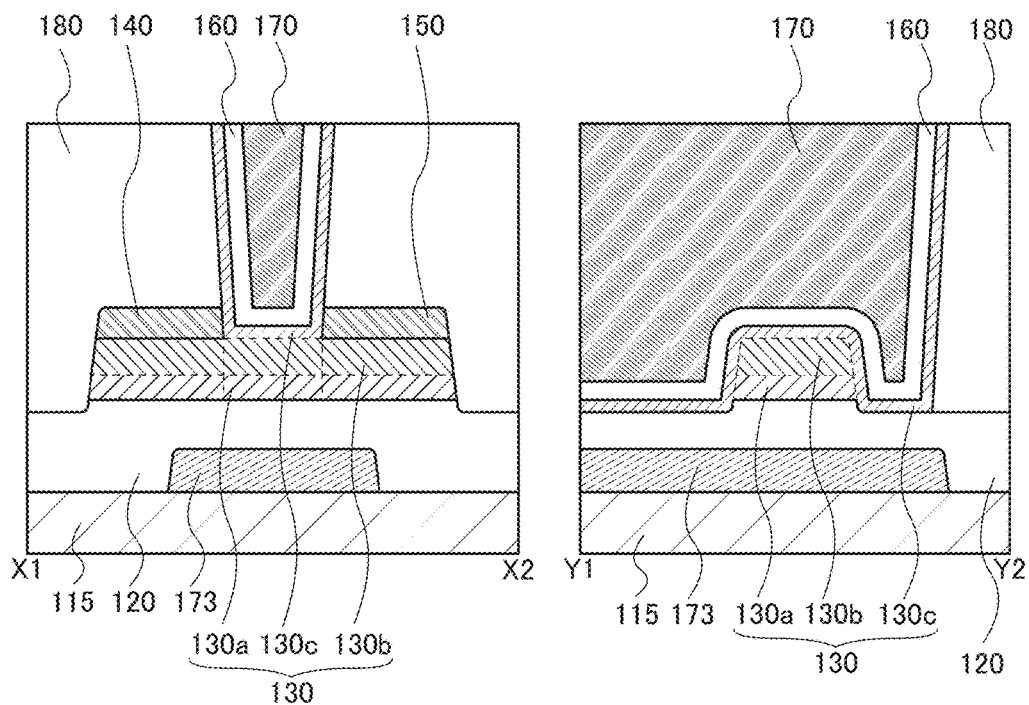

IMAGING DEVICE AND ELECTRONIC DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Accordingly, more specifically, the following can be given as an example of the technical field of one embodiment of the present invention disclosed in this specification: a semiconductor device, a display device, a liquid crystal display device, a light-emitting device, a lighting device, a power storage device, a memory device, an imaging device, a method for operating any of them, or a method for manufacturing any of them.

Note that in this specification and the like, a semiconductor device generally means a device that can function by utilizing semiconductor characteristics. A transistor and a semiconductor circuit are embodiments of semiconductor devices. Furthermore, in some cases, a memory device, a display device, an imaging device, or an electronic device includes a semiconductor device.

BACKGROUND ART

As a semiconductor material applicable to a transistor, an oxide semiconductor has been attracting attention. An imaging device with a structure where a transistor including an oxide semiconductor is used in part of a pixel circuit is disclosed in Patent Document 1, for example.

Furthermore, an imaging device including a pixel circuit that can output a difference in potential between two different frames is disclosed in Patent Document 2.

PRIOR ART DOCUMENTS

Patent Documents

[Patent Document 1] Japanese Published Patent Application No. 2011-119711
[Patent Document 2] Japanese Published Patent Application No. 2013-211840

SUMMARY OF THE INVENTION

Problems to be Solved by the Invention

In a CMOS (complementary metal oxide semiconductor) image sensor, a configuration in which an A/D converter is provided in every column of a pixel array is generally used. With this configuration, parallel processing of analog-digital conversion can be performed, which can reduce the processing time. Digital data converted by the A/D converter can be sequentially read out by a column selection circuit.

Surveillance cameras and the like are sometimes intended to take an image of an object that rarely changes. When images of such an object are continuously taken, the number of pixels with no change in output data in consecutive several frames is large. That is, difference data in one pixel in the several frames is "0" in many cases.

In the case where the difference data is "0", an operation of rewriting image data of the output destination or an operation of recording the image data can be omitted. At this time, the operations of the A/D converter and the column selection circuit are desirably stopped for power savings.

An object of one embodiment of the present invention is to provide an imaging device with low power consumption. Another object is to provide an imaging device including a circuit that determines whether or not there is a difference between two different frames. Another object is to provide an imaging device suitable for high-speed operation. Another object is to provide an imaging device with high resolution. Another object is to provide an imaging device capable of taking an image under low illuminance. Another object is to provide an imaging device that can be used in a wide temperature range. Another object is to provide an imaging device with a high aperture ratio. Another object is to provide an imaging device with high reliability. Another object is to provide a novel imaging device or the like. Another object is to provide a method for operating any of the above imaging devices. Another object is to provide a novel semiconductor device or the like.

Note that the description of these objects does not preclude the existence of other objects. In one embodiment of the present invention, there is no need to achieve all the objects. Other objects will be apparent from the description of the specification, the drawings, the claims, and the like, and it is possible to extract other objects from the description of the specification, the drawings, the claims, and the like.

Means for Solving the Problems

One embodiment of the present invention relates to an imaging device including a circuit that determines whether or not there is a significant difference between two different frames.

One embodiment of the present invention is an imaging device including a first pixel circuit, a second pixel circuit, a first circuit, a second circuit, a third circuit, a fourth circuit, a fifth circuit, and a first wiring, and the imaging device has the following characteristics: the first pixel circuit is electrically connected to the first circuit, the first pixel circuit is electrically connected to the fourth circuit, the second pixel circuit is electrically connected to the second circuit, the second pixel circuit is electrically connected to the fifth circuit, the first circuit is electrically connected to the first wiring, the second circuit is electrically connected to the first wiring, the first wiring is electrically connected to the third circuit, the third circuit is electrically connected to the fourth circuit, the third circuit is electrically connected to the fifth circuit, the first and the second pixel circuit have a function of outputting an analog signal, the first and the second pixel circuit have a function of outputting a difference in potential between two different frames, the first and the second circuit have a function of outputting a third potential to the first wiring in the case where the difference in potential is greater than or equal to a first potential, the first and the second circuit have a function of outputting the third potential to the first wiring in the case where the difference in potential is less than or equal to a second potential, the first and the second circuit have a function of outputting a fourth potential to the first wiring in the case where the difference in potential is greater than the second potential and less than the first, the third circuit has a function of supplying power to the fourth and the fifth circuit, the fourth and the fifth circuit have a function of converting the analog signal to a digital signal, and the third circuit has a function of supplying power to the fourth and the fifth circuit when the first wiring is at the third potential and not supplying power to the fourth and the fifth circuit when the first wiring is at the fourth potential.

A sixth circuit and a seventh circuit may further be included, the sixth circuit may be electrically connected to the first and the second pixel circuit, the seventh circuit may be electrically connected to the fourth and the fifth circuit, the sixth circuit may be electrically connected to the third circuit, the seventh circuit may be electrically connected to the third circuit, the sixth circuit may have a function of selecting the first and the second pixel circuit, the seventh circuit (may have a function of selecting the fourth or the fifth circuit, and the third circuit may have a function of supplying power to the seventh circuit when the first wiring is at the third potential and not supplying power to the seventh circuit when the first wiring is at the fourth potential.

An eighth circuit and a second wiring may further be included, the eighth circuit may be electrically connected to the second wiring, the eighth circuit may be electrically connected to the sixth circuit, the eighth circuit may be electrically connected to the first and the second pixel circuit, the eighth circuit may have a function of bringing the sixth circuit and the first and the second pixel circuit into conduction, the eighth circuit may have a function of bringing the sixth circuit and the first and the second pixel circuit into conduction when the second wiring is at a fifth potential and bringing the sixth circuit and the first and the second pixel circuit out of conduction when the second wiring is at a sixth potential, and the eighth circuit may have a function of selecting the first and the second pixel circuit when the second wiring is at the sixth potential.

The following configuration can be employed: the first and the second pixel circuit include a photoelectric conversion element, a first transistor, a second transistor, a third transistor, a fourth transistor, and a capacitor, one of electrodes of the photoelectric conversion element is electrically connected to one of a source or a drain of the first transistor, the other of the source or the drain of the first transistor is electrically connected to the other of a source or a drain of the second transistor, the other of the source or the drain of the first transistor is electrically connected to one of electrodes of the capacitor, the other of the electrodes of the capacitor is electrically connected to the other of a source or a drain of the third transistor, the other of the electrodes of the capacitor is electrically connected to a gate of the fourth transistor, and one of a source or a drain of the fourth transistor is electrically connected to one of a source or a drain of the fifth transistor.

It is preferable that the first to third transistors contain an oxide semiconductor in a channel formation region, and that the oxide semiconductor contain In, Zn, and. M (M is Al, Ga, Y, or Sn).

Effects of the Invention

With the use of one embodiment of the present invention, an imaging device with low power consumption can be provided. An imaging device including a circuit that determines whether or not there is a difference between two different frames can also be provided. An imaging device suitable for high-speed operation can also be provided. An imaging device with high resolution can also be provided. An imaging device capable of taking an image under low illuminance can also be provided. An imaging device that can be used in a wide temperature range can also be provided. An imaging device with a high aperture ratio can also be provided. An imaging device with high reliability can also be provided. A novel imaging device or the like can also be provided. A method for operating any of the above imaging devices can also be provided. A novel semiconductor device or the like can also be provided.

Note that one embodiment of the present invention is not limited to these effects. One embodiment of the present invention might produce effects other than these effects, depending on the case, or according to the circumstances, for example. Furthermore, one embodiment of the present invention does not necessarily produce any of these effects, depending on the case, or according to the circumstances, for example.

BRIEF DESCRIPTION OF THE DRAWINGS

FIG. 9 A timing chart for illustrating an operation of a circuit that determines difference data.
FIG. 12 Timing charts for illustrating operations of pixels.
FIG. 25 A top view and cross-sectional views illustrating a transistor.

FIG. 30 A top view and cross-sectional views illustrating a transistor.

EMBODIMENTS FOR CARRYING OUT THE INVENTION

Figure 1:
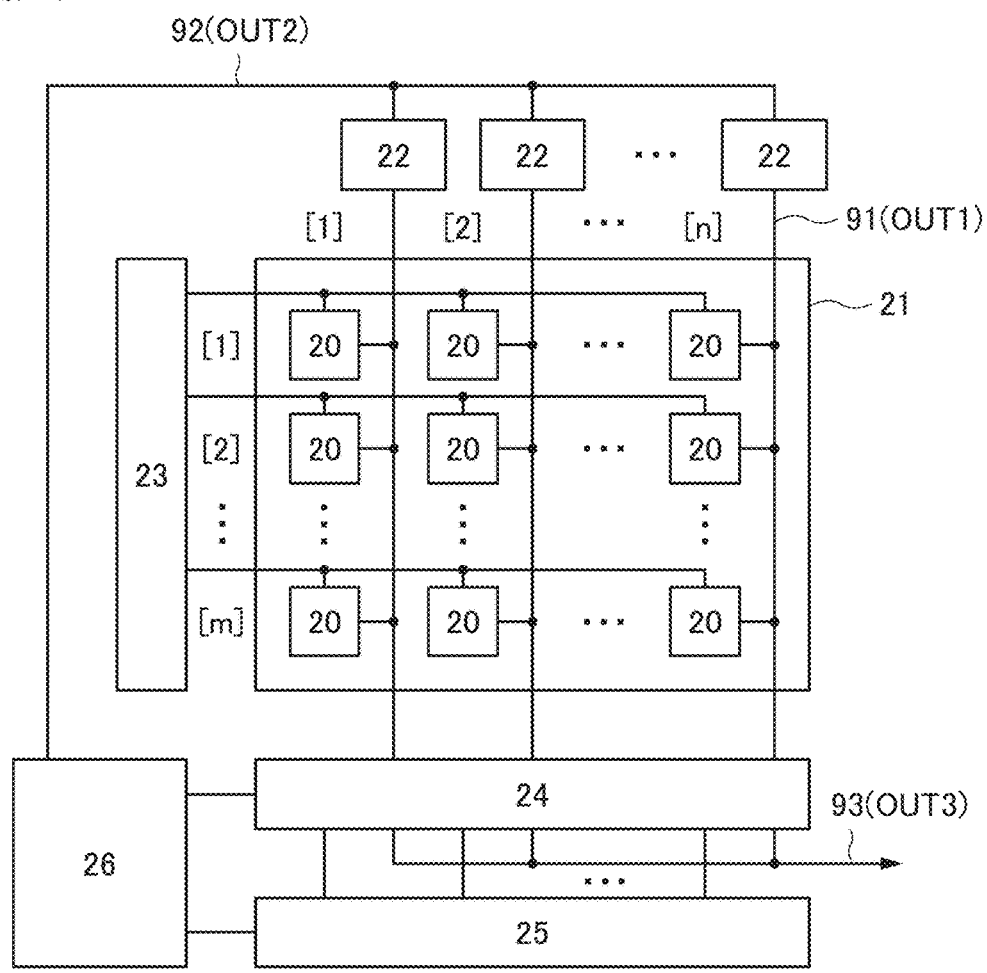
FIG. 1 A block diagram illustrating an imaging device.

Embodiments will be described in detail with reference to the drawings. However, the present invention is not limited to the following description, and it will be readily appreciated by those skilled in the art that the modes and details can be modified in various ways without departing from the spirit and the scope of the present invention. Therefore, the present invention should not be interpreted as being limited to the description of embodiments below. Note that in structures of the invention described below, the same reference numerals are used, in different drawings, for the same portions or portions having similar functions, and description thereof is not repeated in some cases. Note that the hatching of the same element that constitutes a drawing is omitted or changed in different drawings in some cases.

Note that the ordinal numbers such as first and second are used for convenience and do not denote the order of steps or the stacking order of layers. Therefore, for example, description can be made even when "first" is replaced with "second", "third", or the like, as appropriate. In addition, the ordinal numbers put in this specification and the like do not correspond to the ordinal numbers that are used to specify one embodiment of the present invention in some cases.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is included in the drawings or the texts.

Here, X and Y are each an object (a device, an element, a circuit, a wiring, an electrode, a terminal, a conductive film, or a layer, for example).

An example of the case where X and Y are directly connected is the case where an element that allows electrical connection between X and Y (a switch, a transistor, a capacitor, an inductor, a resistor, a diode, a display element, a light-emitting element, or a load, for example) is not connected between X and Y, and is the case where X and Y are connected without the element that allows the electrical connection between X and Y (a switch, a transistor, a capacitor, an inductor, a resistor, a diode, a display element, a light-emitting element, or a load, for example) provided therebetween.

In an example of the case where X and Y are electrically connected, one or more elements that enables electrical connection between X and Y (a switch, a transistor, a capacitor, an inductor, a resistor, a diode, a display element, a light-emitting element, or a load, for example) can be connected between X and Y. Note that a switch has a function of being controlled to be turned on or off. That is, a switch has a function of being in a conduction state (on state) or a non-conduction state (off state) to control whether or not current flows. Alternatively, a switch has a function of selecting and changing a path through which current flows. Note that the case where X and Y are electrically connected includes the case where X and Y are directly connected.

In an example of the case where X and Y are functionally connected, one or more circuits that enable a functional connection between X and Y (a logic circuit (an inverter, a NAND circuit, a NOR circuit, or the like), a signal converter circuit (a D/A converter circuit, an A/D converter circuit, a gamma correction circuit, or the like), a potential level converter circuit (a power circuit (a step-up circuit, a step-down circuit, or the like), a level shifter circuit for changing the potential level of a signal, or the like), a voltage source, a current source, a switching circuit, an amplifier circuit (a circuit that can increase signal amplitude, the amount of current, or the like, an operational amplifier, a differential amplifier circuit, a source follower circuit, a buffer circuit, or the like), a signal generation circuit, a memory circuit, or a control circuit, for example) can be connected between X and Y. Note that, even if another circuit is provided between X and Y, for example, X and Y are regarded as being functionally connected in the case where a signal output from X is transmitted to Y. Note that the case where X and Y are functionally connected includes the case where X and Y are directly connected and the case where X and Y are electrically connected.

Note that in the case where there is an explicit description X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description being electrically connected, the same contents as the case where there is only an explicit description being connected are disclosed in this specification and the like.

Note that, in the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, for example, any of the following expressions can be used.

The expression "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected in this order" can be used, for example. The expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order" can also be used. The expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order" can also be used. When the connection order in a circuit configuration is defined by an expression similar to these examples, a source (or a first terminal or the like) and a drain (or a second terminal or the like) of a transistor can be distinguished from each other to specify the technical scope.

As another way of expression, the expression "a source (or a first terminal or the like) of a transistor is electrically connected to X through at least a first connection path, the first connection path does not include a second connection path, the second connection path is a path, through the transistor, between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" can be used, for example. The expression "a source (or a first terminal or the like) of a transistor is electrically connected to X by at least a first connection path through Z1, the first connection path does not include a second connection path, the second connection path includes a connection path through the transistor, a drain (or a second terminal or the like) of the transistor is electrically connected to Y by at least a third connection path through Z2, and the third connection path does not include the second connection path" can also be used. The expression "a source (or a first terminal or the like) of a transistor is electrically connected to X by at least a first connection path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor" can also be used. When the connection path in a circuit configuration is defined by an expression similar to these examples, a source (or a first terminal or the like) and a drain (or a second terminal or the like) of a transistor can be distinguished from each other to specify the technical scope.

Note that these expressions are just examples and expressions are not limited to these expressions. Here, X, Y, Z1, and Z2 are each an object (a device, an element, a circuit, a wiring, an electrode, a terminal, a conductive film, or a layer, for example).

Note that even if a circuit diagram shows that independent components are electrically connected to each other, one component might have functions of a plurality of components. For example, when part of a wiring also functions as an electrode, one conductive film has functions of both of the components, the function of a wiring and the function of an electrode. Thus, electrical connection in this specification also includes such a case where one conductive film has functions of a plurality of components, in its category.

Note that the terms "film" and "layer" can be interchanged, depending on the case, or according to the circumstances. For example, the term "conductive layer" can be changed into the term "conductive film" in some cases. Also, the term "insulating film" can be changed into the term "insulating layer" in some cases, for example.

Note that in general, a potential (voltage) is relative, and its quantity depends on the relative quantity from a reference potential. Therefore, even in the case where there is an expression such as "ground", "GND", or "ground", the potential is not necessarily 0 V. For example, "ground" or "GND" is defined using the lowest potential in a circuit as a reference in some cases. Furthermore, "ground" or "GND" is defined using an intermediate potential in a circuit as a reference in some other cases. In those cases, a positive potential and a negative potential are defined using the potential as a reference.

(Embodiment 1)

In this embodiment, an imaging device that is one embodiment of the present invention will be described with reference to drawings.

One embodiment of the present invention is a configuration and an operation method of an imaging device including a circuit that determines whether or not there is a significant difference between two different frames.

The imaging device includes a pixel capable of outputting difference data, a circuit that determines the difference data, a circuit that controls power supply, an A/D converter, and the like.

With this configuration, whether or not there is a significant difference can be determined at high speed. In the case where it is determined that there is no difference, power supply to the A/D converter and the like is shut off, so that power consumption can be reduced.

For a pixel circuit, a transistor whose active layer is an oxide semiconductor (hereinafter referred to as an OS transistor) is preferably used. An OS transistor has low off-state current, and a memory for retaining data can be easily formed in the pixel circuit.

FIG. 1 is a block diagram of an imaging device of one embodiment of the present invention. The imaging device includes a pixel array 21, a circuit 22, a circuit 23, a circuit 24, a circuit 25, and a circuit 26.

The pixel array 21 includes pixels 20. The pixels 20 can be arranged in a matrix of m rows and n columns (m and n are each a natural number greater than or equal to one), for example. The pixel 20 can output image data or difference data between two different frames to a wiring 91(OUT1) that is electrically connected thereto.

The circuit 22 is provided for every column, and is electrically connected to the wiring 91(OUT1). The circuit 22 can have a function of determining significance of difference data output from the pixel 20. Note that difference data being significant means that the difference data is greater than or equal to a value with which it can be determined that there is a difference. The value can be arbitrarily set by a practitioner.

In the case where the difference data is determined to have no difference, for example, the circuit 22 outputs a low level potential (hereinafter, "L") to a wiring 92(OUT2). Furthermore, in the case where the difference data is determined to have difference, the circuit 22 outputs a high level potential (hereinafter, "H") to the wiring 92(OUT2). Note that the logic of signals that are output as determination results of whether or not there is a difference may be reverse.

The circuit 23 can have a function of a row driver selecting pixels 20 row by row. From the pixels 20 turned into a selected state by the circuit 23, image data or difference data is output to the wiring 91(OUT1). For the circuit 23, a shift register or the like can be used, for example.

The circuit 24 is electrically connected to the wiring 91(OUT1). The circuit 24 can have a function of converting image data of an analog signal output from the pixel 20 to a digital signal. For the circuit 24, an A/D converter or the like can be used, for example. The circuit 24 can be provided for every column.

The circuit 25 can have a function of a column driver sequentially selecting the circuit 24 provided for every column. From the circuit 24 selected by the circuit 25, a digital signal corresponding to image data is output to a wiring 93(OUT3). For the circuit 25, a shift register or the like can be used, for example.

The circuit 26 is electrically connected to peripheral circuits such as the circuit 24 and the circuit 25, and the wiring 92(OUT2). The circuit 26 can have a function of controlling power supply to the circuit 24 and the circuit 25, in accordance with a signal potential input from the wiring 92(OUT2).

When the signal potential is "L", that is, when the circuit 22 determines that there is no difference, an operation of rewriting or recording image data output from the imaging device to a display device, a recording device, or the like can be omitted, for example. Accordingly, when it is determined that there is no difference, control of shutting off the power supply to the circuit 24 and the circuit 25 is preferably made by the circuit 26 to reduce power consumption.

Furthermore, when the signal potential is "H", that is, when it is determined by the circuit 22 that there is a difference, the imaging device obtains new image data and carries out an operation of rewriting or recording image data of the output destination, for example. Accordingly, when it is determined that there is a difference, control of continuing or restarting the power supply to the circuit 24 and the circuit 25 is made by the circuit 26, and image data is read out from the pixel 20.

Note that it is acceptable if the circuit 26 has a function of being capable of controlling the power supply to the circuit 24, the circuit 25, and the like in accordance with the potential of the wiring 92(OUT2). Thus, other circuits may have the function of the circuit 26. It is also possible that the circuit 26 is not provided and the operation related to the function can be performed with the use of software.

Figure 2A:
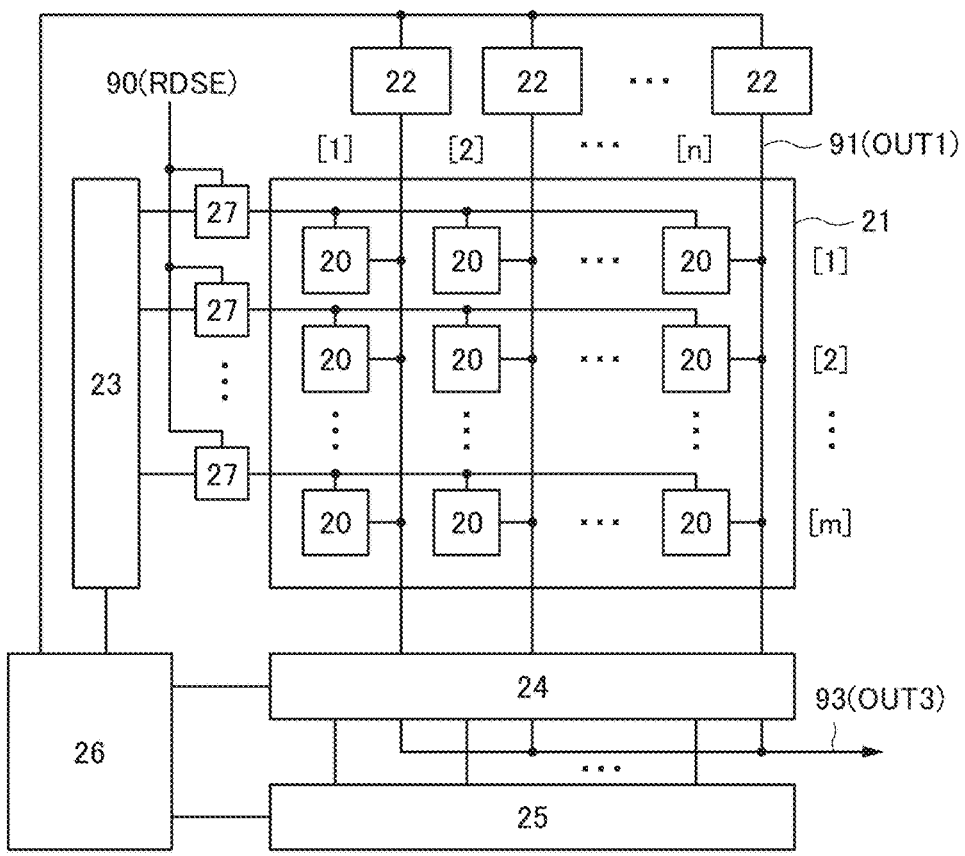
FIG. 2 A block diagram and a circuit diagram illustrating an imaging device.

The imaging device of one embodiment of the present invention may also have a configuration illustrated in FIG. 2(A). The imaging device is different from the imaging device illustrated in FIG. 1 in that a circuit 27 is included.

The circuit 27 is provided for every row and is electrically connected to a wiring 90(RDSE). Furthermore, the circuit 27 is electrically connected to a row wiring connecting the circuit 23 and the pixel 20. The circuit 27 can have a function of controlling conduction between the circuit 23 and the pixel 20. In addition, the circuits 27 can turn all the pixels 20 included in the pixel array 21 into a selected state.

Figure 2B:
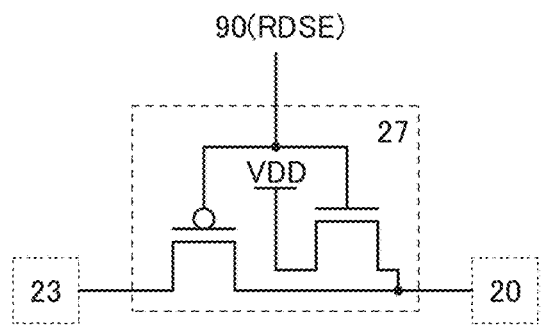

FIG. 2(B) is an example of a specific configuration of the circuit 27, which includes a p-ch type transistor and an n-ch type transistor. One of a source or a drain of the p-ch type transistor is electrically connected to the circuit 23, and the other of the source or the drain is electrically connected to the pixel 20. One of a source or a drain of the n-ch type transistor is electrically connected to a high potential power line (VDD), and the other of the source or the drain is electrically connected to the pixel 20. A gate of each of the p-ch type transistor and the n-ch type transistor is electrically connected to the wiring 90(RDSE).

The circuit 27 can select whether or not the circuit 23 is used, in accordance with a signal potential input from the wiring 90(RDSE).

When the potential of the wiring 90(RDSE) is "L", the p-ch type transistor is turned on, and the n-ch type transistor is turned off, whereby the circuit 23 and the pixel 20 are brought into a conduction state. That is, an operation mode in which the circuit 23 is used is selected, and an operation similar to that of the imaging device illustrated in FIG. 1 can be performed.

When the potential of the wiring 90(RDSE) is "H", the p-ch type transistor is turned off, whereby the circuit 23 and the pixel 20 are brought out of the conduction state. That is, an operation mode in which the circuit 23 is not used can be selected. Furthermore, the n-ch type transistor is turned on, and "H" is supplied to all the pixels 20 from the high potential power line (VDD). In other words, all the pixels 20 are in a selected state. Note that, as another configuration of the circuit 27, an OR circuit whose input signals are an output signal from the circuit 23 and a signal from the wiring 90 and whose output signal is a signal to the pixel 20 can be employed.

Since the pixels 20 in one column are electrically connected to one wiring 91(OUT1), when a significant difference potential can be output from any of the pixels 20 in the column direction while difference data is obtained, the circuit 22 can determine that there is a difference. Furthermore, since the circuits 22 each of which is provided for a column share the wiring 92(OUT2) as an output line, the potential of the wiring 92(OUT2) becomes "H" when determination that there is a difference is made by any of the circuits 22. That is, determination whether or not there is a difference can be made with respect to all the pixels 20 substantially at the same time.

Furthermore, at the time of the operation mode in which the circuit 23 is not used, the circuit 26 may control the power supply to the circuit 23 as well as the circuit 24 and the circuit 25, with a signal potential input from the wiring 92(OUT2).

When the signal potential is "L", i.e., when the circuit 22 determines that there is no difference, the circuit 26 controls the power supply to the circuit 23, the circuit 24, and the circuit 25 to be shut off. When the signal potential is "H", i.e., when the circuit 22 determines that there is a difference, the circuit 26 controls the power supply to the circuit 23, the circuit 24, and the circuit 25 to be continued or restarted.

Note that, with a configuration where the circuit 27 operates appropriately in accordance with the logic signal output from the circuit 22, the wiring 90(RDSE) and the wiring 91(OUT1) can be electrically connected.

Figure 3:
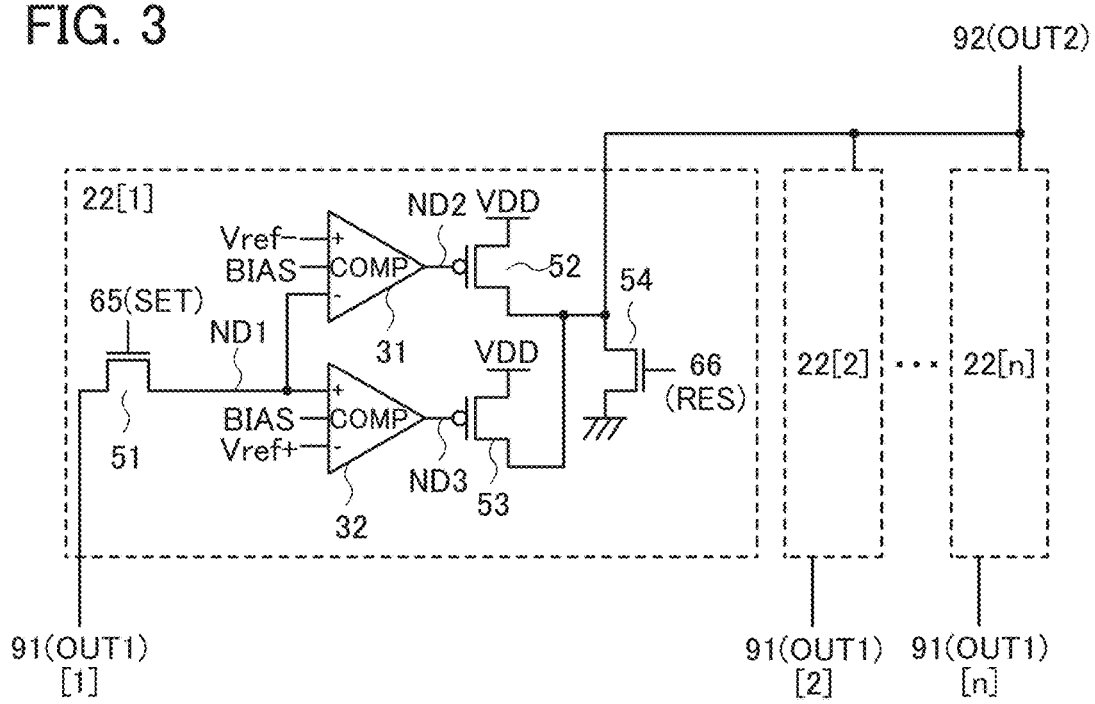
FIG. 3 A drawing illustrating a circuit that determines difference data.

FIG. 3 is an example of a configuration of the circuit 22. A circuit 22[1] and a wiring 91(OUT1)[1] mean the circuit 22 and the wiring 91(OUT1)) provided in the first column, respectively. Note that although a configuration where the circuit 22 is provided for each of the wirings 91(OUT1) is illustrated in FIG. 3, the circuit 22 may be provided for every few columns, every few dozen columns, or every few hundred columns, for example. That is, there may be a column in which detection of difference data is not carried out.

The circuit 22 can have a configuration including a transistor 51, a transistor 52, a transistor 53, a transistor 54, a comparator circuit 31, and a comparator circuit 32. Note that although the polarities of the transistors 51 and 54 are the n-ch type, and the polarities of the transistors 52 and 53 are the p-ch type in FIG. 3, the polarities of the transistors can be switched by changing the operation conditions.

One of a source or a drain of the transistor 51 is electrically connected to the wiring 91(OUT1). The other of the source or the drain of the transistor 51 is electrically connected to one of input terminals of the comparator circuit 31. The other of the source or the drain of the transistor 51 is electrically connected to the other of input terminals of the comparator circuit 32. An output terminal of the comparator circuit 31 is electrically connected to a gate of the transistor 52. An output terminal of the comparator circuit 32 is electrically connected to a gate of the transistor 53. One of a source or a drain of the transistor 52 is electrically connected to one of a source or a drain of the transistor 54. One of a source or a drain of the transistor 53 is electrically connected to the one of the source or the drain of the transistor 54. The one of the source or the drain of the transistor 54 is electrically connected to the wiring 92(OUT2).

To the other of the input terminals of the comparator circuit 31, one of the upper limit or the lower limit of a voltage for determining the significance of difference data (Vref−, for example) is supplied. To one of the input terminals of the comparator circuit 32, the other of the upper limit or the lower limit of the voltage for determining the significance of difference data (Vref+, for example) is supplied. To the other of the source or the drain of the transistor 52 and the other of the source or the drain of the transistor 53, a high potential (VDD, for example) is supplied. To the other of the source or the drain of the transistor 54, a low potential (GND, for example) is supplied.

A gate of the transistor 51 is electrically connected to a wiring 65(SET). A gate of the transistor 54 is electrically connected to a wiring 66(RES). The wiring 65(SET) and the wiring 66(RES) can each have a function of a signal line for controlling the conduction of the transistor connected thereto.

To power input terminals of the comparator circuits 31 and 32, a constant high potential power (BIAS) capable of controlling a circuit operation is supplied. Furthermore, a wiring to which the other of the source or the drain of the transistor 51, the one of the input terminals of the comparator circuit 31, and the other of the input terminals of the comparator circuit 32 are connected is a node ND1. A wiring to which the output terminal of the comparator circuit 31 and the gate of the transistor 52 are connected is a node ND2. A wiring to which the output terminal of the comparator circuit 32 and the gate of the transistor 53 are connected is a node ND3.

In the above configuration, difference data output from the pixel 20 can be input to the comparator circuits 31 and 32. For the comparator circuits 31 and 32, the upper limit or the lower limit of the voltage for determining the significance of the difference data is set; the circuit 22 can output a signal varying in logic depending on whether or not there is a difference.

Figure 4:
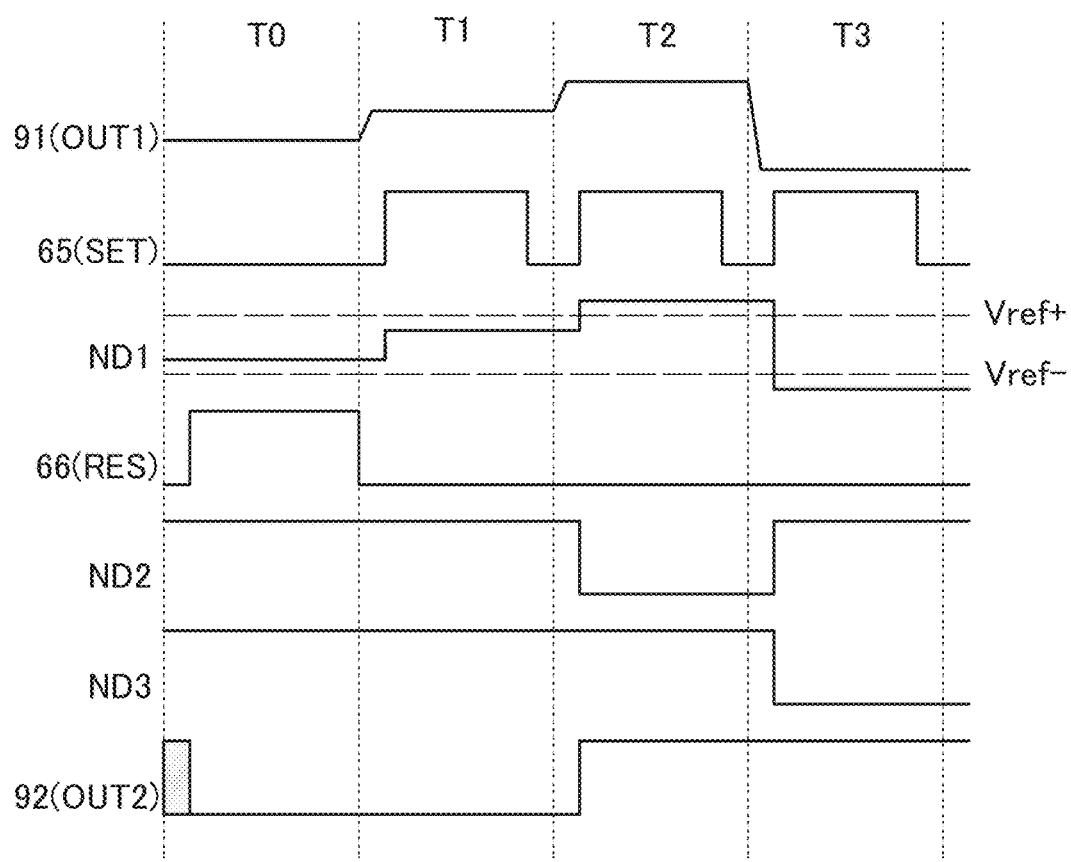
FIG. 4 A timing chart for illustrating an operation of a circuit that determines difference data.

Next, the operation of the circuit 22 will be described with reference to the timing chart shown in FIG. 4.

Term T0 is a term of a reset operation in which the potential of the wiring 92(OUT2) is set to "L". In Term T0, when the potential of the wiring 66(RES) is set to "H", the potential of the wiring 92(OUT2) is reset to "L".

Term T1 Shows, as an example, an operation in the case where difference data output from the pixel 20 is between the upper and lower limits set for the comparator circuits 31 and 32, i.e., the case where it is determined that there is no difference.

In Term T1, when the potential of the wiring 65(SET) is set to "H", difference data is input to the node ND1 from the pixel 20 connected to the wiring 91(OUT1). At this time, the potential of the node ND1 is at a level between Vref− and Vref+, so that the comparator circuit 31 outputs "H" to the node ND2, and the comparator circuit 32 outputs "H" to the node ND3. Accordingly, the transistor 52 and the transistor 53 are turned off, so that the potential of the wiring 92(OUT2) is "L". Here, the potential of the wiring 92(OUT2) being "L" means there is no difference.

Term T2 shows, as an example, an operation in the case where difference data output from the pixel 20 exceeds the upper limit set for the comparator circuit 31, i.e., the case where it is determined that there is a difference.

In Term T2, when the potential of the wiring 65(SET) is set to "H", difference data is input to the node ND1 from the pixel 20 connected to the wiring 91(OUT1). At this time, the potential of the node ND1 is at a level higher than Vref+, so that the comparator circuit 31 outputs "L" to the node ND2, and the comparator circuit 32 outputs "H" to the node ND3. Accordingly, the transistor 52 is turned on, and the transistor 53 is turned off, so that the potential of the wiring 92(OUT2) becomes "H". Here, the potential of the wiring 92(OUT2) being "H" means that there is a difference.

Term T3 shows, as an example, an operation in the case where difference data output from the pixel 20 is below the lower limit set for the comparator circuit 32, i.e., the case where it is determined that there is a difference.

In Term T3, when the potential of the wiring 65(SET) is set to "H", difference data is input to the node ND1 from the pixel 20 connected to the wiring 91(OUT1). At this time, the potential of the node ND1 is at a level lower than Vref−, so that the comparator circuit 31 outputs "H" to the node ND2 and the comparator circuit 32 outputs "L" to the node ND3. Accordingly, the transistor 52 is turned off, and the transistor 53 is turned on, so that the potential of the wiring 92(OUT2) becomes "H". Here, the potential of the wiring 92(OUT2) being "H" means that there is a difference.

In the case where the circuit in FIG. 3 is used in the configuration illustrated in FIG. 1, the difference determination operation shown in Term T1 and the like as an example is performed in accordance with the row selection operation of the circuit 23. That is, determination operations for the maximum number of rows are performed in one frame period. Note that by controlling the potential of the wiring 65(SET), a difference determination operation can be performed for every few rows, every few dozen rows, or every few hundred rows, for example. Furthermore, a difference determination operation can be performed preponderantly in part of the region of the pixel array 21, e.g., only in rows close to the center.

In the case where the circuit in FIG. 3 is used in the configuration illustrated in FIG. 2, it is possible to turn all the pixels 20 into a selected state by the circuits 27 and input difference data to the circuits 22 from all the pixels 20 substantially at the same time; thus, the determination operation may be performed any number of times in one frame period.

Figure 5:
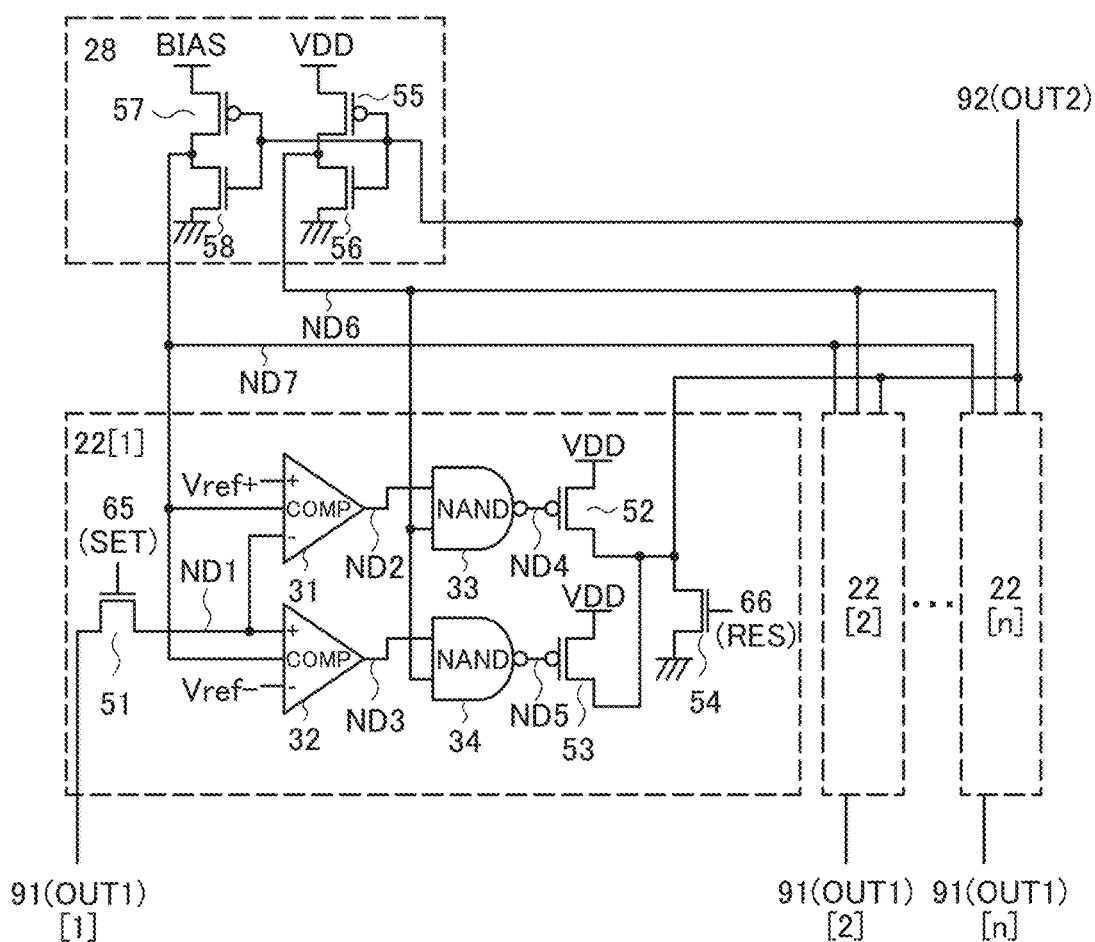
FIG. 5 A drawing illustrating a circuit that determines difference data.

FIG. 5 is an example of a configuration of the circuit 22, which is different from FIG. 3. Although the configuration where the circuit 22 is provided for each of the wirings 91(OUT1) is illustrated in FIG. 3, the circuit 22 may be provided for every few columns, every few dozen columns, or every few hundred columns, for example. Furthermore, the circuit 22 is electrically connected to a circuit 28.

The circuit 22 illustrated in FIG. 5 can have a configuration including a transistor 51, a transistor 52, a transistor 53, a transistor 54, a comparator circuit 31, a comparator circuit 32, a NAND circuit 33, and a NAND circuit 34. Note that although the polarities of the transistors 51 and 54 are the n-ch type, and the polarities of the transistors 52 and 53 are the p-ch type in FIG. 5, the polarities of the transistors can be switched by changing the operation conditions.

One of a source or a drain of the transistor 51 is electrically connected to the wiring 91(OUT1). The other of the source or the drain of the transistor 51 is electrically connected to one of input terminals of the comparator circuit 31. The other of the source or the drain of the transistor 51 is electrically connected to the other of input terminals of the comparator circuit 32. An output terminal of the comparator circuit 31 is electrically connected to one of input terminals of the NAND circuit 33. An output terminal of the comparator circuit 32 is electrically connected to one of input terminals of the NAND circuit 34. An output terminal of the NAND circuit 33 is electrically connected to a gate of the transistor 52. An output terminal of the NAND circuit 34 is electrically connected to a gate of the transistor 53. One of a source or a drain of the transistor 52 is electrically connected to one of a source or a drain of the transistor 54. One of a source or a drain of the transistor 53 is electrically connected to the one of the source or the drain of the transistor 54. The one of the source or the drain of the transistor 54 is electrically connected to the wiring 92(OUT2).

To the other of the input terminals of the comparator circuit 31, one of the upper limit or the lower limit of a voltage for determining the significance of difference data (Vref+, for example) is supplied. To one of the input terminals of the comparator circuit 32, the other of the upper limit or the lower limit of the voltage for determining the significance of difference data (Vref−, for example) is supplied. To the other of the source or the drain of the transistor 52 and the other of the source or the drain of the transistor 53, a high potential (VDD, for example) is supplied. To the other of the source or the drain of the transistor 54, a low potential (GND, for example) is supplied.

To the comparator circuits 31 and 32, a constant high potential power (BIAS) capable of controlling a circuit operation or a low potential (GND, for example) is supplied via the circuit 28. To the other of the input terminals of each of the NAND circuits 33 and 34, a high potential (VDD, for example) or a low potential (GND, for example) is supplied via the circuit 28.

Furthermore, a wiring to which the other of the source or the drain of the transistor 51, the one of the input terminals of the comparator circuit 31, and the other of the input terminals of the comparator circuit 32 are connected is a node ND1. A wiring to which the output terminal of the comparator circuit 31 and the one of the input terminals of the NAND circuit 33 are connected is a node ND2. A wiring to which the output terminal of the comparator circuit 32 and the one of the input terminals of the NAND circuit 34 are connected is a node ND3. A wiring to which the output terminal of the NAND circuit 33 and the gate of the transistor 52 are connected is a node ND4. A wiring to which the output terminal of the NAND circuit 34 and the gate of the transistor 53 are connected is a node ND5.

The circuit 28 can have a configuration including a transistor 55, a transistor 56, a transistor 57, and a transistor 58. Note that although the polarities of the transistors 55 and 57 are the p-ch type, and the polarities of the transistors 56 and 57 are the n-ch type in. FIG. 5, the polarities of the transistors can be switched by changing the operation conditions.

One of a source or a drain of the transistor 55 is electrically connected to one of a source or a drain of the transistor 56. The one of the source or the drain of the transistor 55 is electrically connected to the other of the input terminals of each of the NAND circuits 33 and 34. Here, a wiring to which the one of the source or the drain of the transistor 55, the one of the source or the drain of the transistor 56, and the other of the input terminals of each of the NAND circuits 33 and 34 are connected is a node ND6.

One of a source or a drain of the transistor 57 is electrically connected to one of a source or a drain of the transistor 58. The one of the source or the drain of the transistor 57 is electrically connected to power input terminals of the comparator circuits 31 and 32. Here, a wiring to which the one of the source or the drain of the transistor 57, the one of the source or the drain of the transistor 58, and the power input terminals of the comparator circuits 31 and 32 are connected is a node ND7.

Gates of the transistors 55 to 58 are electrically connected to the wiring 92(OUT2). To the other of the source or the drain of the transistor 55, a high potential (VDD, for example) is supplied. To the other of the source or the drain of the transistor 57, a constant high potential power (BIAS) capable of controlling circuit operations of the comparator circuits 31 and 32 is supplied. To the other of the source or the drain of each of the transistors 54 and 58, a low potential (GND, for example) is supplied.

The circuit illustrated in FIG. 5 has a configuration in which the potential output from the circuit 22 to the wiring 92(OUT2) is input to the circuit 28. The circuit 28 can stop some of the circuits included in the circuit 22 in accordance with the value of the potential. As a result, power consumption can be reduced.

In the case where the potential of the wiring 92(OUT2) is "L", that is, in the case where it is determined that there is no difference, BIAS is supplied to the comparator circuits 31 and 32 to bring them into an operating state. In addition, "H" is supplied to the other of the input terminals of each of the NAND circuits 33 and 34, and the potentials of the node ND2 and the node ND3 are inverted and output to the node ND4 and the node ND5. Here, when it is determined that there is no difference, the difference detection operation is repeated.

In the case where the potential of the wiring 92(OUT2) is "H", that is, in the case where it is determined that there is a difference, a GND potential is supplied to the comparator circuits 31 and 32 to bring them out of the operating state. In addition, "L" is supplied to the other of the input terminals of each of the NAND circuits 33 and 34, and the potentials of the node ND4 and the node ND5 are fixed at "H". Accordingly, the potential of the wiring 92(OUT2) is fixed at "H", so that an unnecessary difference detection operation is not performed in the remaining period until one frame is finished, and thus power consumption can be reduced.

Figure 6:
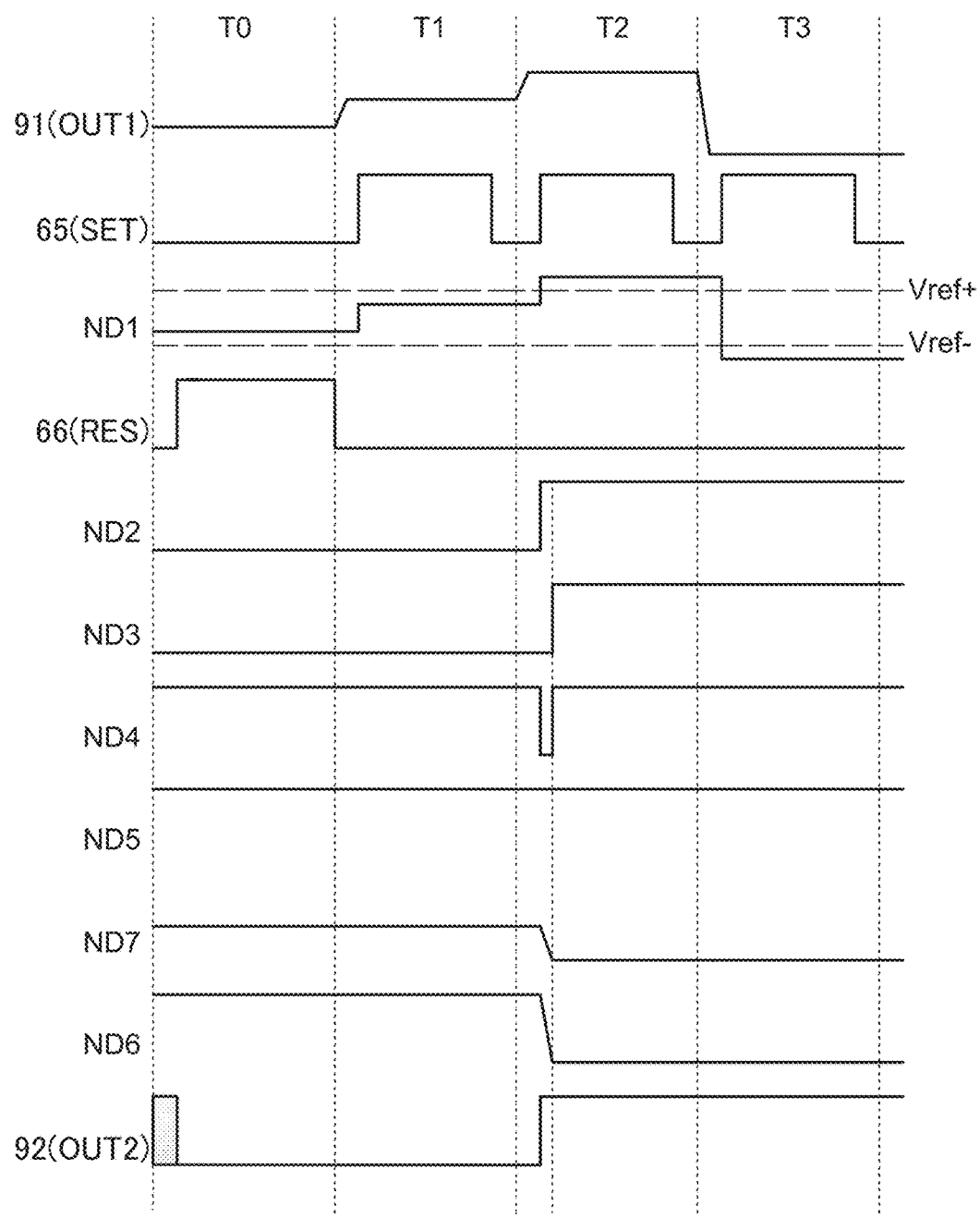
FIG. 6 A timing chart for illustrating an operation of a circuit that determines difference data.

Next, operations of the circuit 22 and the circuit 28 illustrated in FIG. 5 will be described with reference to a timing chart shown in FIG. 6.

Term T0 is a term of a reset operation in which the potential of the wiring 92(OUT2) is set to "L". In Term T0, when the potential of the wiring 66(RES) is set to "H", the potential of the wiring 92(OUT2) is reset to "L". When the potential of the wiring 92(OUT2) is "L", BIAS is supplied to the comparator circuits 31 and 32, and "H" is supplied to the other of the input terminals of each of the NAND circuits 33 and 34.

Term T1 shows, as an example, an operation in the case where difference data output from the pixel 20 is between the upper and lower limits set for the comparator circuits 31 and 32, i.e., the case where it is determined that there is no difference.

In Term T1, when the potential of the wiring 65(SET) is set to "H", difference data is input to the node ND1 from the pixel 20 connected to the wiring 91(OUT1). At this time, the potential of the node ND1 is at a level between Vref− and Vref+, so that the comparator circuit 31 outputs "L" to the node ND2, and the comparator circuit 32 outputs "L" to the node ND3. The potential of the node ND6 is "H", so that the NAND circuits 33 and 34 output "H", which is an inverted potential of the node ND2 and the node ND3, to the node ND4 and the node ND5, respectively. Accordingly, the transistor 52 and the transistor 53 are turned off, so that the potential of the wiring 92(OUT2) is "L". Here, the potential of the wiring 92(OUT2) being "L" means there is no difference.

Term T2 shows, as an example, an operation in the case where difference data output from the pixel 20 exceeds the upper limit set for the comparator circuit 31, i.e., the case where it is determined that there is a difference.

In Term T2, when the potential of the wiring 65(SET) is set to "H", difference data is input to the node ND1 from the pixel 20 connected to the wiring 91(OUT1). At this time, the potential of the node ND1 is at a level higher than Vref+, so that the comparator circuit 31 outputs "H" to the node ND2 and the comparator circuit 32 outputs "L" to the node ND3. At this time, the NAND circuit 33 outputs "L", which is an inverted potential of the node ND2, to the node ND4, and the NAND circuit 34 outputs "H", which is an inverted potential of the node ND3, to the node ND5. Accordingly, the transistor 52 is turned on, and the transistor 53 is turned off, so that the potential of the wiring 92(OUT2) becomes "H". Here, the potential of the wiring 92(OUT2) being "H" means that there is a difference.

Furthermore, since the potential of the wiring 92(OUT2) becomes "H", BIAS supply to the comparator circuits 31 and 32 is shut off. Thus, the potential of the node ND3 rises from "L" to "H".

Furthermore, since the potential of the wiring 92(OUT2) becomes "H", the potential of the node ND6 becomes "L". Thus, the potential of the node ND4 rises from "L" to "H".

Term T3 shows, as an example, an operation in the case where difference data output from the pixel 20 is below the lower limit set for the comparator circuit 32, i.e., the case where it is determined that there is a difference. However, since the potentials of the node ND2 to the node ND5 are fixed in Term T2, the potential of the wiring 92(OUT2) is "H" regardless of the potential of the node ND1. Accordingly, in the circuit, the state in Term T2 does not change in Term T3.

That is, in the case where the circuit in FIG. 5 is used in the configuration illustrated in FIG. 1, when it is determined that there is a difference in any of the rows in one frame, difference determination for the subsequent rows is not practically carried out, and the potential indicating that there is a difference is held in the wiring 92(OUT2). Accordingly, electric power required for the circuit operation of difference detection can be reduced.

In the case where the circuit in FIG. 3 is used in the configuration illustrated in FIG. 2, when it is determined that there is a difference in any of the determination operations performed in one frame period, the subsequent difference determination is not practically carried out, and the potential indicating that there is a difference is held in the wiring 92(OUT2). Accordingly, electric power required for the circuit operation of difference determination can be reduced.

Figure 7:
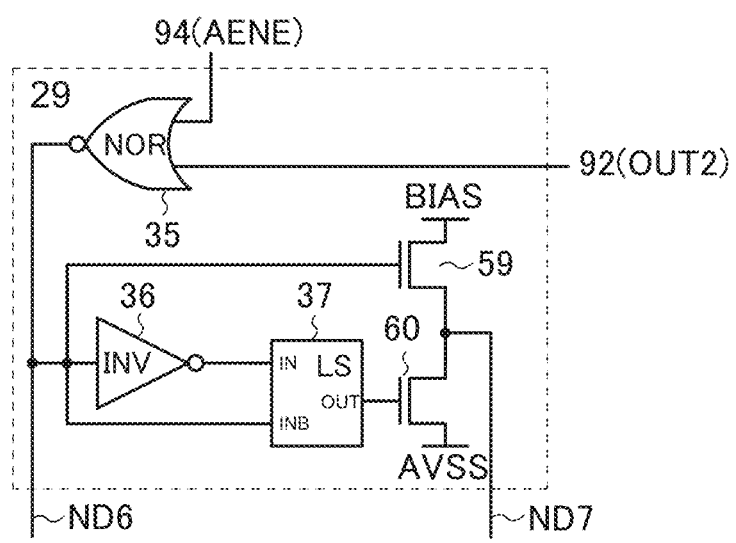
FIG. 7 A drawing illustrating a circuit that determines difference data.

The circuit 28 illustrated in FIG. 5 can be replaced with a circuit 29 illustrated in FIG. 7. The circuit 29 can have a configuration including a NOR circuit 35, an inverter circuit 36, a level shifter circuit 37, a transistor 59, and a transistor 60. Note that although the polarities of the transistors 59 and 60 are the n-ch type in FIG. 7, the polarities of the transistors can be switched by changing the operation conditions.

One of input terminals of the NOR circuit is electrically connected to the wiring 92(OUT2). An output terminal of the NOR circuit is electrically connected to the inverter circuit 36, a gate of the transistor 59, and an inverting input terminal of the level shifter circuit 37. An output terminal of the inverter circuit 36 is electrically connected to an input terminal of the level shifter circuit 37. An output terminal of the level shifter circuit 37 is electrically connected to a gate of the transistor 60. One of a source or a drain of the transistor 59 is electrically connected to one of a source or a drain of the transistor 60.

To the other of the source or the drain of the transistor 59, a constant high potential power (BIAS) capable of controlling circuit operations of the comparator circuits 31 and 32 is supplied. To the other of the source or the drain of the transistor 60, a constant low potential power (AVSS) capable of controlling circuit operations of the comparator circuits 31 and 32 is supplied. Furthermore, a wiring 94 is connected to the other of the input terminals of the NOR circuit 35 and an operation signal (AENE) is input thereto.

Furthermore, a wiring to which the output terminal of the NOR circuit is electrically connected is connected to the NAND circuits 33 and 34, and corresponds to the node ND6 in FIG. 5. A wiring electrically connected to the one of the source or the drain of the transistor 59 is connected to the comparator circuits 31 and 32, and corresponds to the node ND7 in FIG. 5.

With the use of the circuit 29, the low level potential "L" to be input to the power input terminals of the comparator circuits 31 and 32 can be made appropriate.

The circuit 28 has a configuration in which power-supply voltages of the comparator circuits 31 and 32 (analog circuits) and power-supply voltages of the other circuits (digital circuits) are not differentiated. In the case where the voltage value of the low level potential "L" is different between an analog circuit and a digital circuit, the low level potential "L" supplied from the circuit 28 cannot properly stop the analog circuit in some cases. Accordingly, the voltage value of the low level potential "L" is preferably set in accordance with the operation of the analog circuit. With the use of the level shifter circuit 37 and the transistor 60 in the circuit 29, AVSS can be supplied as the low level potential "L" of each of the comparator circuits 31 and 32.

Furthermore, in the circuit 29, the operation signal (AENE) is input from the wiring 94, so that the potential of the node ND6 and the node ND7 can become "L" regardless of the potential of the wiring 91(OUT1). With the provision of a plurality of wirings capable of individually supplying operation signals (AENE), which are respectively connected to circuits 29, it is possible to select circuits 29 to be operated. For example, with a configuration including two wirings capable of individually supplying an operation signal (AENE) and two circuits 29 where one of the circuits 29 controls half of the circuits 22, it is possible to operate all the circuits 22, or operate half of the circuits 22 and stop half of the circuits 22. Accordingly, power consumption can be reduced. Increasing the number of wirings 94 capable of individually supplying an operation signal (AENE) and the number of circuits 29 makes it possible to further minutely control the number of operations of the circuits 22.

Figure 8:
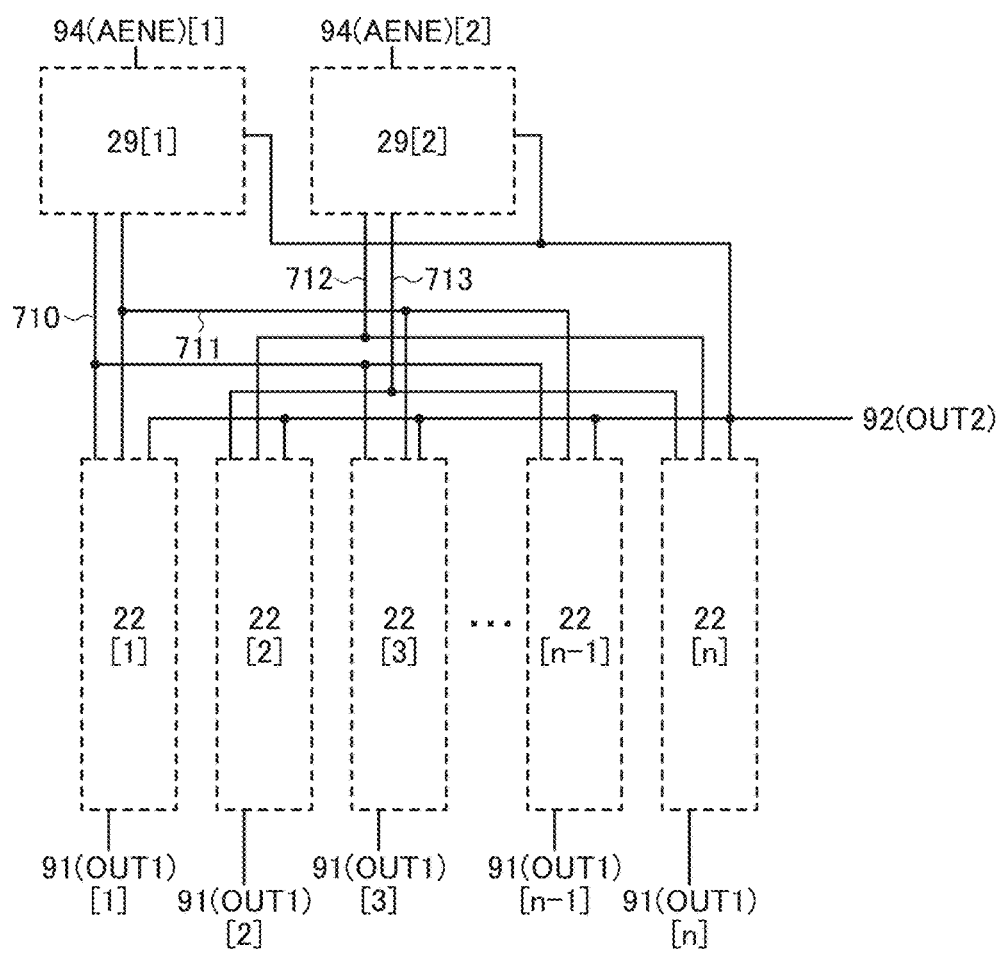
FIG. 8 A drawing illustrating a circuit that determines difference data.

FIG. 8 illustrates a configuration including a wiring 94[1] and a wiring 94[2] capable of individually supplying an operation signal (AENE), a circuit 29[1] to which the wiring 94[1] is connected, a circuit 29[2] to which the wiring 94[2] is connected, a circuit 22[1], a circuit 22[3], and a circuit 22[n-1] which are connected to the circuit 29[1] via wirings 710 and 711, and a circuit 22[2] and a circuit 22[n] which are connected to the circuit 29[2] via wirings 712 and 713. Note that a circuit 22[4] to a circuit 22[n-2] which are not shown are connected to either the circuit 29[1] or the circuit 29 [2]. Furthermore, the circuits 22[1] to [n] are connected to the circuits 29[1] and [2] via the wiring 92(OUT2).

Note that the wirings 710 and 712 correspond to the node ND6 illustrated in FIG. 5. The wirings 711 and 713 correspond to the node ND7 illustrated in FIG. 5.

In the configuration illustrated in FIG. 8, an operation signal (AENE) is supplied to one of the wiring 94[1] or the wiring 94[2], whereby one of the circuit 29[1] or the circuit 29[2] can be operated. That is, only the circuits 22 connected to the one of the circuit 29[1] or the circuit 29[2] can be operated. Note that it is also possible to operate all the circuits 22 by supplying an operation signal (AENE) to each of the wiring 94[1] and the wiring 94[2].

FIG. 9 is a timing chart for illustrating the operation of the circuit illustrated in FIG. 8. Here, an operation of the case where the potential of the wiring 94[1] is "H" and the potential of the wiring 94[2] is "L" is described. The operation of the circuit 22 in Terms T0 to T3 is the same as that in the description of the timing chart shown in FIG. 6.

From the circuit 29[1] to which the wiring 94[1] is connected, a voltage for determining difference data in the circuit 22 is supplied to the wiring 710 (node ND6) and the wiring 711 (node ND7). Accordingly, the circuit 22[1], the circuit 22[3], the circuit 22[n-1], and the like which are connected to the circuit 29[1] via the wirings 710 and 711 properly perform a difference data determination operation.

Meanwhile, from the circuit 29[2] to which the wiring 94[2] is connected, a voltage with which the output of the circuit 22 is fixed regardless of the input signal to and the output signal from the circuit 22 is supplied. Accordingly, the circuit 22[2], the circuit 22[n], and the like which are connected to the circuit 29[2] via the wirings 712 and 713 do not perform a determination operation of difference data. That is, in the circuit shown in FIG. 9, a difference determination operation can be performed without operating half of the circuits.

Figure 39:
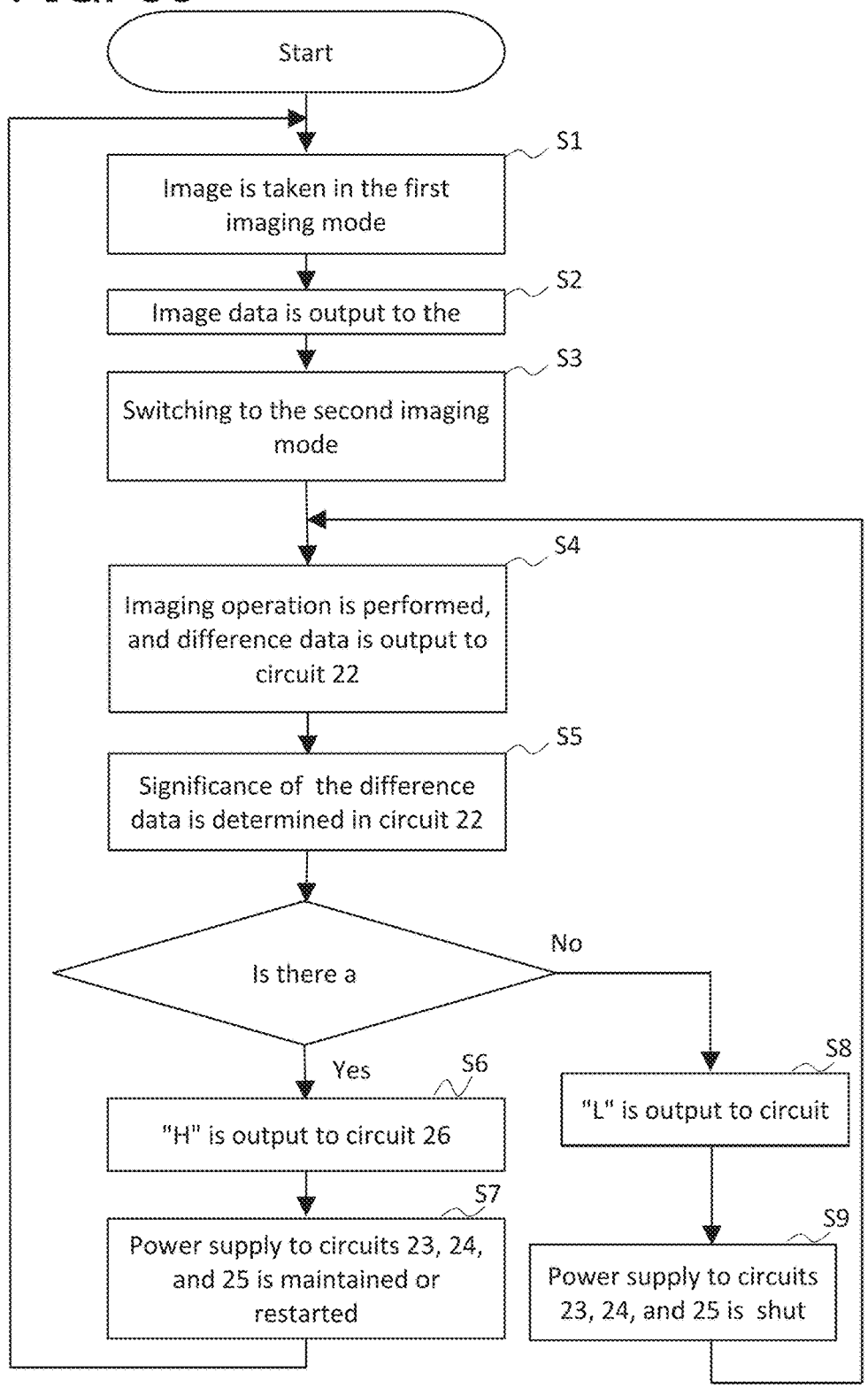
FIG. 39 A flowchart for illustrating an operation method of an imaging device.

An example of an operation method of the imaging device illustrated in FIG. 1 will be described in accordance with the flow chart shown in FIG. 39. The imaging device can select and execute a first imaging mode in which image data is obtained or a second imaging mode in which difference data between two different frames is obtained.

First, an image mode is obtained in the first imaging mode (S1). Next, the image data (analog data) is output from the pixels 20 in a row selected by the circuit 23 to the circuit 24 to be converted to digital data. Then, a column is sequentially selected by the circuit 25, and the digital data is output to the outside (S2). The above operation is repeated from the first row to the last row in one frame period.

Next, switching to the second imaging mode is performed (S3). In the second imaging mode, difference data is obtained and output from the pixel 20 to the circuit 22 (S4). In the circuit 22, the significance of the difference data is determined (S5).

In the case where there is a difference, a signal potential "H" is output to the circuit 26 (S6), and power supply to the circuit 24 and the circuit 25 is maintained (S7). Then, back to S4, image data is obtained again in the first imaging mode.

In the case where there is no difference, a signal potential "L" is output to the circuit 26 (S8), and the power supply to the circuit 24 and the circuit 25 is shut off (S7). Then, back to S4, difference data is obtained again.

Note that in the case where it is determined that there is a difference from a state with no difference, the circuit 26 controls the power supply to the circuit 24 and the circuit 25 to be restarted.

Furthermore, in the imaging device illustrated in FIG. 2, as the subject of a circuit to which power supply is controlled by the circuit 26, the circuit 23 may be included.

Through the above, an imaging device with low power consumption can be provided.

This embodiment can be implemented in an appropriate combination with any of the configurations described in the other embodiments.

(Embodiment 2)

In this embodiment, examples of a pixel circuit that can be applied to the pixel 20 included in the imaging device described in Embodiment 1 and an operation method thereof will be described.

Figure 10A:
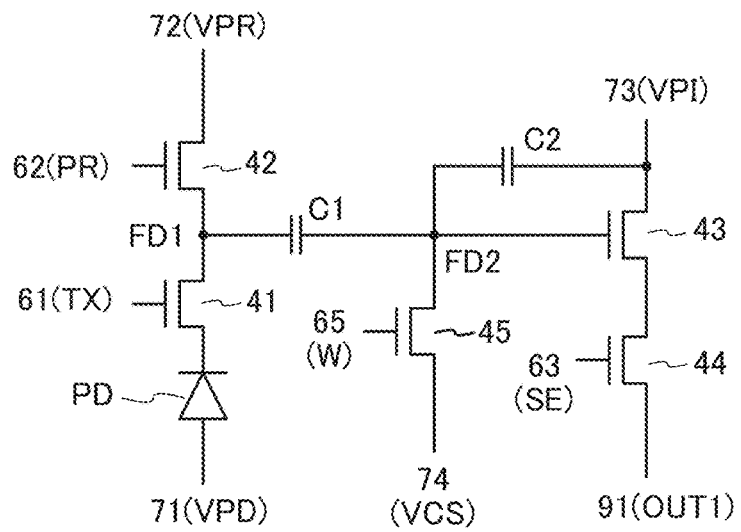
FIG. 10 Circuit diagrams illustrating pixels.

FIG. 10(A) is an example of a pixel circuit that can be used as the pixel 20. Note that an example in which transistors are of the n-ch type is illustrated in FIG. 10(A) or the like; however, one embodiment of the present invention is not limited to this, and some transistors may be replaced with p-ch type transistors.

The pixel circuit can have a configuration including a photoelectric conversion element PD, a transistor 41, a transistor 42, a transistor 43, a transistor 44, a transistor 45, a capacitor C1, and a capacitor C2. Note that a configuration without the capacitor C2 may be employed.

One of terminals of the photoelectric conversion element PD is electrically connected to one of a source or a drain of the transistor 41. The other of the source or the drain of the transistor 41 is electrically connected to one of a source or a drain of a transistor 42. The other of the source or the drain of the transistor 41 is electrically connected to one of terminals of the capacitor C1. The other of the terminals of the capacitor C1 is electrically connected to one of a source or a drain of the transistor 45. The other of the terminals of the capacitor C1 is electrically connected to a gate of the transistor 43. The other of the terminals of the capacitor C1 is electrically connected to one of terminals of the capacitor C2. One of a source or a drain of the transistor 43 is electrically connected to one of a source or a drain of the transistor 44. The other of the terminals of the capacitor C2 is electrically connected to the other of the source or the drain of the transistor 43.

Here, a node to which the one of the source or the drain of the transistor 41, the one of the source or the drain of the transistor 42, and the one of the terminals of the capacitor C1 are connected is FD1. Furthermore, a node to which the other of the terminals of the capacitor C1, the one of the source or the drain of the transistor 45, the gate of the transistor 43, and the one of the terminals of the capacitor C2 are connected is FD2.

The other of the terminals of the photoelectric conversion element PD is electrically connected to a wiring 71(VPD). The other of the source or the drain of the transistor 42 is electrically connected to a wiring 72(VPR). The other of the source or the drain of the transistor 45 is electrically connected to a wiring 74(VCS). The other of the source or the drain of the transistor 43 and the other of the terminals of the capacitor C2 are electrically connected to a wiring 73(VPI). The other of the source or the drain of the transistor 44 is electrically connected to a wiring 91(OUT1).

The wiring 71(VPD), the wiring 72(VPR), the wiring 73(VPI), and the wiring 74(VCS) can have functions of power lines. For example, the wiring 71(VPD) and the wiring 74(VCS) can function as low potential power lines. The wiring 72(VPR) and the wiring 73(VPI) can function as high potential power lines.

A gate of the transistor 41 is electrically connected to a wiring 61(TX). A gate electrode of the transistor 42 is electrically connected to a wiring 62(PR). A gate of the transistor 45 is electrically connected to a wiring 63(W). A gate of the transistor 44 is electrically connected to a wiring 63(SE).

The wiring 61(TX), the wiring 62(PR), the wiring 63(SE), and the wiring 65(W) can function as signal lines for controlling conduction of the transistors.

In the above configuration, the other of the terminals of the capacitor C2 may be connected to not the wiring 73(VPI) but another wiring or the like capable of supplying a fixed potential.

Figure 10B:
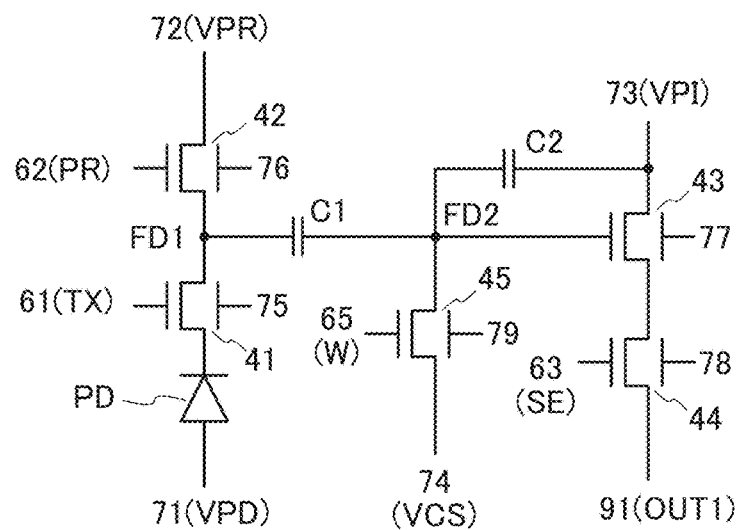

Note that the transistors included in the above pixel circuit may have configurations with back gates as illustrated in FIG. 10(B). FIG. 10(B) is a configuration in which constant potentials are applied to the back gates, which enables control of the threshold voltages.

Wirings 75 to 79 connected to the respective back gates can each be supplied with a different potential separately. Note that the wirings connected to the back gates of the transistor 43 and the transistor 44 may be electrically connected to each other.

In transistors being of the n-ch type, the threshold voltage is shifted in the positive direction when a potential lower than a source potential is applied to the back gate. In contrast, the threshold voltage is shifted in the negative direction when a potential higher than a source potential is applied to the back gate. Therefore, in the case where on/off of each transistor is controlled by a predetermined gate voltage, the off-state current can be reduced by applying a potential lower than a source potential to the back gate. Furthermore, the on-state current can be reduced by applying a potential higher than a source potential to the back gate.

In the circuits illustrated in FIGS. 10(A) and (B), the node FD1 and the node FD2 are desired to have high potential retention capability; thus, transistors with a low off-state current are preferably used as the transistors 41, 42, and 45. The off-state current can be further reduced when a potential lower than the source potential is applied to the back gates of the transistors 41, 42, and 45. Accordingly, the potential retention capability of the node FD1 and the node FD2 can be improved. OS transistors are preferably used as the transistors 41, 42, and 45, for example.

Furthermore, the transistors 43 and 44 act as amplifying transistors, and thus transistors with high on-state current are preferably used therefor. The on-state current can be further increased when a potential higher than a source potential is applied to the back gates of the transistors 43 and 44. Accordingly, a reading potential output to the wiring 91(OUT1) can be defined immediately, that is, high frequency operation can be performed. Transistors including silicon in the active regions or active layers (hereinafter, Si transistors) are preferably used as the transistors 43 and 44, for example.

Figure 10C:
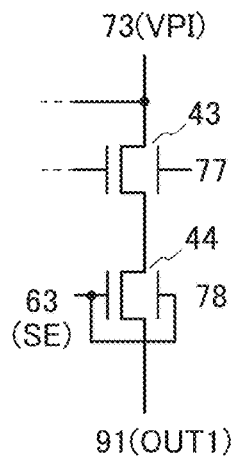

Note that the transistor 44 may have a configuration in which the same potential is applied to a front gate and the back gate, as illustrated in FIG. 10(C). Furthermore, the transistors 43 and 44 may be OS transistors instead of Si transistors. Although the on-state current of an OS transistor is relatively low, the on-state current can be increased by the provision of a back gate, whereby high frequency operation can be performed.

Besides power potentials, a plurality of potentials such as a signal potential and a potential applied to the back gate are used inside an imaging device. Supply of a plurality of potentials from the outside of an imaging device increases the number of terminals or the like; thus, an imaging device preferably includes a power circuit generating a plurality of potentials inside the imaging device.

Since OS transistors have a considerably low off-state current, a period during which charge can be held in the node FD1 and the node FD2 can be considerably long owing to the low off-state current characteristics of the transistors 41, 42, and 443. Therefore, a global shutter system in which charge accumulation operation is performed in all the pixels at the same time can be used without complicating the circuit configuration and operation method. Note that the imaging device of one embodiment of the present invention can also operate by a rolling shutter method.

An OS transistor has lower temperature dependence of change in electrical characteristics than a Si transistor, and thus can be used at a considerably wide range of temperatures. Accordingly, an imaging device and a semiconductor device that include OS transistors are suitable for use in automobiles, aircraft, spacecraft, and the like.

Moreover, an OS transistor has higher drain withstand voltage than a Si transistor. To utilize avalanche multiplication, a photoelectric conversion element whose photoelectric conversion layer is a selenium-based material is preferably operated while a relatively high voltage (10 V or higher, for example) is applied. Thus, by combination of the OS transistor and the photoelectric conversion element whose photoelectric conversion layer is a selenium-based material, a highly reliable imaging device can be obtained.

The pixel circuit described in this embodiment can perform an operation in the first imaging mode in which image data is obtained, and an operation in the second imaging mode in which difference data between imaging data of an initial frame and imaging data of a current frame is retained and a signal corresponding to the difference data is output. In the second operation, the difference data can be output without a comparison process or the like in an external circuit; thus, the pixel circuit is preferably used in the imaging device described in Embodiment 1.

Figure 11A:
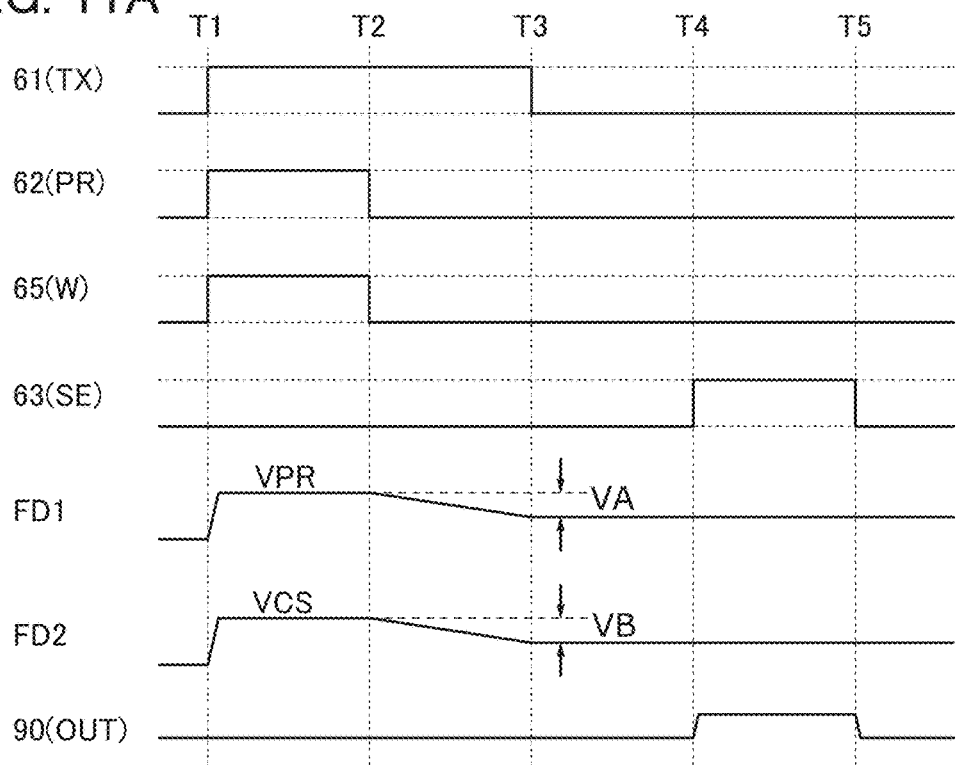
FIG. 11 Timing charts for illustrating operations of pixels.

The case where the pixel circuit illustrated in FIG. 10(A) is operated in the first imaging mode will be described with reference to a timing chart shown in FIG. 11(A).

In a period from Time T1 to Time T2, the potential of the wiring 61(TX) is set to "H", the potential of the wiring 62(PR) is set to "H", and the potential of the wiring 65(W) is set to "H". At this time, the potential of the node FD1 is set to the potential VPR of the wiring 72(VPR), and the potential of the node FD2 is set to the potential VCS of the wiring 74(VCS) (reset operation).

In a period from Time T2 to Time T3, the potential of the wiring 61(TX) is kept at "H", the potential of the wiring 62(PR) is set to "L", and the potential of the wiring 65(W) is set to "L". Here, as the potential of the node FD1 decreases in response to light entering the photoelectric conversion element PD, the potential of the node FD2 also decreases because of capacitive coupling. When the amount of decrease in the potential of the node FD1 at Time T3 is VA, the potential of the node FD1 is VPR−VA. Furthermore, the potential of the node FD2 decreases by VB and becomes VCS−VB (accumulation operation). Note that in the circuit configuration illustrated in FIG. 5(A), as light entering the photoelectric conversion element PD becomes more intense, the potentials of the node FD1 and the node FD2 decrease.

In a period from Time T3 to Time T4, the potential of the wiring 61(TX) is set to "L", the potential of the wiring 62(PR) is kept at "L", and the potential of the wiring 65(W) is kept at "L"; thus, the potentials of the node FD1 and the node FD2 are held.

In a period from Time T4 to Time T5, when the potential of the wiring 63(SE) is set to "H", a signal that corresponds to image data is output to the wiring 91(OUT1) in accordance with the potential of the node FD2 (selection operation). The above is the description of the first operation mode.

Figure 11B:
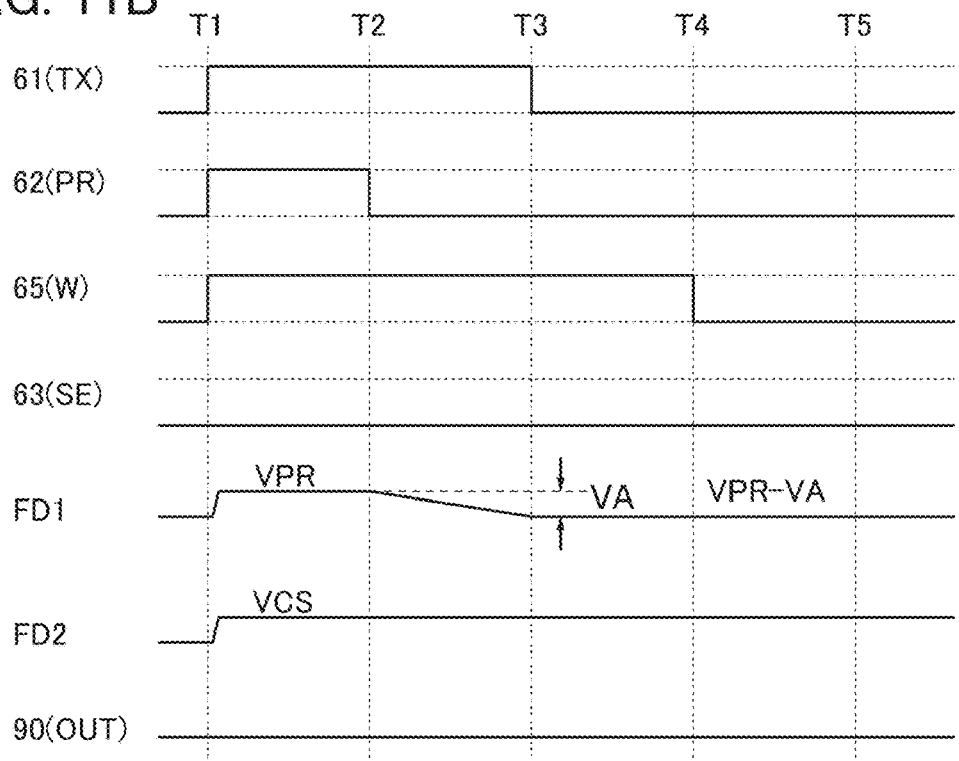

Next, the case where the pixel circuit illustrated in FIG. 10(A) is operated in the second imaging mode will be described. In the second imaging mode, a difference in data between a first frame (initial frame) and a second frame (current frame) is output. First, a data obtaining operation in the first frame will be described with reference to a timing chart shown in FIG. 11(B).

In a period from Time T1 to Time T2, the potential of the wiring 61(TX) is set to "H", the potential of the wiring 62(PR) is set to "H", and the potential of the wiring 65(W) is set to "H". At this time, the potential of the node FD1 is set to the potential VPR of the wiring 72(VPR), and the potential of the node FD2 is set to the potential VCS of the wiring 74(VCS).

In a period from Time T2 to Time T3, the potential of the wiring 61(TX) is kept at "H", the potential of the wiring 62(PR) is set to "L", and the potential of the wiring 65(W) is kept at "H". Here, the potential of the node FD1 decreases in response to light entering the photoelectric conversion element PD. When the amount of decrease in the potential of the node FD1 at Time T3 is VA, the potential of the node FD1 is VPR−VA. Note that in the circuit configuration in FIG. 5(A), as light entering the photoelectric conversion element PD becomes more intense, the potential of the node FD1 decreases.

In a period from Time T3 to Time T4, the potential of the wiring 61(TX) is set to "L", the potential of the wiring 62(PR) is kept at "L", and the potential of the wiring 65(W) is kept at "H"; thus, the potential of the node FD1 is held.

In a period from Time T4 to Time T5, the potential of the wiring 61(TX) is kept at "L", the potential of the wiring 62(PR) is kept at "L", and the potential of the wiring 65(W) is set to "L"; thus, the potentials of the node FD1 and the node FD2 are held.

Next, a data obtaining operation in the second frame will be described with reference to a timing chart shown in FIG. 12(A). Note that the case where there is no difference in data between the first frame and the second frame, i.e., the case where the same image is taken in the first frame and the second frame is assumed in. FIG. 12(A).

In a period from Time T1 to Time T2, the potential of the wiring 61(TX) is set to "H", the potential of the wiring 62(PR) is set to "H", and the potential of the wiring 65(W) is set to "L"; thus, the potential of the node FD1 increases by VA, and the potential of the node FD2 increases by VB because of capacitive coupling. Here, VA and VB are potentials that reflect illuminance in the first frame.

In a period from Time T2 to Time T3, the potential of the wiring 61(TX) is kept at "H", the potential of the wiring 62(PR) is set to "L", and the potential of the wiring 65(W) is kept at "L"; thus, the potentials of the node FD1 and the node FD2 decrease in response to light entering the photoelectric conversion element PD. When the amount of decrease in the potential of the node FD1 at Time T3 is VA', the potential of the node FD1 is VPR−VA'; since VA'=VA, the potential of the node FD1 is VPR−VA. Furthermore, the potential of the node FD2 decreases by VB' due to capacitive coupling, and is VCS+VB−VB'; since VB'=VB, the potential of the node FD2 is VCS.

In a period from Time T3 to Time T4, the potential of the wiring 61(TX) is set to "L", the potential of the wiring 62(PR) is kept at "L", and the potential of the wiring 65(W) is kept at "L"; thus, the potentials of the node FD1 and the node FD2 are held.

When the potential of the wiring 63(SE) is set to "H" in a period from Time T4 to Time T5, a signal that corresponds to difference data is output to the wiring 91(OUT1) in accordance with the potential of the node FD2. At this time, the potential of the node FD2 is "VCS", which is the reset potential, and it is determined that there is no significant difference in comparison of data between the first frame and the second frame.

Next, with reference to a timing chart shown in. FIG. 12(B), an operation assuming the case where there is a difference in data between the first frame and the second frame, i.e., the case where different images are taken in the first frame and the second frame will be described. Note that the illuminance of light entering a target pixel in the first frame is lower than that in the second frame.

In a period from Time T1 to Time T2, the potential of the wiring 61(TX) is set to "H", the potential of the wiring 62(PR) is set to "H", and the potential of the wiring 65(W) is set to "L"; thus, the potential of the node FD1 increases by VA, and the potential of the node FD2 increases by VB because of capacitive coupling. Here, VA and VB are potentials that reflect illuminance in the first frame.

In a period from Time T2 to Time T3, the potential of the wiring 61(TX) is kept at "H", the potential of the wiring 62(PR) is set to "L", and the potential of the wiring 65(W) is kept at "L"; thus, the potentials of the node FD1 and the node FD2 decrease in response to light entering the photoelectric conversion element PD. When the amount of decrease in the potential of the node FD1 at Time T3 is VA', the potential of the node FD1 is VPR−VA'. Furthermore, the potential of the node FD2 decreases by VB' because of capacitive coupling, and becomes VCS+VB−VB'.

In a period from Time T3 to Time T4, the potential of the wiring 61(TX) is set to "L", the potential of the wiring 62(PR) is kept at "L", and the potential of the wiring 65(W) is kept at "L"; thus, the potentials of the node FD1 and the node FD2 are held.

In a period from Time T4 to Time T5, when the potential of the wiring 63(SE) is set to "H", a signal that corresponds to difference data is output to the wiring 91(OUT1) in accordance with the potential of the node FD2. At this time, the potential of the node FD2 is VCS+VB−VB'. VB is a potential that reflects illuminance in the first frame and VB' is data that reflects illuminance in the second frame. The above is the description of the second imaging mode in which a difference in data between the first frame and the second frame is output.

Figure 13:
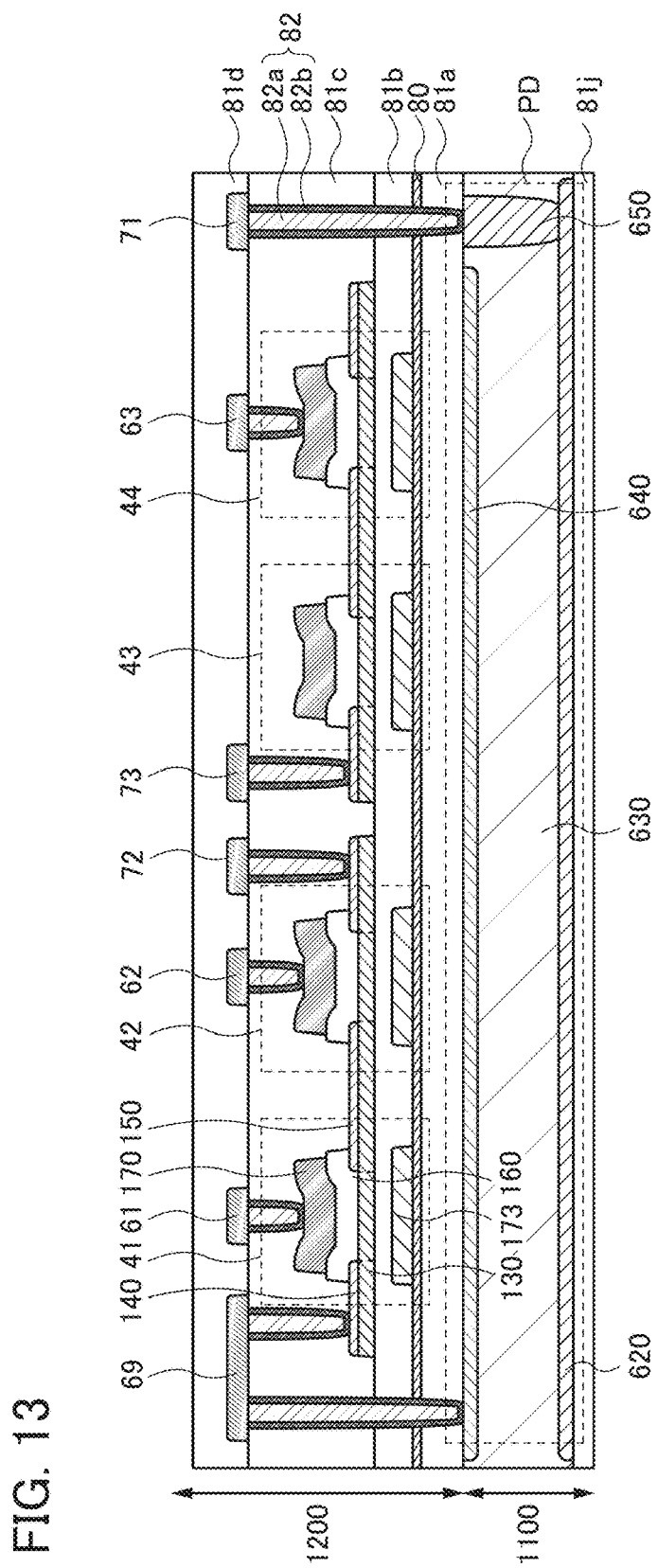
FIG. 13 A cross-sectional view illustrating a structure of an imaging device.

FIG. 13 is a drawing illustrating an example of a specific structure of the pixel 20, and is a cross-sectional view showing the channel length direction of the transistors 41, 42, 43, and 44 included in the pixel circuit.

Note that although wirings, electrodes, metal layers, and contact plugs (conductors 82) are shown as independent components in cross-sectional views described in this embodiment, some of them are provided as one component in some cases when they are electrically connected to each other. In addition, a form in which components such as wirings, electrodes, and metal layers are connected to each other through the conductors 82 is only an example, and the components may be directly connected to each other not through the conductor 82.

Furthermore, insulating layers 81a to 81k and the like that have functions of protective films, interlayer insulating films, or planarization films are provided over a substrate and components such as transistors. An inorganic insulating film such as a silicon oxide film or a silicon oxynitride film can be used as each of the insulating layers 81a to 81k, for example. Alternatively, an organic insulating film or the like such as acrylic resin or polyimide resin may be used. Top surfaces of the insulating layers 81a to 81k and the like may be subjected to planarization treatment as necessary by a CMP (chemical mechanical polishing) method or the like.

Note that some of wirings and the like or transistors and the like illustrated in drawings are not provided in some cases, or wirings and the like or transistors and the like that are not illustrated in drawings are included in layers in some cases.

The pixel 20 can include a layer 1100 and a layer 1200.

The layer 1100 can include the photoelectric conversion element PD. A photodiode with two terminals can be used for the photoelectric conversion element PD, for example. As the photodiode, a pn-type photodiode using a single crystal silicon substrate, a pin-type photodiode using an amorphous silicon thin film, a microcrystalline silicon thin film, or a polycrystalline silicon thin film, a photodiode using selenium, a selenium compound, or an organic compound, or the like can be used.

In FIG. 13, the photoelectric conversion element PD included in the layer 1100 is a pn-type photodiode using a single crystal silicon substrate. The photoelectric conversion element PD may have a structure including a $p^+$ region 620, a $p^-$ region 630, an n-type region 640, and a $p^+$ region 650.

The layer 1200 can include OS transistors that constitute the pixel circuit; FIG. 13 illustrates the transistors 41, 42, 43, and 44 included in the pixel circuit. A structure in which the photoelectric conversion element PD and the transistors overlap with each other can be employed in this way, which increases the area where the photoelectric conversion element PD receives light.

An insulating layer 80 is provided between a region where the OS transistors are formed and a region where Si devices (Si transistors, Si photodiodes, or the like) are formed.

An insulating layer provided near a Si device preferably contains hydrogen to terminate dangling bonds of silicon. Meanwhile, hydrogen in an insulating layer provided near an oxide semiconductor layer that is the active layer of the transistors 41, 42, and the like becomes one of the factors of generating carriers in the oxide semiconductor layer. Thus, the hydrogen might cause reduction in the reliability of the transistors 41, 42, and the like. Accordingly, in the case where one layer including the Si device and another layer including the OS transistors are stacked, the insulating layer 80 that has a function of preventing diffusion of hydrogen is preferably provided between these layers. Diffusion of hydrogen can be prevented by the insulating layer 80; thus, the reliability of both the Si device and the OS transistors can be improved.

For the insulating layer 80, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used, for example.

One of electrodes (the n-type region 640) of the photoelectric conversion element PD can be electrically connected to the transistor 41 through two conductors 82 and a wiring 69, for example.

Here, since the conductor 82 is provided to penetrate the insulating layer 80, the conductor 82 also preferably has a function of preventing diffusion of hydrogen. For example, as illustrated in FIG. 13, the outer side of the conductor 82 at least in contact with a sidewall of an opening is a conductor 82b with a barrier property against hydrogen, and the inner side of the conductor 82 is a conductor 82a with low resistance. Tungsten can be used for the conductor 82a, and tantalum nitride or the like can be used for the conductor 82b, for example. Note that the conductor 82 can also be formed only of the conductor 82a. Furthermore, in the case where a layer containing impurities such as hydrogen is not in contact with the conductor 82, the conductor 82 may be formed only of the conductor 82b.

FIG. 13 is a structure in which top-gate OS transistors are provided in the layer 1200. Each of the OS transistors is provided over a stack including insulating layers (the insulating layers 81a, 80, and 81b) formed over the layer 1100, for example, and includes: an oxide semiconductor layer 130; 140 and 150 each functioning as a source electrode or a drain electrode; an insulating layer 160 functioning as a gate insulating layer; and a conductive layer 170 functioning as a gate electrode. Note that the insulating layer 81b can also have a function of a gate insulating layer.

FIG. 13 illustrates a structure in which the OS transistors are each provided with a conductive layer 173 functioning as a back gate electrode. In the structure illustrated in FIG. 13, back gate electrodes that also serve as light-blocking layers are preferably provided, because light that passes through the layer 1100 might change the electrical characteristics of the transistors. Moreover, the provision of the back gates enables control of the threshold voltages and the like of the OS transistors.

Figure 14:
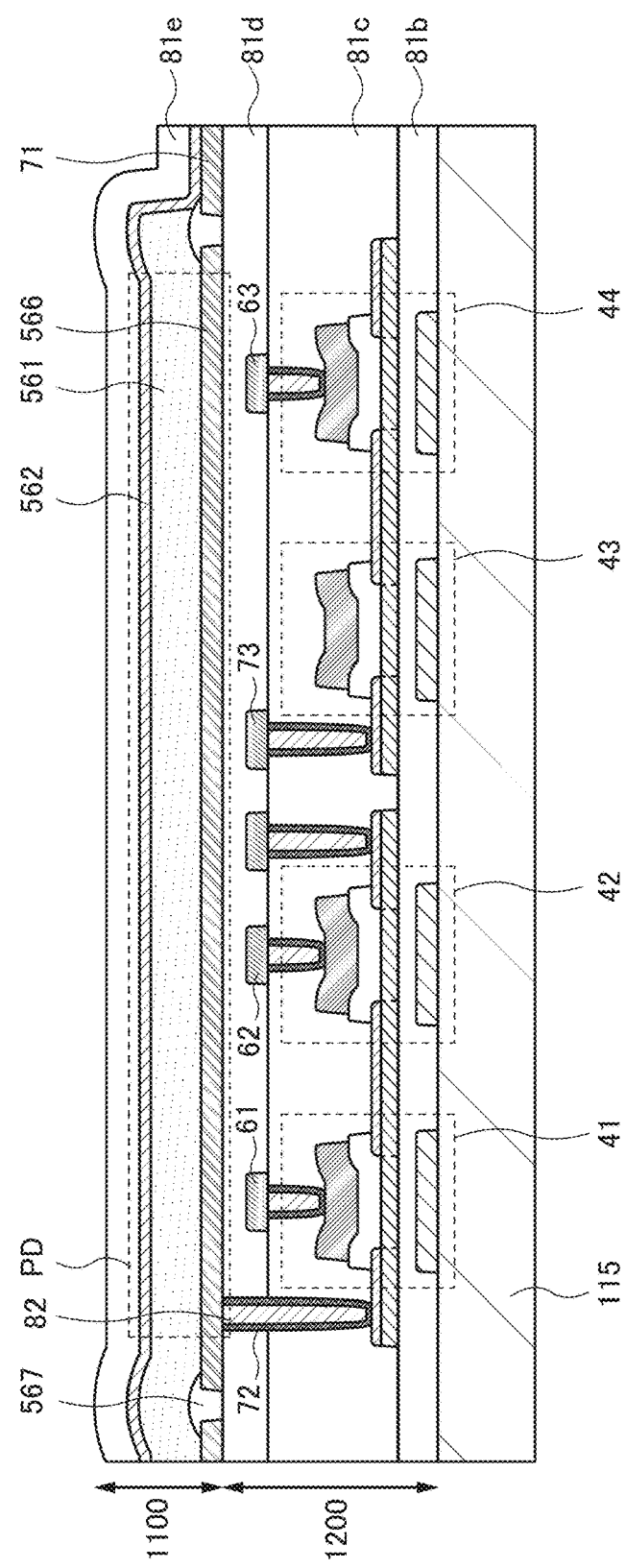
FIG. 14 A cross-sectional view illustrating a structure of an imaging device.

The pixel 20 may also have a stacked structure illustrated in FIG. 14. The pixel 20 illustrated in FIG. 14 is a structure in which the layer 1200 and the layer 1100 are provided over a substrate 115. The photoelectric conversion element PD is provided over the OS transistors, which facilitates electrical connection between the OS transistors and one of the electrodes of the photoelectric conversion element PD.

FIG. 14 illustrates a form in which a selenium-based material is used for a photoelectric conversion layer 561. The photoelectric conversion element PD using a selenium-based material has properties with high external quantum efficiency with respect to visible light. Furthermore, a selenium-based material has a high light-absorption coefficient, which is advantageous because the photoelectric conversion layer 561 can easily be made thin. The photoelectric conversion element PD using a selenium-based material can be a highly sensitive sensor in which the amount of amplification is large because of avalanche multiplication. In other words, the use of a selenium-based material for the photoelectric conversion layer 561 allows a sufficient amount of photocurrent to be obtained even when the pixel area is reduced. Thus, the photoelectric conversion element PD using a selenium-based material is also suitable for imaging in a low-illuminance environment.

As a selenium-based material, amorphous selenium or crystalline selenium can be used. Crystalline selenium can be obtained, for example, by subjecting amorphous selenium to heat treatment after deposition. When the crystal grain size of crystalline selenium is smaller than a pixel pitch, variations in characteristics between pixels can be reduced. Moreover, crystalline selenium has properties with higher spectral sensitivity and light-absorption coefficient for visible light than amorphous selenium.

Figure 15A:
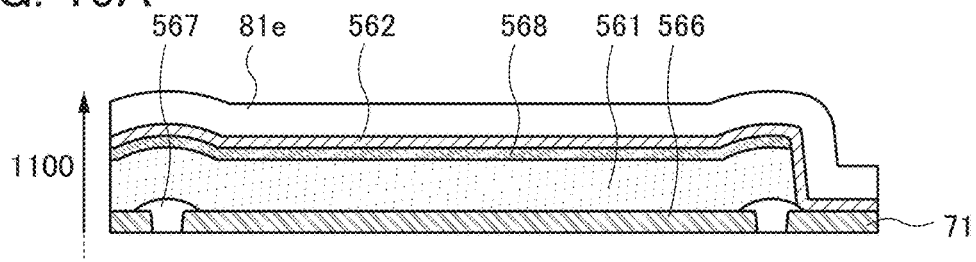
FIG. 15 Cross-sectional views illustrating connection modes of a photoelectric conversion element.
Figure 15B:
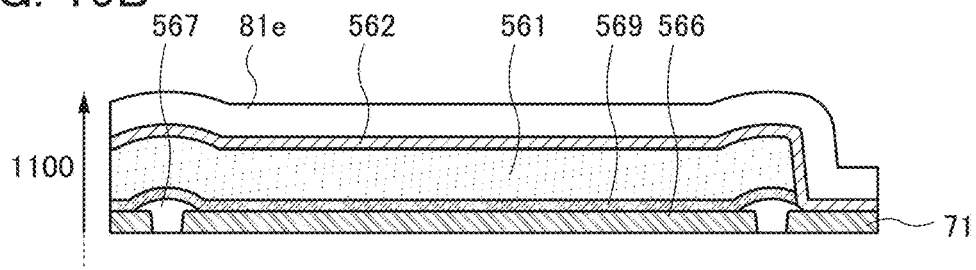
Figure 15C:
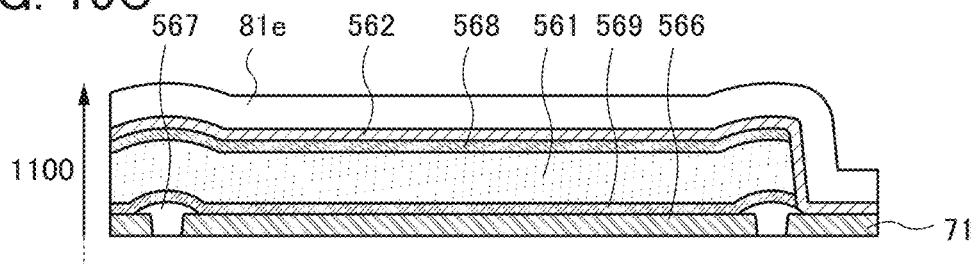

Although the photoelectric conversion layer 561 is illustrated as a single layer in FIG. 14, gallium oxide, cerium oxide, In—Ga—Zn oxide, or the like may be provided as a hole-injection blocking layer 568 on a light-receiving surface side as illustrated in FIG. 15(A). Alternatively, as illustrated in FIG. 15(B), nickel oxide, antimony sulfide, or the like may be provided as an electron-injection blocking layer 569 on an electrode 566 side. Alternatively, as illustrated in FIG. 15(C), a structure in which the hole-injection blocking layer 568 and the electron-injection blocking layer 569 are provided may be employed.

The photoelectric conversion layer 561 may be a layer containing a compound of copper, indium, and selenium (CIS). Alternatively, a layer containing a compound of copper, indium, gallium, and selenium (CIGS) may be used. With CIS or CIGS, a photoelectric conversion element that utilizes avalanche multiplication as in the case of using a single layer of selenium can be formed.

The photoelectric conversion element PD using a selenium-based material may have a structure in which the photoelectric conversion layer 561 is provided between a light-transmitting conductive layer 562 and the electrode 566 formed of a metal material or the like, for example. Furthermore, CIS and CIGS are p-type semiconductors, and an n-type semiconductor such as cadmium sulfide or zinc sulfide may be provided in contact therewith in order to form a junction.

Figure 15D:
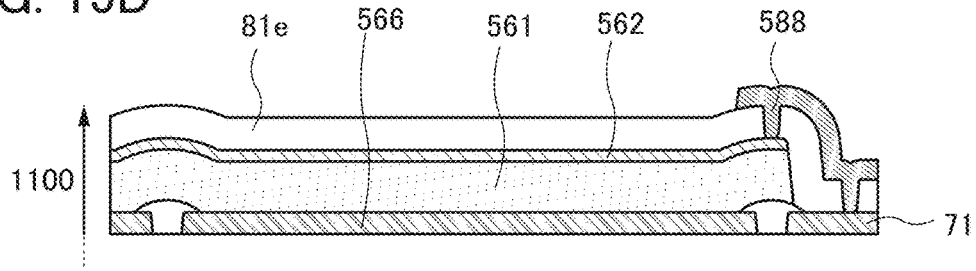
Figure 15E:
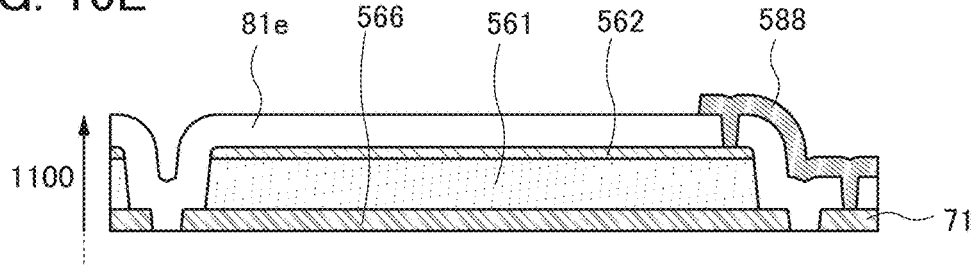
Figure 16A:
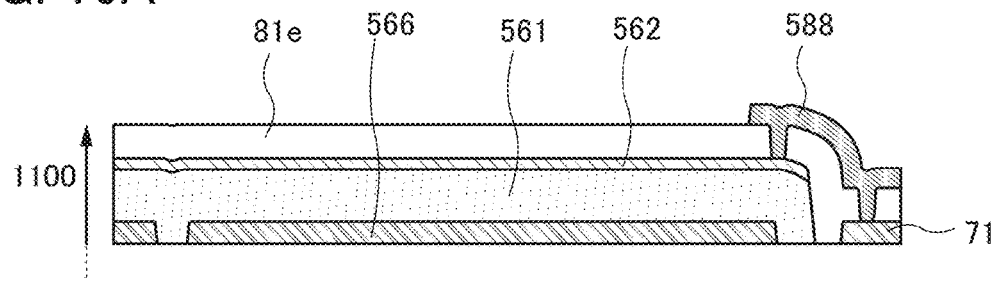
FIG. 16 Cross-sectional views illustrating connection modes of a photoelectric conversion element.
Figure 16B:
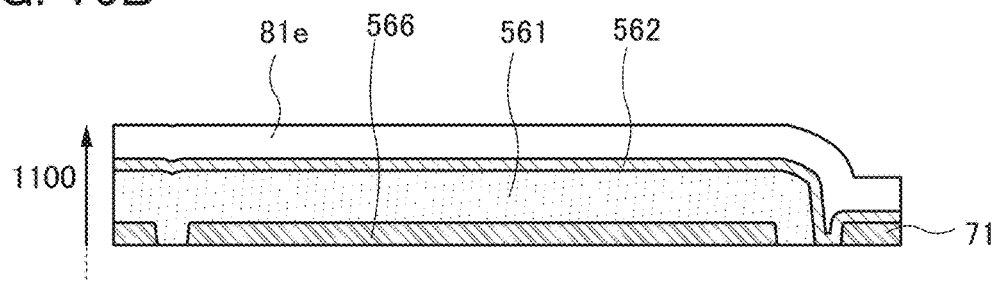

Although a structure in which the light-transmitting conductive layer 562 is directly in contact with a wiring 71 is employed in FIG. 14, a structure in which they are in contact with each other through a wiring 588 as illustrated in FIG. 15(D) may be employed. Furthermore, although a structure in which the photoelectric conversion layer 561 and the light-transmitting conductive layer 562 are not divided between pixel circuits is employed in FIG. 14, a structure in which they are divided between the circuits as illustrated in FIG. 15(E) may be employed. Furthermore, in a region between pixels where the electrode 566 is not provided, a partition wall 567 formed of an insulator is preferably provided, thereby preventing generation of a crack in the photoelectric conversion layer 561 and the light-transmitting conductive layer 562; however, a structure in which the partition wall 567 is not provided as illustrated in FIGS. 16(A) and (B) may also be employed.

Figure 16C:
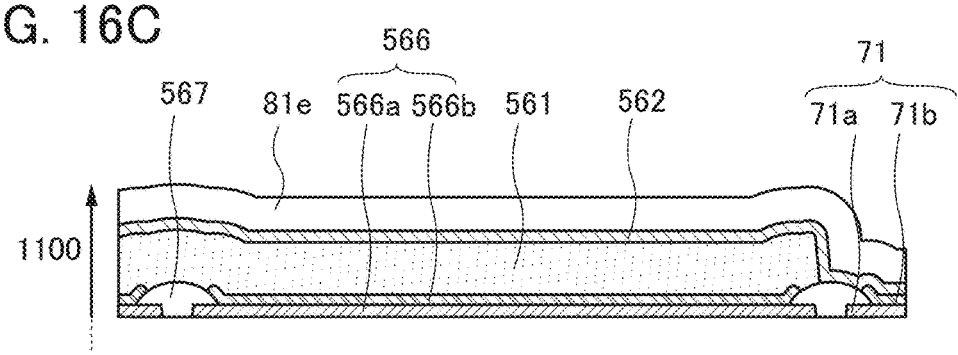

Furthermore, the electrode 566, the wiring 71, and the like may each be a multilayer. For example, as illustrated in FIG. 16(C), the electrode 566 can include two layers, a conductive layer 566a and a conductive layer 566b, and the wiring 71 can include two layers, a conductive layer 71a and a conductive layer 71b. In the structure of FIG. 16(C), for example, the conductive layer 566a and the conductive layer 71a may be formed of a selected low-resistance metal or the like, and the conductive layer 566a and the conductive layer 71a may be formed of a selected metal or the like that exhibits an excellent contact property with the photoelectric conversion layer 561. With such a structure, the electrical characteristics of the photoelectric conversion element PD can be improved. Furthermore, some kinds of metal may cause electrolytic corrosion by being in contact with the light-transmitting conductive layer 562. Even in the case where such a metal is used for the conductive layer 71a, electrolytic corrosion can be prevented through the conductive layer 71b.

For the conductive layer 566b and the conductive layer 71b, molybdenum, tungsten, or the like can be used, for example. For the conductive layer 566a and the conductive layer 71a, aluminum, titanium, or a stack in which an aluminum layer is sandwiched between titanium layers can also be used, for example.

Figure 16D:
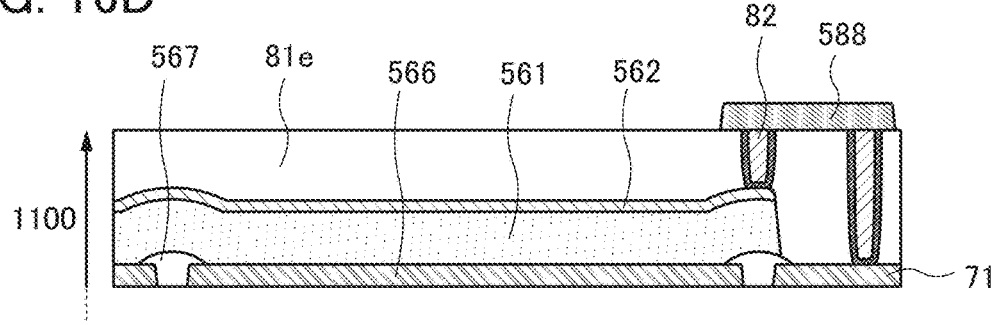

Furthermore, as illustrated in FIG. 16(D), the light-transmitting conductive layer 562 may be connected to the wiring 71 through the conductors 82 and a wiring 88.

The partition wall 567 can be formed using an inorganic insulator, an insulating organic resin, or the like. Furthermore, the partition wall 567 may be colored black or the like in order to shield the transistors and the like from light and/or to determine the area of a light-receiving portion in each pixel.

Figure 17:
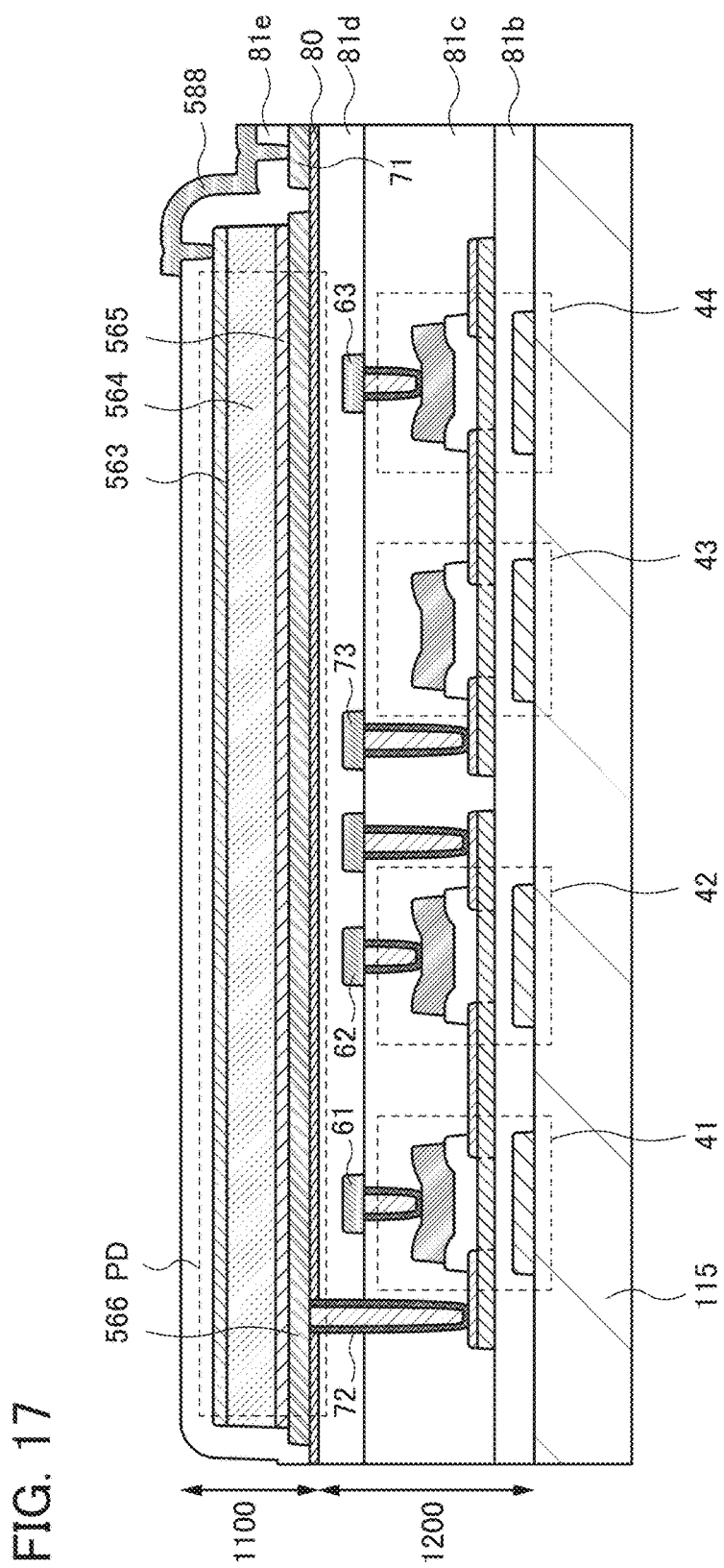
FIG. 17 A cross-sectional view illustrating a structure of an imaging device.

The pixel 20 can also employ a stacked structure illustrated in FIG. 17. The pixel 20 illustrated in FIG. 17 is different from the pixel 20 illustrated in FIG. 14 only in the layer 1100; the other structures are the same.

In FIG. 17, the photoelectric conversion element PD included in the layer 1100 is a pin-type photodiode using an amorphous silicon film, a microcrystalline silicon film, or the like as a photoelectric conversion layer. The photoelectric conversion element PD may have a structure including an n-type semiconductor layer 565, an i-type semiconductor layer 564, a p-type semiconductor layer 563, an electrode 566, a wiring 71, and a wiring 588.

The electrode 566 is electrically connected to a metal layer 405. Furthermore, the p-type semiconductor layer 563 is electrically connected to the wiring 71 through the wiring 588.

For the i-type semiconductor layer 564, amorphous silicon is preferably used. Furthermore, for each of the p-type semiconductor layer 563 and the n-type semiconductor layer 565, amorphous silicon, microcrystalline silicon, or the like that includes a dopant imparting the corresponding conductivity type can be used. A photodiode of which a photoelectric conversion layer is amorphous silicon has high sensitivity in a visible light wavelength region, and thus can easily sense weak visible light.

Figure 18A:
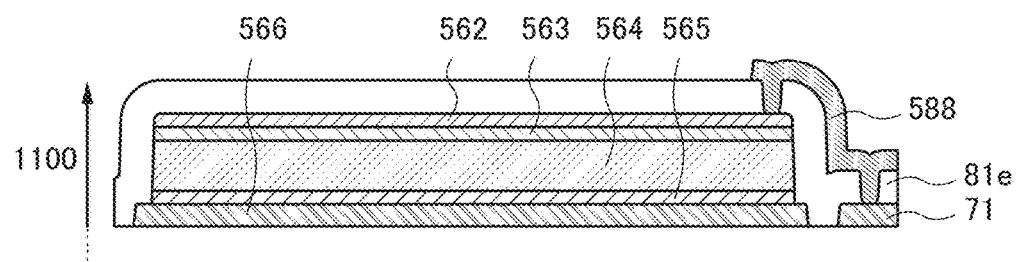
FIG. 18 Cross-sectional views illustrating connection modes of a photoelectric conversion element.

Furthermore, the structure of the photoelectric conversion element PD having a form of a pin-type thin film photodiode and the connection mode between the photoelectric conversion element PD and the wirings can be examples illustrated in FIGS. 18(A), (B), and (C). Note that the structure of the photoelectric conversion element PD and the connection mode between the photoelectric conversion element PD and the wirings are not limited thereto, and other modes may also be employed.

FIG. 18(A) is a structure in which a light-transmitting conductive layer 562 in contact with the p-type semiconductor layer 563 of the photoelectric conversion element PD is provided. The light-transmitting conductive layer 562 acts as an electrode and can increase the output current of the photoelectric conversion element PD.

For the light-transmitting conductive layer 562, indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, graphene, graphene oxide, or the like can be used, for example. Furthermore, the light-transmitting conductive layer 562 is not limited to a single layer and may be a stack of different films.

Figure 18B:
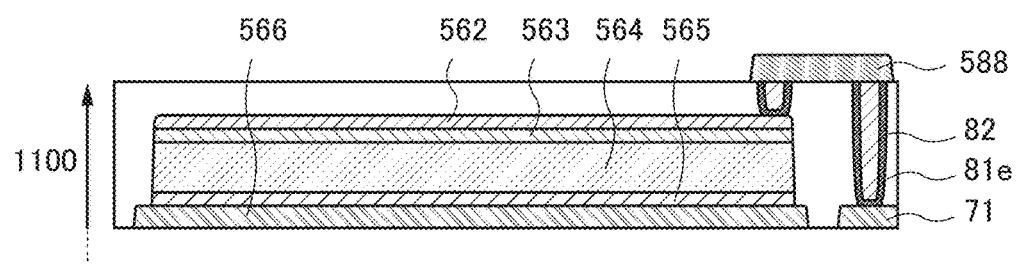

FIG. 18(B) is a structure in which the light-transmitting conductive layer 562 and the wiring 71 are connected to each other through the conductors 82 and the wiring 588. Note that a structure in which the p-type semiconductor layer 563 of the photoelectric conversion element PD and the wiring 71 are connected to each other through the conductors 82 and the wiring 588 may also be employed. Note that in FIG. 18(B), a structure in which the light-transmitting conductive layer 562 is not provided may also be employed.

Figure 18C:
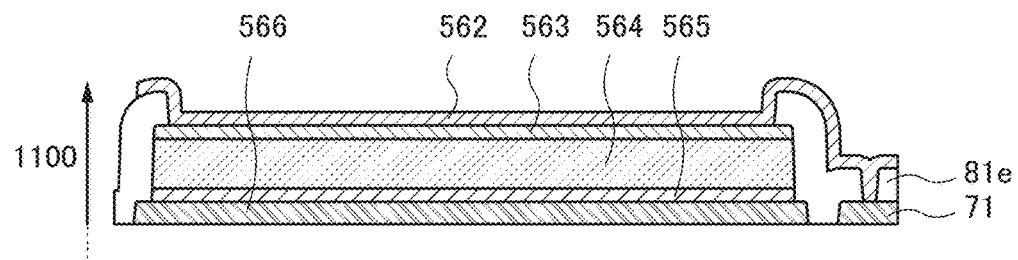

FIG. 18(C) is a structure in which an opening that exposes the p-type semiconductor layer 563 is provided in an insulating layer 81e covering the photoelectric conversion element PD, and the light-transmitting conductive layer 562 covering the opening is electrically connected to the wiring 71.

The photoelectric conversion element PD that is formed using the above-mentioned selenium-based material, amorphous silicon, or the like can be formed through general semiconductor manufacturing processes such as a deposition process, a lithography process, and an etching process. In addition, because the resistance of the selenium-based material is high, a structure in which the photoelectric conversion layer 561 is not divided between circuits can be employed, as illustrated in FIG. 14. Thus, it can be manufactured with a high yield at low cost.

Figure 19A:
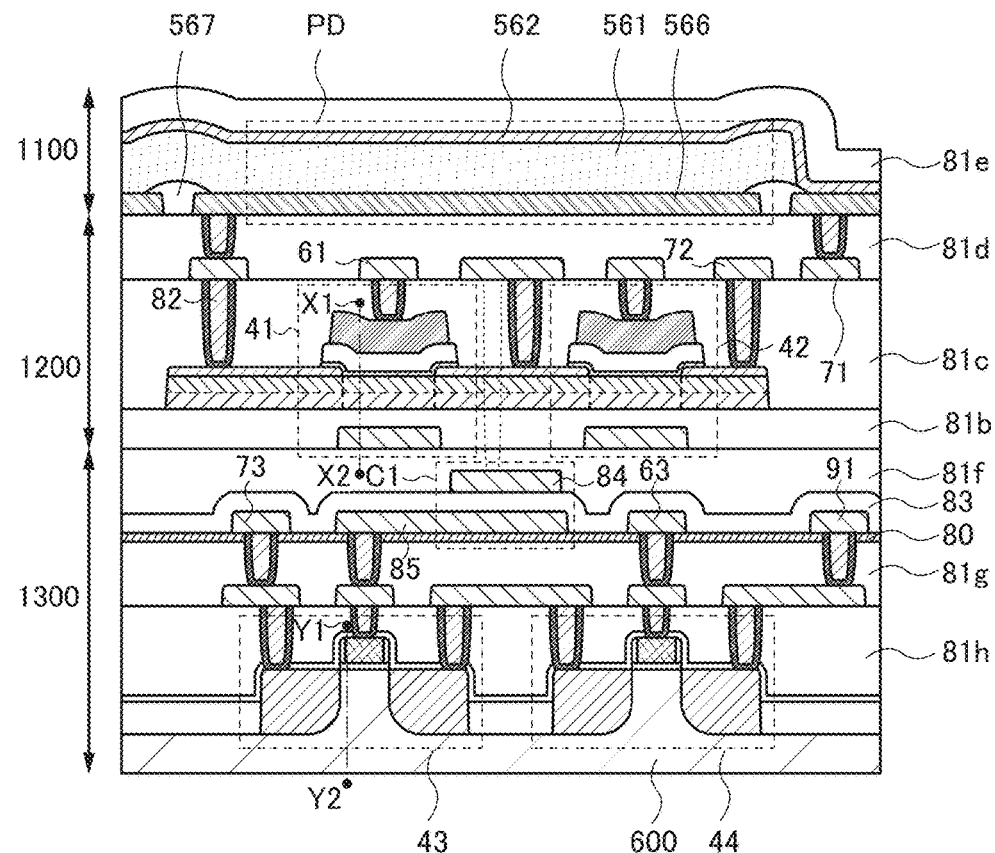
FIG. 19 Cross-sectional views illustrating a structure of an imaging device.
Figure 19B:
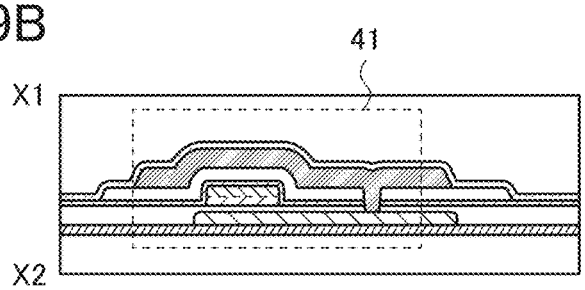
Figure 19C:
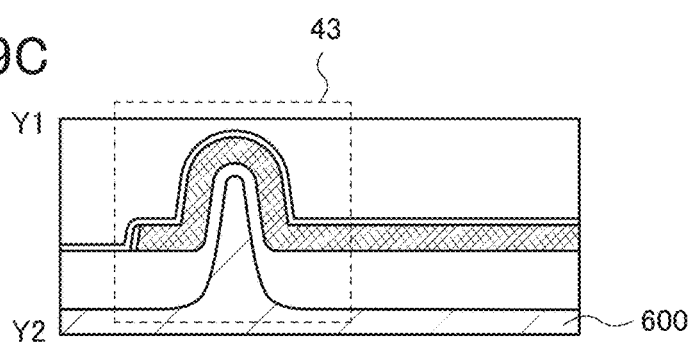

The pixel 20 may have a stacked structure of the layer 1100, the layer 1200, and a layer 1300 as illustrated in FIGS. 19(A), (B), and (C). FIG. 19(A) is a cross-sectional view illustrating the transistors 41, 42, 43, and 44 in the channel length direction. FIG. 19(B) is a cross-sectional view taken along dashed-dotted line X1-X2 shown in FIG. 19(A), and illustrates the section of the transistor 41 in the channel width direction. FIG. 19(C) is a cross-sectional view taken along dashed-dotted line Y1-Y2 shown in FIG. 19(A), and illustrates the section of the transistor 42 in the channel width direction.

The layer 1100 may have a structure including the photoelectric conversion element PD as with the above-mentioned structure of the pixel 20. Although a structure in which a selenium-based photoelectric conversion element PD is provided as with the structure in FIG. 14 is illustrated in FIG. 19(A), a structure in which a photoelectric conversion element PD having a form of a pin-type thin film photodiode as with the structure in FIG. 17 may also be employed.

The layer 1200 may have a structure including the transistors 41, 42, and 45. OS transistors are preferably used as the transistors 41, 42, and 45. Note that the transistor 45 is not illustrated.

The layer 1300 may have a structure including the transistor 43 and the transistor 44. Transistors including silicon in the active layers or active regions are preferably used as the transistors 43 and 44. A transistor including silicon in the active layer or active region has a high on-state current and can efficiently amplify the potential of the node FD2.

Note that although a structure in which the capacitor C1 including a conductive layer 84 and a conductive layer 85 as electrodes and an insulating layer 83 as a dielectric layer is provided in the layer 1300 is illustrated, the capacitor C1 may be provided in the layer 1200. Furthermore, although the capacitor C2 is not illustrated, the capacitor C2 may be provided in either the layer 1200 or the layer 1300.

Figure 20A:
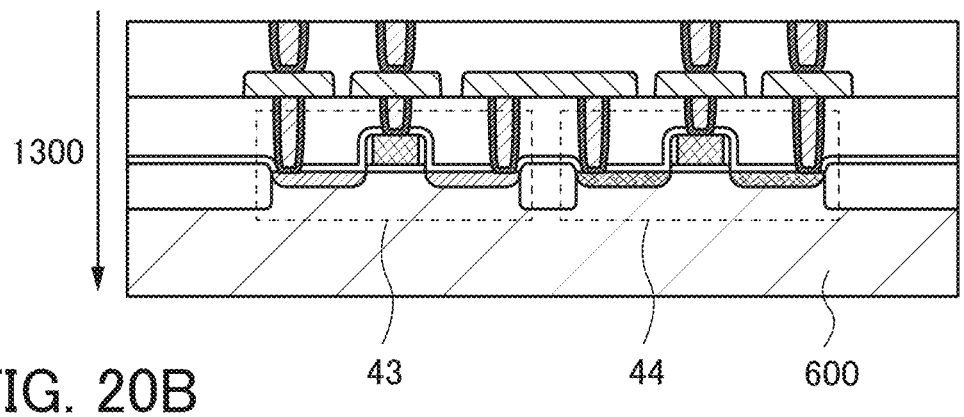
FIG. 20 Cross-sectional views illustrating structures of imaging devices.
Figure 20B:
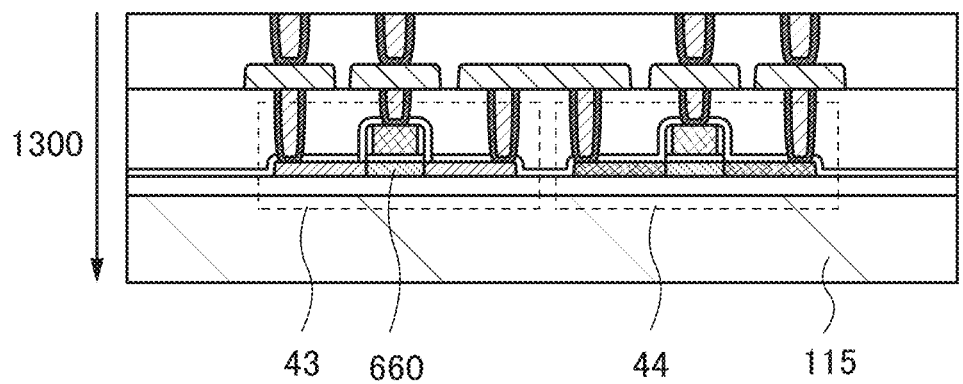

Although FIGS. 19(A) and (C) illustrate a structure with the transistors 43 and 44 of a fin type, the transistors may be of a planar type as illustrated in FIG. 20(A). Alternatively, as illustrated in FIG. 20(B), transistors each including an active layer 660 of a silicon thin film may be used. The active layer 660 can also be polycrystalline silicon or single crystal silicon of SOI (silicon on insulator).

Figure 21:
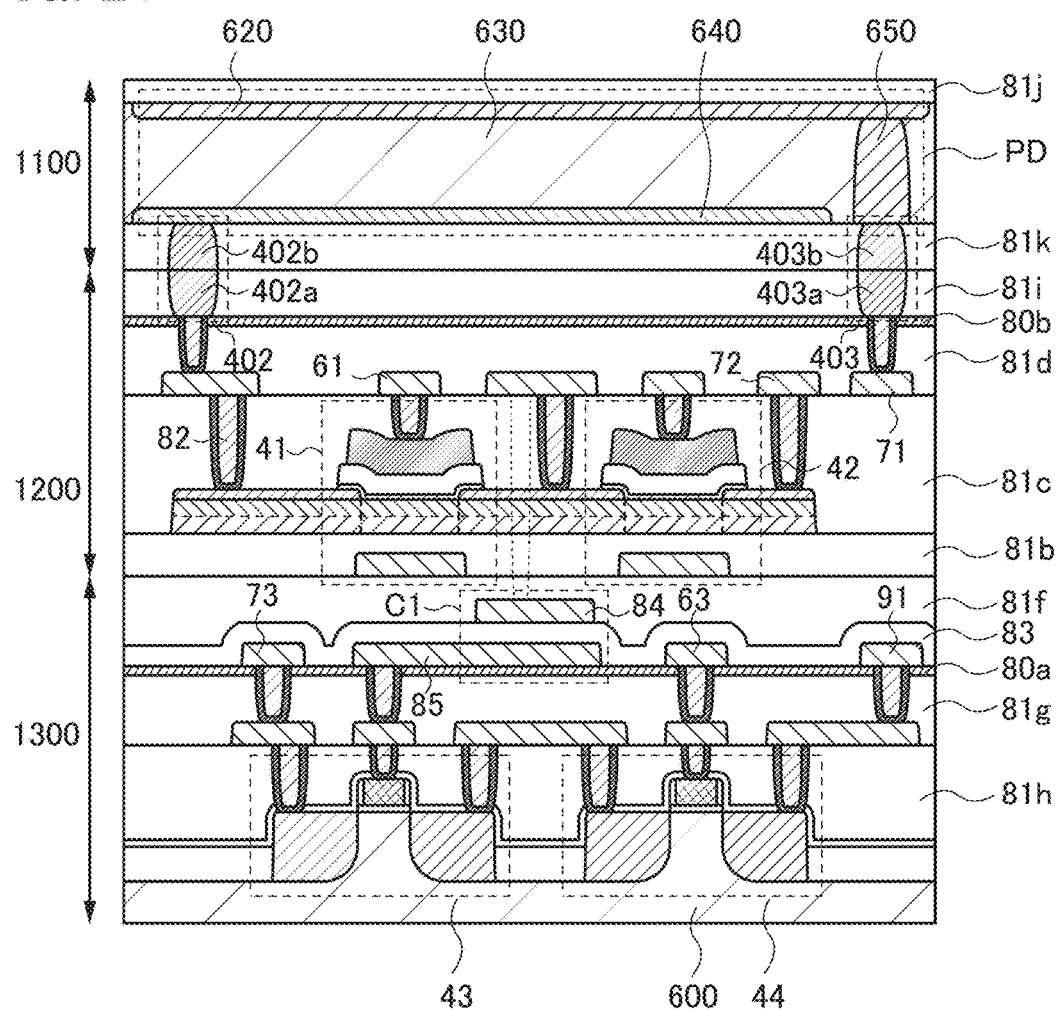
FIG. 21 A cross-sectional view illustrating a structure of an imaging device.

Furthermore, the photoelectric conversion element PD included in the layer 1100 may be a pn-type photodiode using a single crystal silicon substrate, as illustrated in FIG. 21.

In the case of using this structure, it is preferable to use a method in which the layer 1200 is formed over the layer 1300 and then, the layer 1100 formed separately is bonded thereto. In this case, an insulating layer 81i and metal layers 402a and 403a are provided in the layer 1200. Furthermore, an insulating layer 81k and metal layers 402b and 403b are provided in the layer 1100.

The metal layers 402a and 403a are provided to include a region embedded in the insulating layer 81h, and the metal layer 402a is electrically connected to one of the source or the drain of the transistor 41. Furthermore, 403a is electrically connected to the wiring 71. The metal layers 402b and 403b are provided to include a region embedded in the insulating layer 81i, and the metal layer 402b is electrically connected to the n-type region 640 of the photoelectric conversion element PD. Furthermore, 403b is electrically connected to the $p^+$ region 620 through the $p^+$ region 650.

As illustrated in FIG. 21, the metal layer 402a and the metal layer 402b are provided in a position where they are in direct contact with each other, and the metal layer 403a and the metal layer 403b are provided in a position where they are in direct contact with each other, so that a structure including connection portions 402 and 403 is provided.

Here, it is preferable that the main component of the metal layer 402a and the main component of the metal layer 402b be the same metal element. In addition, it is preferable that the main component of the metal layer 403a and the main component of the metal layer 403b be the same metal element. Furthermore, it is preferable that the insulating layer 81i and the insulating layer 81k be formed of the same component.

For the metal layers 402a, 402b, 403a, and 403b, Cu, Al, Sn, Zn, W, Ag, Pt, Au, or the like can be used, for example. Preferably, Cu, Al, W, or Au is used for easy bonding. In addition, for the insulating layer 81i and the insulating layer 81k, silicon oxide, silicon oxynitride, silicon nitride oxide, silicon nitride, titanium nitride, or the like can be used.

When the same metal material mentioned above is used for each of the metal layers 402a, 402b, 403a, and 403b and the same insulating material mentioned above is used for each of the insulating layer 81i and the insulating layer 81k, a bonding step can be performed between the layer 1100 and the layer 1200. Through the bonding step, electrical connection between the metal layer 402a and the metal layer 402b and electrical connection between the metal layer 403a and the metal layer 403b can be obtained. In addition, connection between the insulating layer 81i and the insulating layer 81k with mechanical strength can be obtained.

For bonding the metal layers to each other, a surface activated bonding method in which an oxide film, a layer adsorbing impurities, and the like are removed by sputtering or the like and the cleaned and activated surfaces are brought into contact to be bonded to each other can be used. Alternatively, a diffusion bonding method in which the surfaces of the metal layers are bonded to each other by using temperature and pressure together or the like can be used. Both methods cause bonding at an atomic level, and therefore not only electrically but also mechanically excellent bonding can be achieved.

Furthermore, for bonding the insulating layers to each other, a hydrophilic bonding method or the like can be used; in the method, after high planarity s obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be achieved.

When the layer 1100 and the layer 1200 are bonded together, the insulating layers and the metal layers coexist on their bonding surfaces; therefore, the surface activated bonding method and the hydrophilic bonding method are performed in combination, for example.

For example, the following method can be used: the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

In the bonding method, bonding is performed after the devices in the layers are completed, so that the devices can be fabricated using an optimum process for each of them. Therefore, the electrical characteristics and reliability of the transistors and the photoelectric conversion element can be improved.

Note that in the structure of FIG. 21, as a layer corresponding to the insulating layer 80, an insulating layer 80a is provided between the OS transistors and the Si transistors. Furthermore, an insulating layer 80b is provided between the OS transistors and the Si photodiode.

In the imaging device of one embodiment of the present invention, a circuit different from the pixel circuit can be provided using the Si transistors formed in the layer 1300. As the circuit, the circuit 22 to the circuit 29 are given as examples.

Figure 22:
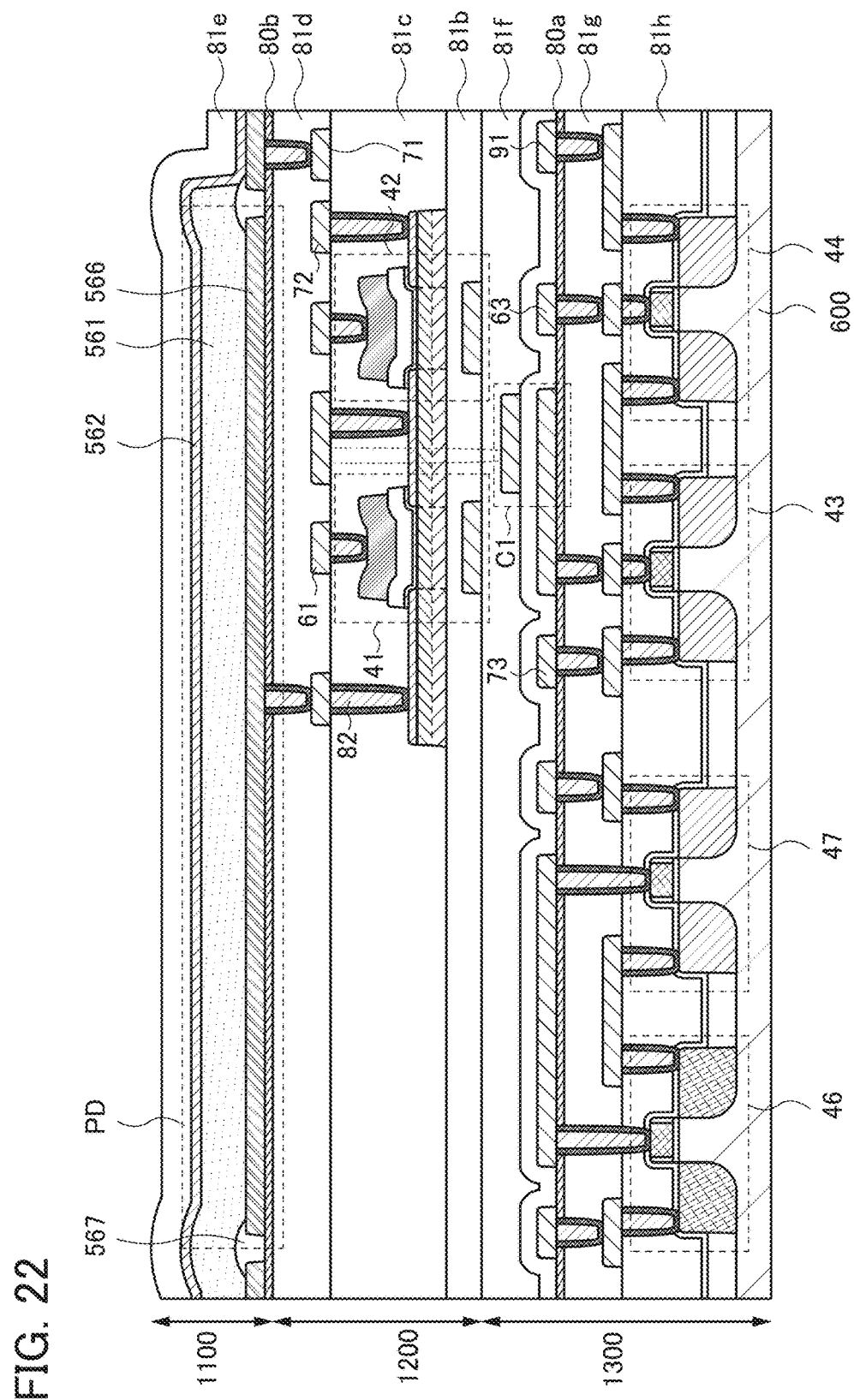
FIG. 22 A cross-sectional view illustrating a structure of an imaging device.

A transistor 546 and a transistor 547 included in any of the above circuits are illustrated in FIG. 22. The transistors 546 and 547 can be formed in a region overlapping with the photoelectric conversion element PD. That is, the above circuit is formed in a region overlapping with the pixel 20. Note that although an example of a structure with a CMOS inverter in which the transistor 46 is of the p-ch type and the transistor 47 is of the n-ch type is illustrated in FIG. 22, another circuit configuration may also be employed.

Figure 23:
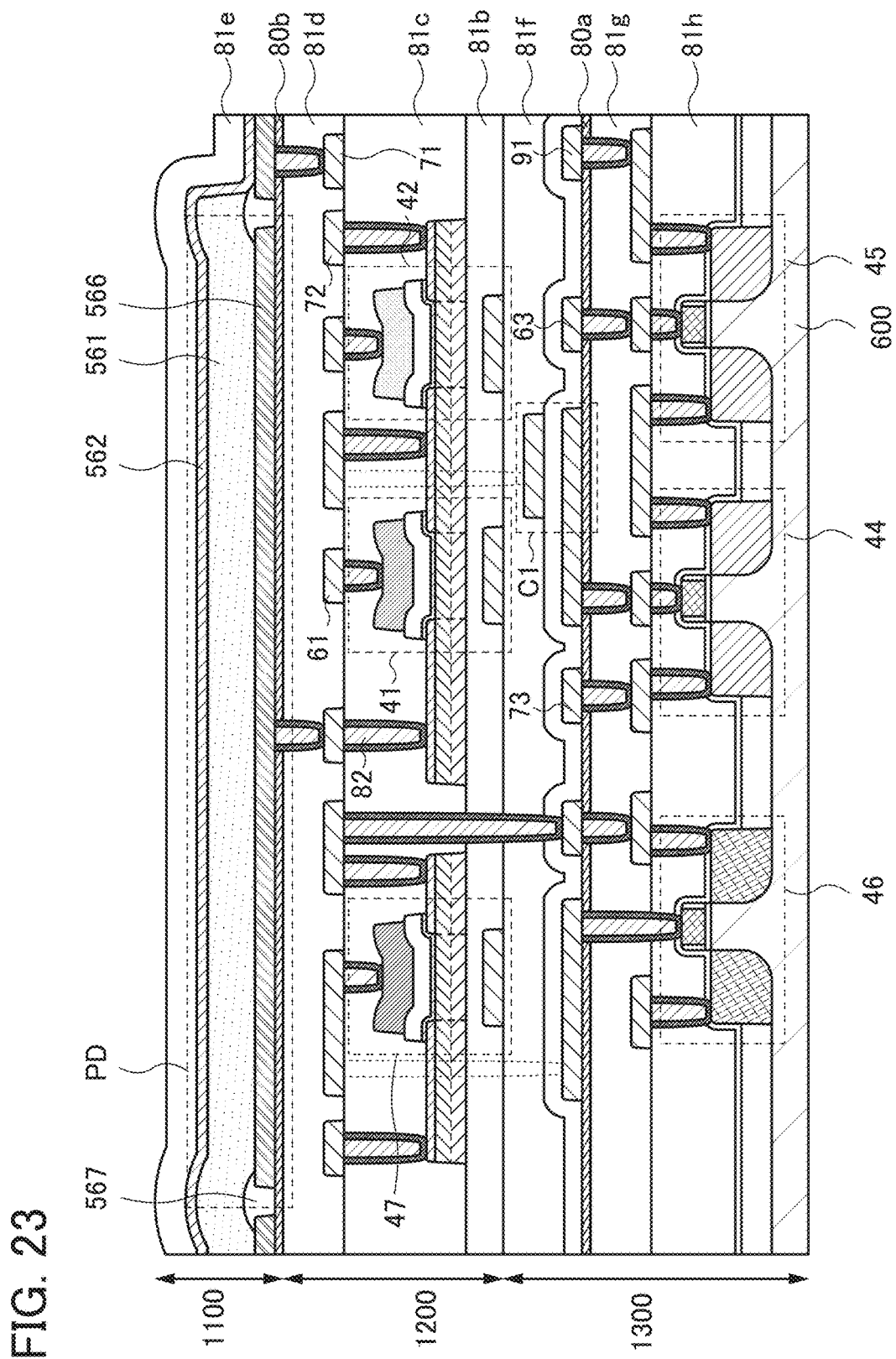
FIG. 23 A cross-sectional view illustrating a structure of an imaging device.

Furthermore, as illustrated in FIG. 23, the transistor 47 may be an OS transistor provided in the layer 1200. In the configuration illustrated in FIG. 23, the transistor 46 and the transistor 47 can be provided in regions overlapping with each other by a bonding step; thus, the area of the circuit can be reduced. In addition, in the case where the transistors 43 and 44 included in the pixel circuit are formed as p-ch type transistors, all the transistors provided over a single-crystal silicon substrate 600 can be of the p-ch type; thus, a step of forming n-ch type Si transistors can be omitted.

Figure 24:
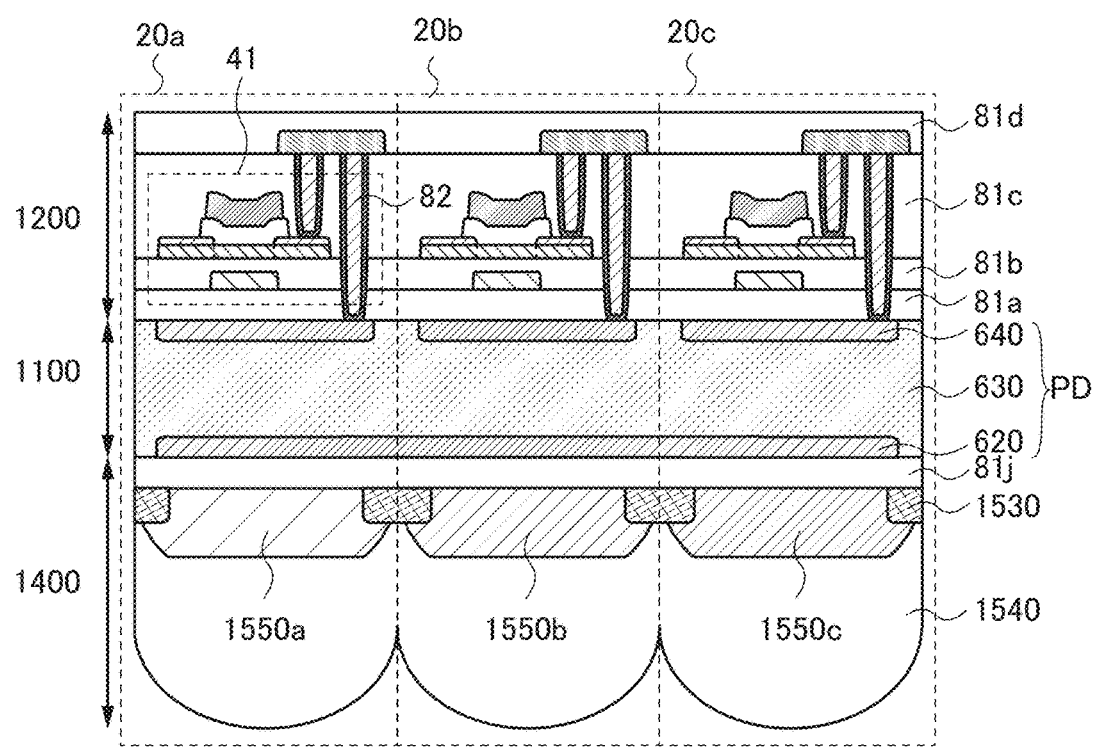
FIG. 24 A cross-sectional view illustrating a structure of an imaging device.

FIG. 24 is a cross-sectional view of a structure obtained by adding a layer 1400 to the structure illustrated in FIG. 13, and shows three pixels (pixels 20a, 20b, and 20c).

In the layer 1400, a light-blocking layer 1530, optical conversion layers 1550a, 1550b, and 1550c, a microlens array 1540, and the like can be provided.

In the layer 1400, an insulating layer 81j is formed in a region in contact with the layer 1100. As the insulating layer 81j, a silicon oxide film with a high light-transmitting property with respect to visible light can be used, for example. In addition, a structure in which a silicon nitride film is stacked as a passivation film may be employed. A structure in which a dielectric film of hafnium oxide or the like is stacked as an anti-reflection film may also be employed.

The light-blocking layer 1530 can be provided on the insulating layer 81j. The light-blocking layer 1530 is provided at a boundary between adjacent pixels and its vicinity, and has a function of blocking stray light that enters from oblique directions. For the light-blocking layer 1530, a metal layer of aluminum, tungsten, or the like, or a structure in which the metal layer and a dielectric film having a function of an anti-reflection film are stacked can be used.

The optical conversion layers 1550a, 1550b, and 1550c can be provided on the insulating layer 81 and the light-blocking layer 1530. Color images are obtained, for example, when color filters of R (red), G (green), B (blue), Y (yellow), C (cyan), M (magenta), and the like are assigned to the optical conversion layers 1550a, 1550b, and 1550c.

Note that when a filter that blocks light with a wavelength shorter than or equal to that of visible light is used as the optical conversion layer, it is possible to obtain an infrared imaging device. Furthermore, when a filter that blocks light with a wavelength shorter than or equal to that of near infrared light is used as the optical conversion layer, it is possible to obtain a far-infrared imaging device. Furthermore, when a filter that blocks light with a wavelength longer than or equal to that of visible light is used as the optical conversion layer, it is possible to obtain an ultraviolet imaging device.

Furthermore, when a scintillator is used as the optical conversion layer, it is possible to obtain an imaging device that takes an image visualizing the intensity of radiation and is used for an X-ray imaging device or the like. Radiations such as X-rays that pass through an object to enter a scintillator are converted into light (fluorescence) such as visible light or ultraviolet light owing to photoluminescence phenomenon. Then, the light is detected by the photoelectric conversion element PD, whereby image data is obtained. Moreover, the imaging device having the above structure may be used in a radiation detector or the like.

A scintillator contains a substance that, when irradiated with radiation such as X-rays or gamma rays, absorbs energy thereof to emit visible light or ultraviolet light. For example, it is possible to use a resin or ceramics in which $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, or $ZnO$ is dispersed.

The microlens array 1540 can be provided on the optical conversion layers 1550a, 1550b, and 1550c. Light that passes through lenses included in the microlens array 1540 passes the optical conversion layers 1550a, 1550b, and 1550c that are placed directly under, and the photoelectric conversion element PD is irradiated with that light.

In this embodiment, one embodiment of the present invention was described. Furthermore, in any of the other embodiments, one embodiment of the present invention is described. However, one embodiment of the present invention is not limited thereto. In other words, since various embodiments of the invention are described in this embodiment and the other embodiments, one embodiment of the present invention is not limited to a particular embodiment. Although an example in which one embodiment of the present invention is applied to an imaging device is described, for example, one embodiment of the present invention is not limited thereto. Depending on the case, or according to the circumstances, one embodiment of the present invention need not necessarily be applied to an imaging device. One embodiment of the present invention may be applied to a semiconductor device with another function, for example. Although an example in which a channel formation region, source drain regions, or the like of a transistor includes an oxide semiconductor is described as one embodiment of the present invention, for example, one embodiment of the present invention is not limited thereto. Depending on the case, or according to the circumstances, various transistors, a channel formation region of a transistor, source drain regions of a transistor, or the like in one embodiment of the present invention may include various semiconductors. Depending on the case, or according to the circumstances, various transistors, a channel formation region of a transistor, source drain regions of a transistor, or the like in one embodiment of the present invention may include, for example, at least one of silicon, germanium, silicon germanium, silicon carbide, gallium arsenide, aluminum gallium arsenide, indium phosphide, gallium nitride, or an organic semiconductor. Furthermore, for example, depending on the case, or according to the circumstances, various transistors, a channel formation region of a transistor, source drain regions of a transistor, or the like in one embodiment of the present invention need not necessarily include an oxide semiconductor. Although an example in which a global shutter system is employed is described as one embodiment of the present invention, for example, one embodiment of the present invention is not limited thereto. Depending on the case, or according to the circumstances, another system such as a rolling shutter system may be employed in one embodiment of the present invention. Furthermore, depending on the case, or according to the circumstances, the global shutter system need not necessarily be employed.

This embodiment can be implemented in an appropriate combination with any of the configurations described in the other embodiments.

(Embodiment 3)

In this embodiment, an OS transistor that can be used in one embodiment of the present invention will be described with reference to drawings. Note that in the drawings in this embodiment, some components are enlarged, reduced in size, or omitted for clarification.

FIGS. 25(A), (B), and (C) are a top view and cross-sectional views of a transistor 101 of one embodiment of the present invention. FIG. 25(A) is the top view, and a section in the direction of the dashed-dotted line X1-X2 shown in FIG. 25(A) corresponds to FIG. 25(B). In addition, a section in the direction of the dashed-dotted line Y1-Y2 shown in FIG. 25(A) corresponds to FIG. 25(C).

In drawings explained in this embodiment, the direction of the dashed-dotted line X1-X2 is referred to as channel length direction, and the direction of the dashed-dotted line Y1-Y2 is referred to as channel width direction.

The transistor 101 includes an insulating layer 120 in contact with a substrate 115, a conductive layer 173 in contact with the insulating layer 120, an oxide semiconductor layer 130 in contact with the insulating layer 120, a conductive layer 140 and a conductive layer 150 that are electrically connected to the oxide semiconductor layer 130, an insulating layer 160 in contact with the oxide semiconductor layer 130 and the conductive layers 141 and 151, and a conductive layer 170 in contact with the insulating layer 160.

In addition, over the transistor 101, an insulating layer 180 in contact with the oxide semiconductor layer 130, the conductive layer 141, the conductive layer 151, the insulating layer 160, and the conductive layer 170 may be provided as necessary.

The oxide semiconductor layer 130 can have a three-layer structure of oxide semiconductor layers 130a, 130b, and 130c, for example.

The conductive layer 140 and the conductive layer 150 can each function as a source electrode layer or a drain electrode layer, the insulating layer 160 can function as a gate insulating film, and the conductive layer 170 can function as a gate electrode layer.

Furthermore, using the conductive layer 173 as a second gate electrode layer (backgate) enables an increase in on-state current and control of the threshold voltage. Note that the conductive layer 173 can also function as a light-blocking layer.

In order to increase the on-state current, for example, the conductive layer 170 and the conductive layer 173 are made to have the same potential, and the transistor is driven as a double-gate transistor. Furthermore, in order to control the threshold voltage, a fixed potential that is different from the conductive layer 170 is supplied to the conductive layer 173.

In the oxide semiconductor layer 130, a region in contact with the conductive layer 140 and the conductive layer 150 can each function as a source region or a drain region.

Since the oxide semiconductor layer 130 is in contact with the conductive layer 140 and the conductive layer 150, oxygen vacancies are generated in the oxide semiconductor layer 130, and owing to interaction between the oxygen vacancies and hydrogen that remains in the oxide semiconductor layer 130 or diffuses into the oxide semiconductor layer 130 from the outside, the regions become low-resistance regions whose conductivity type is n-type.

Note that functions of a "source" and a "drain" of a transistor are sometimes replaced with each other when a transistor of different polarity is used or when the direction of current is changed in circuit operation, for example; therefore, the terms "source" and "drain" can be replaced with each other to be used in this specification. In addition, "electrode layer" can be rephrased as "wiring".

The conductive layer 140 and the conductive layer 150 are in contact with a top surface of the oxide semiconductor layer 130 and are not in contact with side surfaces of the oxide semiconductor layer 130. This structure makes it easier for oxygen vacancies in the oxide semiconductor layer 130 to be compensated for with oxygen included in the insulating layer 120.

Figure 26A:
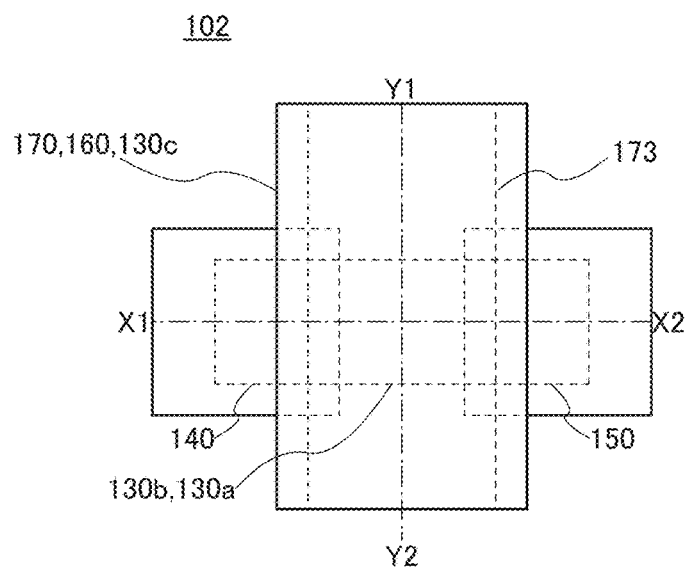
FIG. 26 A top view and cross-sectional views illustrating a transistor.
Figure 26B:
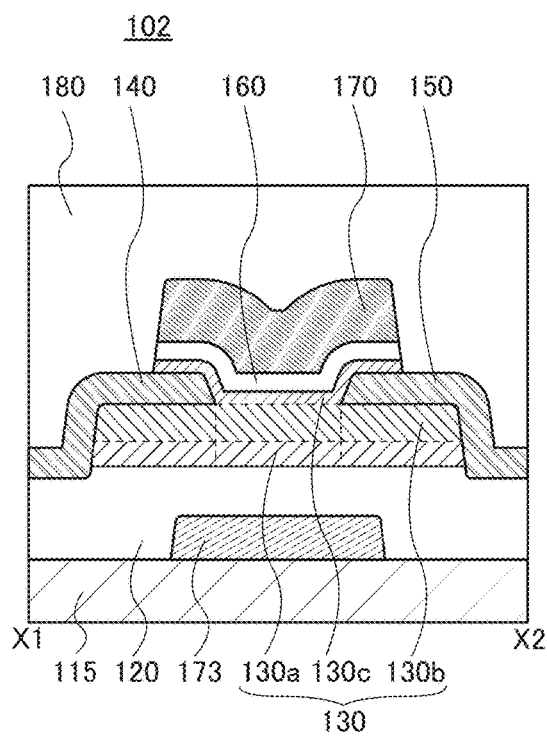
Figure 26C:
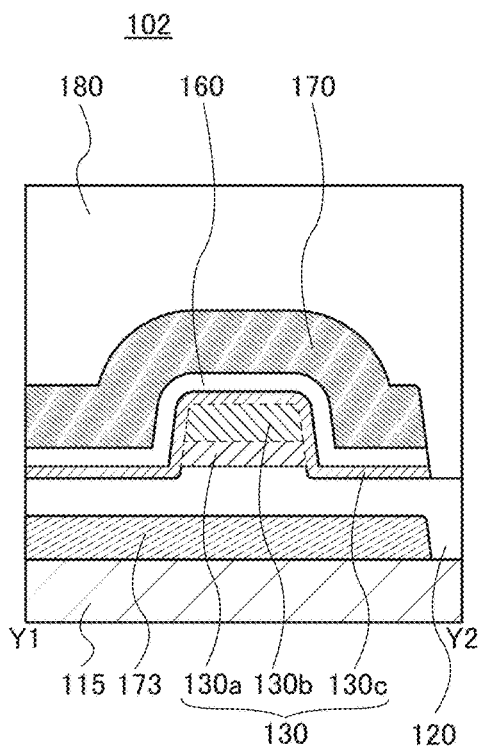

The transistor of one embodiment of the present invention may also have a structure illustrated in FIGS. 26(A), (B), and (C). FIG. 26(A) is a top view of a transistor 102, and a section in the direction of the dashed-dotted line X1-X2 shown in FIG. 26(A) corresponds to FIG. 26(B). In addition, a section in the direction of the dashed-dotted line Y1-Y2 shown in FIG. 26(A) corresponds to FIG. 26(C).

The transistor 102 has the same structure as the transistor 101 except that the conductive layer 140 and the conductive layer 150 are in contact with the insulating layer 120, and that the conductive layer 140 and the conductive layer 150 are in contact with the side surfaces of the oxide semiconductor layer 130.

Figure 27A:
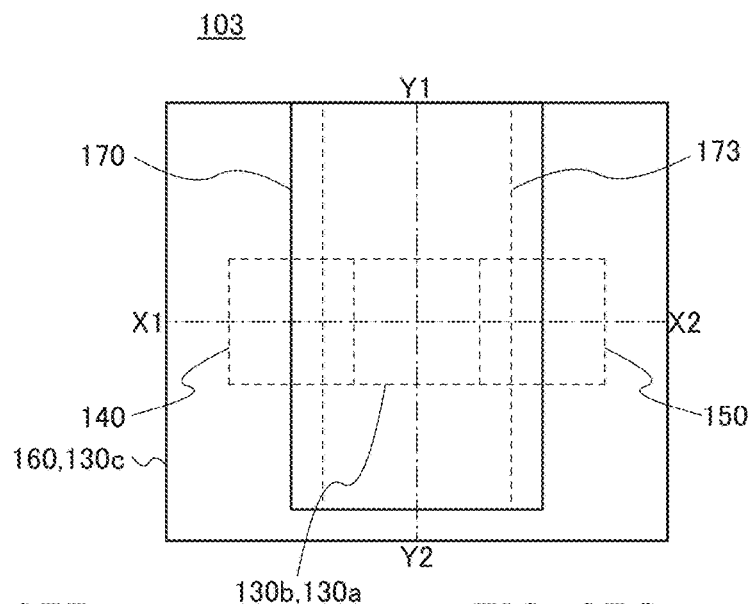
FIG. 27 A top view and cross-sectional views illustrating a transistor.
Figure 27B:
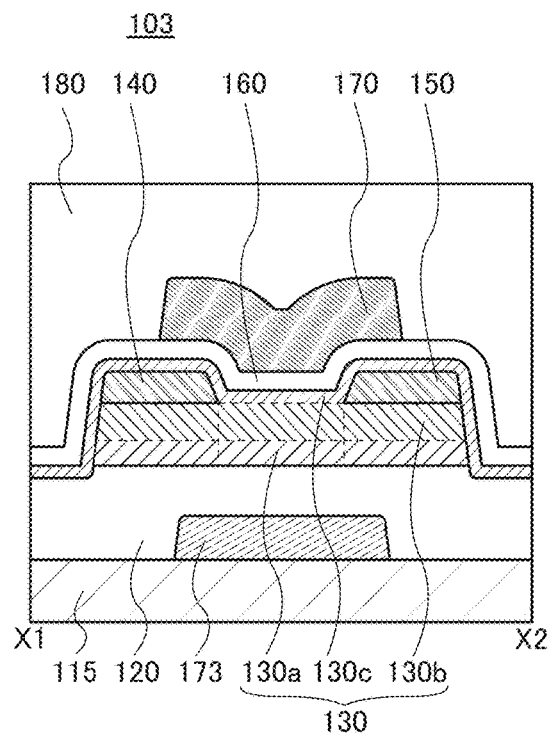
Figure 27C:
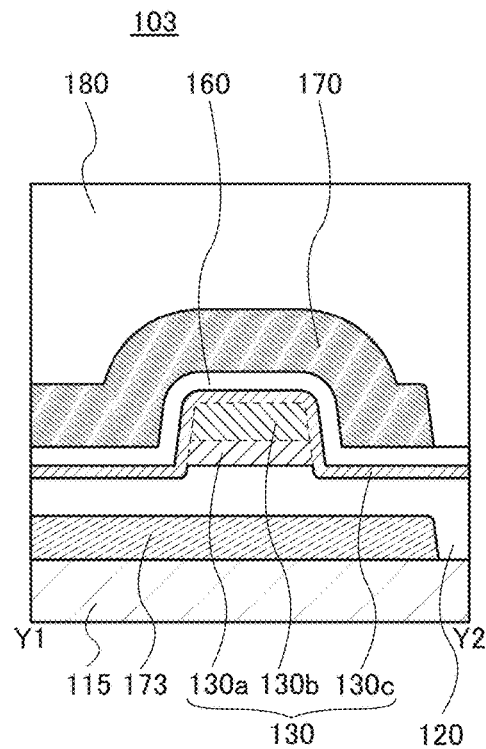

The transistor of one embodiment of the present invention may also have a structure illustrated in FIGS. 27(A), (B), and (C). FIG. 27(A) is a top view of a transistor 103, and a section in the direction of the dashed-dotted line X1-X2 shown in FIG. 27(A) corresponds to FIG. 27(B). In addition, a section in the direction of the dashed-dotted line Y1-Y2 shown in FIG. 27(A) corresponds to FIG. 27(C).

The transistor 103 has the same structure as the transistor 101 except that the oxide semiconductor layers 130a and 130b, the conductive layer 140, and the conductive layer 150 are covered with the oxide semiconductor layer 130c and the insulating layer 160.

When the oxide semiconductor layer 130c covers the oxide semiconductor layers 130a and 130b, the effect of compensation with oxygen with respect to the oxide semiconductor layers 130a and 130b and the insulating layer 120 can be enhanced. Moreover, oxidation of the conductive layer 140 and the conductive layer 150 caused by the insulating layer 180 can be suppressed owing to the oxide semiconductor layer 130c placed therebetween.

Figure 28A:
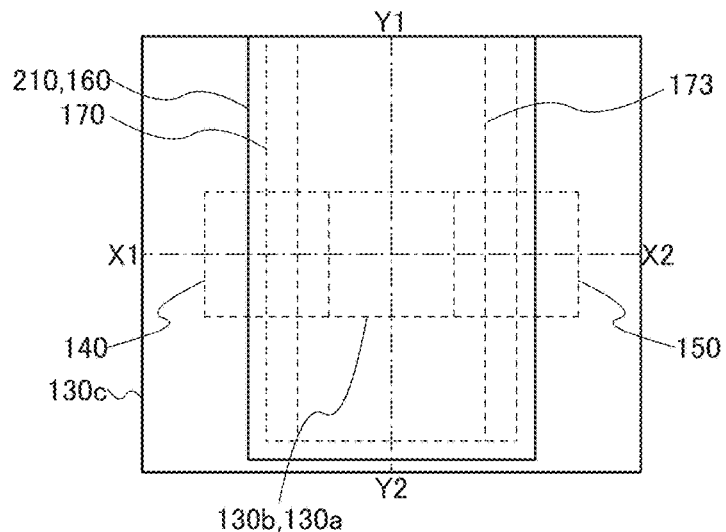
FIG. 28 A top view and cross-sectional views illustrating a transistor.
Figures 28B, 28C:
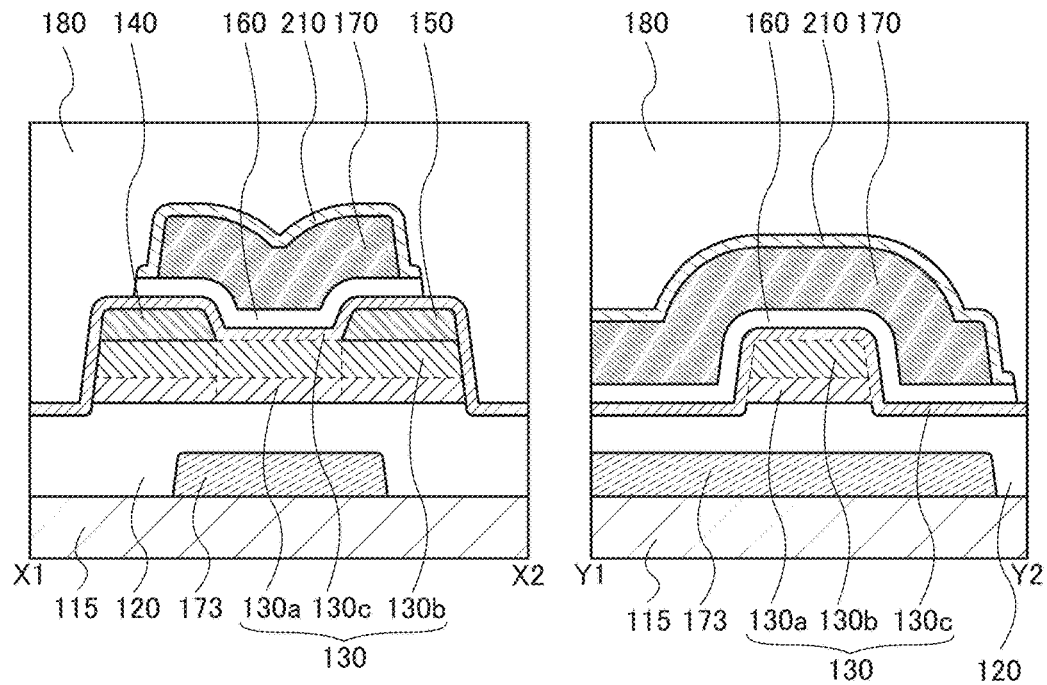

The transistor of one embodiment of the present invention may also have a structure illustrated in FIGS. 28(A), (B), and (C). FIG. 28(A) is a top view of a transistor 104, and a section in the direction of the dashed-dotted line X1-X2 shown in FIG. 28(A) corresponds to FIG. 28(B). In addition, a section in the direction of the dashed-dotted line Y1-Y2 shown in FIG. 28(A) corresponds to FIG. 28(C).

The transistor 104 has the same structure as the transistor 101 except that the oxide semiconductor layers 130a and 130b, the conductive layer 140, and the conductive layer 150 are covered with the oxide semiconductor layer 130c, and that the conductive layer 170 is covered with an insulating layer 210.

For the insulating layer 210, a material with a blocking property against oxygen can be used. For example, a metal oxide such as aluminum oxide can be used for the insulating layer 210. Oxidation of the conductive layer 170 caused by the insulating layer 180 can be suppressed owing to the insulating layer 210 placed therebetween.

The transistors 101 to 104 have a top-gate structure including regions where the conductive layer 170 overlaps with the conductive layer 140 and the conductive layer 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

Figure 29A:
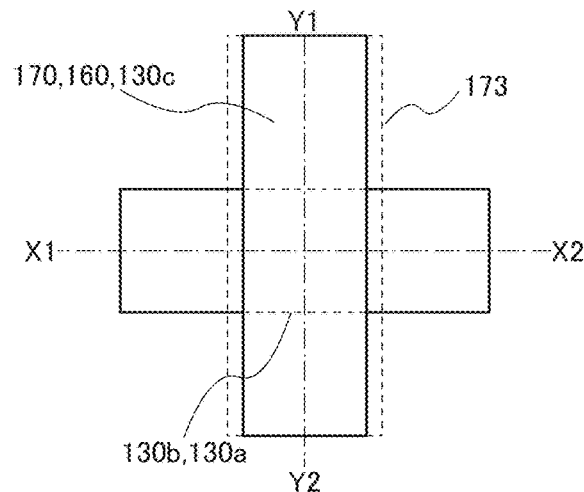
FIG. 29 A top view and cross-sectional views illustrating a transistor.
Figure 29B:
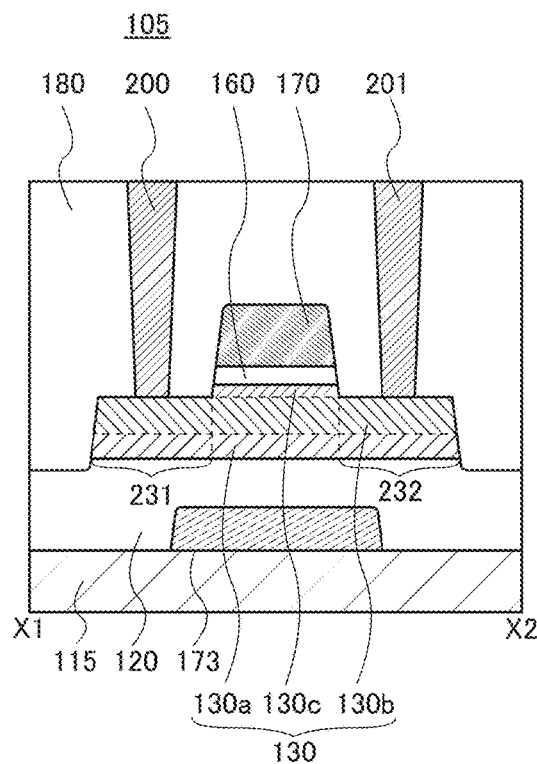
Figure 29C:
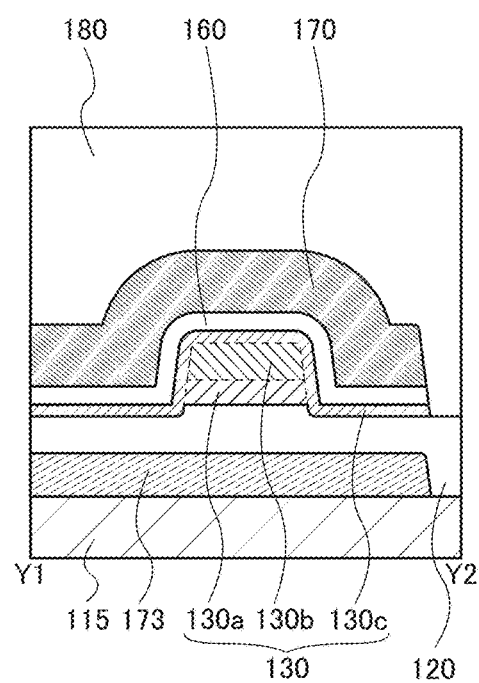

The transistor of one embodiment of the present invention may also have a structure illustrated in FIGS. 29(A), (B), and (C). FIG. 29(A) is a top view of a transistor 105, and a section in the direction of the dashed-dotted line X1-X2 shown in FIG. 29(A) corresponds to FIG. 29(B). In addition, a section in the direction of the dashed-dotted line Y1-Y2 shown in FIG. 29(A) corresponds to FIG. 29(C).

The transistor 105 includes the insulating layer 120 in contact with the substrate 115, the conductive layer 173 in contact with the insulating layer 120, the oxide semiconductor layer 130 in contact with the insulating layer 120, the insulating layer 160 in contact with the oxide semiconductor layer 130, and the conductive layer 170 in contact with the insulating layer 160.

Furthermore, in the insulating layer 180 functioning as an interlayer insulating film, a conductor 200 in contact with a region 231 of the oxide semiconductor layer 130 and a conductor 201 in contact with a region 232 of the oxide semiconductor layer 130 are provided. The conductor 200 and the conductor 201 can each function as part of the source electrode layer or part of the drain electrode layer.

An impurity for forming an oxygen vacancy to increase conductivity is preferably added to the region 231 and the region 232 in the transistor 105. As an impurity for forming an oxygen vacancy in an oxide semiconductor layer, one or more selected from the following can be used, for example: phosphorus, arsenic, antimony, boron, aluminum, silicon, nitrogen, helium, neon, argon, krypton, xenon, indium, fluorine, chlorine, titanium, zinc, and carbon. As a method for adding the impurity, a plasma treatment method, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor that has become a conductor.

The transistor 105 has a self-aligned structure that does not include a region where the conductive layer 170 overlaps with the conductive layer 140 and the conductive layer 150. A transistor with a self-aligned structure has significantly low parasitic capacitance between a gate electrode layer and source and drain electrode layers and thus is suitable for applications that require high-speed operation.

The transistor of one embodiment of the present invention may also have a structure illustrated in FIGS. 30(A), (B), and (C). FIG. 30(A) is a top view of a transistor 106, and a section in the direction of the dashed-dotted line X1-X2 shown in FIG. 30(A) corresponds to FIG. 30(B). In addition, a section in the direction of the dashed-dotted line Y1-Y2 shown in FIG. 30(A) corresponds to FIG. 30(C).

The transistor 106 includes the substrate 115, the insulating layer 120 over the substrate 115, the conductive layer 173 in contact with the insulating layer 120, the oxide semiconductor layer 130 (the oxide semiconductor layer 130a, the oxide semiconductor layer 130b, and the oxide semiconductor layer 130c) over the insulating layer 120, the conductive layer 140 and the conductive layer 150 that are placed with a space therebetween and are in contact with the oxide semiconductor layer 130, the insulating layer 160 in contact with the oxide semiconductor layer 130c, and the conductive layer 170 in contact with the insulating layer 160.

Note that the oxide semiconductor layer 130, the insulating layer 160, and the conductive layer 170 are provided in an opening that is provided in the insulating layer 180 over the transistor 106 and reaches the oxide semiconductor layer 130a, the oxide semiconductor layer 130b, and the insulating layer 120.

Figure 31A:
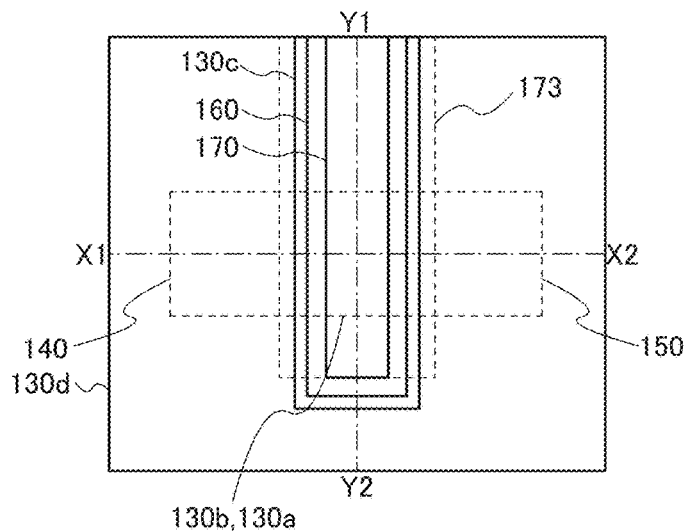
FIG. 31 A top view and cross-sectional views illustrating a transistor.
Figure 31B:
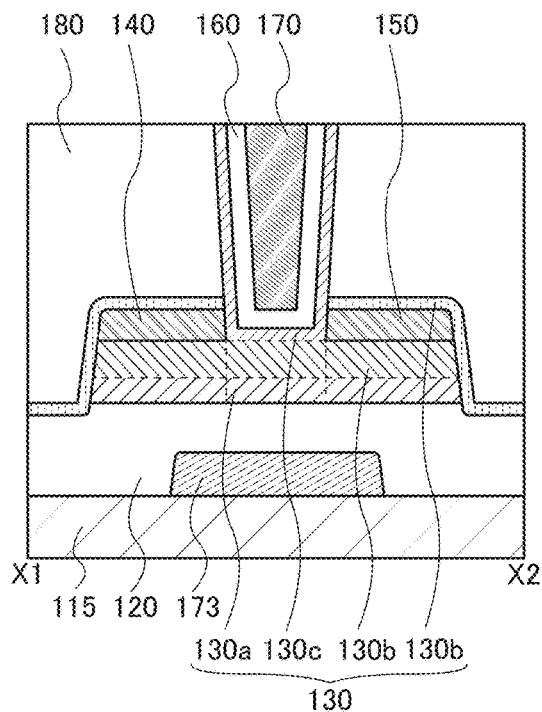
Figure 31C:
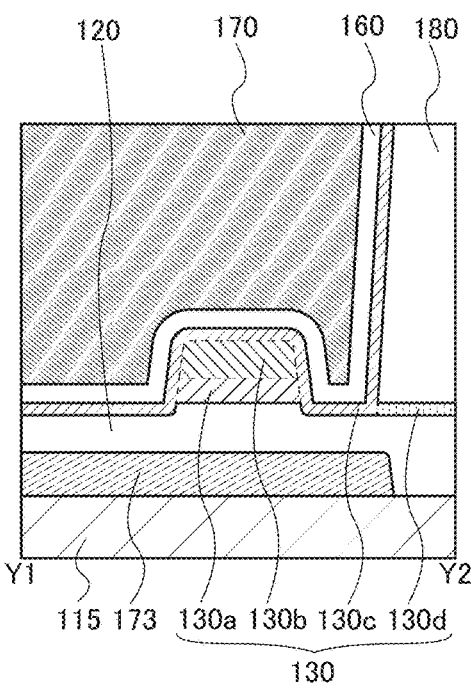

The transistor of one embodiment of the present invention may also have a structure illustrated in FIGS. 31(A), (B), and (C). FIG. 31(A) is a top view of a transistor 107, and a section in the direction of the dashed-dotted line X1-X2 shown in FIG. 31(A) corresponds to FIG. 31(B). In addition, a section in the direction of the dashed-dotted line Y1-Y2 shown in FIG. 31(A) corresponds to FIG. 31(C).

The transistor 107 has the same structure as the transistor 106 except that the oxide semiconductor layers 130a and 130b, the conductive layer 140, and the conductive layer 150 are covered with the oxide semiconductor layer 130c and an oxide semiconductor layer 130d. The oxide semiconductor layer 130d can be formed of the same material as the oxide semiconductor layer 130c.

When the oxide semiconductor layers 130c and 130d cover the oxide semiconductor layers 130a and 130b, the effect of compensation with oxygen with respect to the oxide semiconductor layers 130a and 130b and the insulating layer 120 can be enhanced. Moreover, oxidation of the conductive layer 140 and the conductive layer 150 by the insulating layer 180 can be suppressed owing to the oxide semiconductor layer 130d placed therebetween.

The structures of the transistors 106 and 107 each have a smaller region in which the conductor to be a source or a drain overlaps with the conductor to be a gate electrode, and thus can reduce parasitic capacitance. Consequently, the transistors 106 and 107 are suitable for components of a circuit that requires high-speed operation.

Figure 32A:
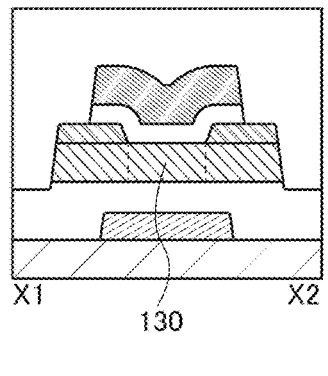
FIG. 32 Top views and cross-sectional views illustrating transistors.
Figure 32B:
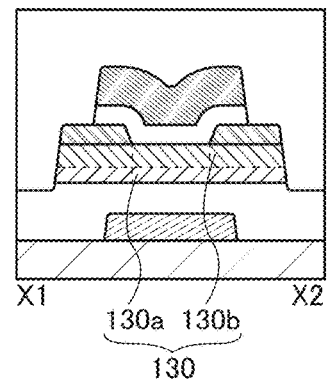

In the transistor of one embodiment of the present invention, the oxide semiconductor layer 130 may be formed as a single layer as illustrated in FIG. 32(A). Furthermore, the oxide semiconductor layer 130 may be formed of two layers as illustrated in FIG. 32(B).

Figure 32C:
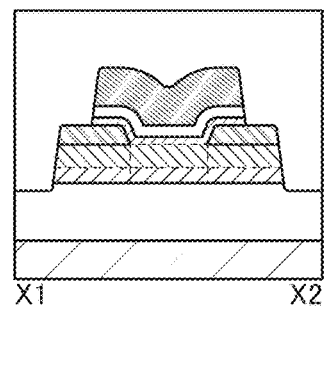

Furthermore, the transistor of one embodiment of the present invention may have a structure without the conductive layer 173, as illustrated in FIG. 32(C).

Figure 32D:
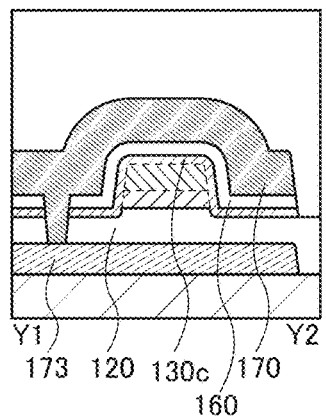

Furthermore, to electrically connect the conductive layer 170 to the conductive layer 173 in the transistor of one embodiment of the present invention, for example, an opening is formed in the insulating layer 120, the oxide semiconductor layer 130c, and the insulating layer 160 to reach the conductive layer 173, and the conductive layer 170 is formed to cover the opening, as illustrated in FIG. 32(D).

Figure 32E:
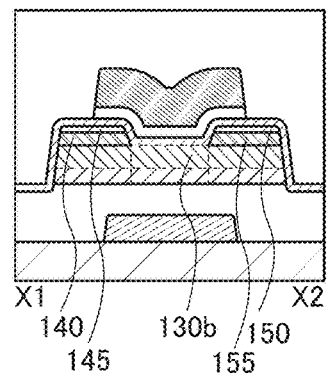

Furthermore, the transistor of one embodiment of the present invention may be provided with an insulating layer 145 and an insulating layer 155 that are in contact with the conductive layer 140 and the conductive layer 150, respectively, as illustrated in FIG. 32(E). The insulating layer 145 and the insulating layer 155 can prevent oxidation of the conductive layer 140 and the conductive layer 150.

For the insulating layer 145 and the insulating layer 155, a material with a blocking property against oxygen can be used. For example, a metal oxide such as aluminum oxide can be used for the insulating layer 145 and the insulating layer 155.

Figure 32F:
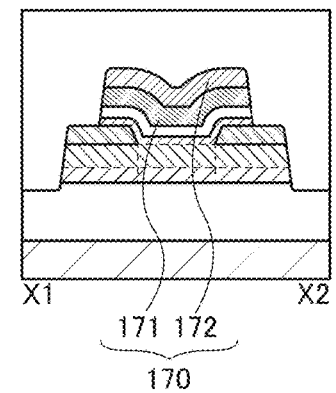

Furthermore, in the transistor of one embodiment of the present invention, the conductive layer 170 may be formed of a stack of a conductive layer 171 and a conductive layer 172, as illustrated in FIG. 32(F).

Figure 32G:
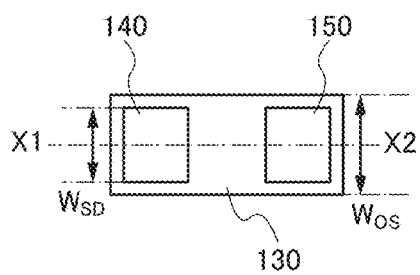
Figure 32H:
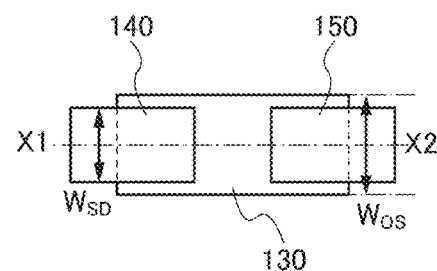

Furthermore, in the transistor of one embodiment of the present invention, in which the conductive layers 140 and 150 are provided over the oxide semiconductor layer 130, the width ($W_{SD}$) of the conductive layer 140 and the conductive layer 150 may be smaller than the width ($W_{OS}$) of the oxide semiconductor layer 130 as in top views shown in FIGS. 32(G) and (H) (that only show the oxide semiconductor layer 130, the conductive layer 140, and the conductive layer 150). When $W_{OS} \geq W_{SD}$ is satisfied ($W_{SD}$ is smaller than or equal to $W_{OS}$), a gate electric field is easily applied to the entire channel formation region, so that electrical characteristics of the transistor can be improved.

Note that although FIGS. 32(A) to (F) illustrate modified examples of the transistor 101, the modified examples can also be applied to the other transistors described in this embodiment.

In the transistor of one embodiment of the present invention with any of the above structures, the conductive layer 170 (and the conductive layer 173) that is a gate electrode layer electrically surrounds the oxide semiconductor layer 130 in the channel width direction with the insulating layer therebetween. Such a structure can increase the on-state current and is referred to as a surrounded channel (s-channel) structure.

In the transistor including the oxide semiconductor layer 130a and the oxide semiconductor layer 130b, and the transistor including the oxide semiconductor layer 130a, the oxide semiconductor layer 130b, and the oxide semiconductor layer 130c, appropriately selecting materials for the two or three layers that constitute the oxide semiconductor layer 130 allows current to flow in the oxide semiconductor layer 130b. When current flows through the oxide semiconductor layer 130b, there is little influence of interface scattering, and a high on-state current can be obtained.

By using the transistor with any of the above structures, a semiconductor device can have favorable electrical characteristics.

The structure described in this embodiment can be used in appropriate combination with the structure described in any of the other embodiments.

(Embodiment 4)

In this embodiment, components of the transistors shown in Embodiment 2 will be described in detail.

As the substrate 115, a glass substrate, a quartz substrate, a semiconductor substrate, a ceramic substrate, a metal substrate the surface of which is insulated, or the like can be used. Alternatively, a silicon substrate on which a transistor or a photodiode is formed, and the one in which an insulating layer, a wiring, a conductor functioning as a contact plug, or the like is formed over the silicon substrate can be used. Note that when a p-ch type transistor is formed on a silicon substrate, a silicon substrate with $n^-$-type conductivity is preferably used. Alternatively, an SOI substrate including an $n^-$-type or i-type silicon layer may be used. Moreover, when a transistor that is formed on a silicon substrate is of the p-ch type, a surface of the silicon substrate where the transistor is formed preferably has a (110) plane orientation. When a p-ch type transistor is formed on a (110) plane, the mobility can be increased.

The insulating layer 120 can play a role in supplying oxygen to the oxide semiconductor layer 130 as well as having a role in preventing diffusion of impurities from a component of the substrate 115. For this reason, the insulating layer 120 preferably is an insulating film containing oxygen and more preferably is an insulating film containing oxygen more than that in the stoichiometric composition. For example, a film is used in which the amount of released oxygen when converted into oxygen atoms is greater than or equal to $1.0 \times 10^{19}$ atoms; $cm^3$ in TDS analysis in which heat treatment is performed such that the film surface temperature ranges from 100° C. to 700° C. inclusive, preferably from 100° C. to 500° C. inclusive. Furthermore, when the substrate 115 is a substrate provided with another device, the insulating layer 120 also has a function of an interlayer insulating film. In that case, planarization treatment is preferably performed by a CMP method or the like so as to obtain a flat surface.

As the conductive layer 173 functioning as a backgate electrode layer, a conductive film of Al, Ti, Cr, Co, Ni, Cu, Y, Zr, Mo, Ru, Ag, Mn, Nd, Sc, Ta, W, or the like can be used, for example. It is also possible to use alloys of the above materials or conductive nitrides of the above materials. It is also possible to use a stack including a plurality of materials selected from the above materials, alloys of the above materials, and conductive nitrides of the above materials.

For the insulating layer 120, an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these can be used, for example. It is also possible to use the a stack of any of the above materials.

The oxide semiconductor layer 130 can have a three-layer structure in which the oxide semiconductor layer 130a, the oxide semiconductor layer 130b, and the oxide semiconductor layer 130c are stacked in this order from the insulating layer 120 side.

Note that when the oxide semiconductor layer 130 is a single layer, a layer corresponding to the oxide semiconductor layer 130b described in this embodiment is used.

In the case where the oxide semiconductor layer 130 includes two layers, a stack in which a layer corresponding to the oxide semiconductor layer 130a and a layer corresponding to the oxide semiconductor layer 130b are stacked in this order from the insulating layer 120 side is used. In the case of this structure, the oxide semiconductor layer 130a and the oxide semiconductor layer 130b can be interchanged.

For the oxide semiconductor layer 130b, an oxide semiconductor whose electron affinity (energy from the vacuum level to the conduction band minimum) is higher than those of the oxide semiconductor layer 130a and the oxide semiconductor layer 130c is used, for example.

With such a structure, when a voltage is applied to the conductive layer 170, a channel is formed in the oxide semiconductor layer 130b whose energy at the conduction band minimum is the lowest in the oxide semiconductor layer 130. Therefore, the oxide semiconductor layer 130b can be regarded as having a region functioning as a semiconductor, while the oxide semiconductor layer 130a and the oxide semiconductor layer 130c can be regarded as having a region functioning as an insulator or a semi-insulator.

An oxide semiconductor that can be used for the oxide semiconductor layer 130a, the oxide semiconductor layer 130b, and the oxide semiconductor layer 130c preferably contains at least In or Zn. Alternatively, both In and Zn are preferably contained. Moreover, in addition to them, a stabilizer such as Al, Ga, Y, or Sn is preferably contained in order to reduce variations in electrical characteristics of transistors using the oxide semiconductor.

For the oxide semiconductor layer 130a and the oxide semiconductor layer 130c, an In—Ga—Zn oxide or the like with In:Ga:Zn=1:3:2, 1:3:3, 1:3:4, 1:3:6, 1:4:5, 1:6:4, or 1:9:6 (atomic ratio) or its neighboring atomic ratio can be used, for example. Furthermore, for the oxide semiconductor layer 130b, an In—Ga—Zn oxide or the like with In:Ga:Zn=1:1:1, 2:1:3, 5:5:6, 3:1:2, 3:1:4, 5:1:6, or 4:2:3 (atomic ratio) or its neighboring atomic ratio can be used.

The oxide semiconductor layer 130a, the oxide semiconductor layer 130b, and the oxide semiconductor layer 130c may include crystal parts. For example, when crystals with c-axis alignment are used, the transistor can have stable electrical characteristics. Moreover, crystals with c-axis alignment are resistant to bending, and thus can improve the reliability of a semiconductor device using a flexible substrate.

For the conductive layer 140 functioning as a source electrode layer and the conductive layer 150 functioning as a drain electrode layer, a single layer or a stacked layer using a material selected from Al, Cr, Cu, Ta, Ti, Mo, W, Ni, Mn, Nd, and Sc and alloys or conductive nitrides of the metal materials can be used, for example. Note that the use of tantalum nitride, which is a conductive nitride, can prevent oxidation. It is also possible to use a stack of any of the above materials and low-resistance Cu or an alloy such as Cu—Mn.

The above materials have the property of extracting oxygen from an oxide semiconductor film. Thus, in part of a region of the oxide semiconductor film that is in contact with any of the above materials, oxygen is released from the oxide semiconductor layer and an oxygen vacancy is formed. When hydrogen slightly contained in the film and the oxygen vacancy are bonded to each other, the region considerably changes into an n-type region. Accordingly, the n-type region can function as a source or a drain of a transistor.

For the insulating layer 160 functioning as a gate insulating film, an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. Furthermore, the insulating layer 160 may be a stack including any of the above materials.

Furthermore, for the insulating layer 120 and the insulating layer 160 in contact with the oxide semiconductor layer 130, a film that releases a smaller amount of nitrogen oxide is preferably used. When an oxide semiconductor is in contact with an insulating layer that releases a large amount of nitrogen oxide, the density of states caused by nitrogen oxide becomes high in some cases.

By using the above insulating film for the insulating layer 120 and the insulating layer 160, a shift in the threshold voltage of the transistor can be reduced, and fluctuations in the electrical characteristics of the transistor can be reduced.

As the conductive layer 170 functioning as a gate electrode layer, a conductive film of Al, Ti, Cr, Co, Ni, Cu, Y, Zr, Mo, Ru, Ag, Mn, Nd, Sc, Ta, W, or the like can be used, for example. It is also possible to use alloys of the above materials or conductive nitrides of the above materials. It is also possible to use a stack including a plurality of materials selected from the above materials, alloys of the above materials, and conductive nitrides of the above materials. Typically, tungsten, a stack of tungsten and titanium nitride, a stack of tungsten and tantalum nitride, or the like can be used. Low-resistance Cu or an alloy such as Cu—Mn, or a stack of any of the above materials and Cu or an alloy such as Cu—Mn may also be used. For example, titanium nitride can be used for the conductive layer 171 and tungsten can be used for the conductive layer 172 to form the conductive layer 170.

Also, an oxide conductive layer of an In—Ga—Zn oxide, zinc oxide, indium oxide, tin oxide, indium tin oxide, or the like may be used as the conductive layer 170. When the oxide conductive layer is provided so as to be in contact with the insulating layer 160, oxygen can be supplied from the oxide conductive layer to the oxide semiconductor layer 130.

For the insulating layer 180, an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. Furthermore, the insulating layer 180 may be a stack including any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. Thus, stable electrical characteristics of the transistor can be obtained.

Furthermore, a film having an effect of blocking impurities is preferably provided over the transistor or the insulating layer 180. As the blocking film, a silicon nitride film, an aluminum nitride film, an aluminum oxide film, or the like can be used.

A nitride insulating film has a function of blocking moisture and the like and thus can improve the reliability of the transistor. Furthermore, an aluminum oxide film has a high blocking effect that prevents both oxygen and impurities such as hydrogen and moisture from penetrating the film. Accordingly, the aluminum oxide film is suitable as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120, during and after the manufacturing process of the transistor.

High integration of a semiconductor device requires transistor miniaturization. Meanwhile, transistor miniaturization tends to cause deterioration of electrical characteristics of the transistor; a decrease in channel width causes a reduction in on-state current, for example.

The transistor of one embodiment of the present invention can have a structure in which the oxide semiconductor layer 130b where the channel is formed is covered with the oxide semiconductor layer 130c. With this structure, a channel formation layer is not in contact with the gate insulating film; thus, scattering of carriers caused at the interface between the channel formation layer and the gate insulating film can be inhibited, and the on-state current of the transistor can be increased.

In the transistor of one embodiment of the present invention, as described above, the gate electrode layer (the conductive layer 170) is formed to electrically surround the oxide semiconductor layer 130 in the channel width direction; thus, a gate electric field is applied to the oxide semiconductor layer 130 in a direction perpendicular to its side surface in addition to a direction perpendicular to its top surface. In other words, a gate electric field is applied to the channel formation layer entirely and an effective channel width is increased, leading to a further increase in the on-state current.

Although the variety of films such as the metal films, the semiconductor films, and the inorganic insulating films described in this embodiment can be formed typically by a sputtering method or a plasma-enhanced CVD method, such films may be formed by another method, e.g., a thermal CVD method. As examples of a thermal CVD method, an MOCVD (metal organic chemical vapor deposition) method, an ALD (atomic layer deposition) method, and the like are given.

A thermal CVD method, which is a deposition method not using plasma, has an advantage that no defect due to plasma damage is generated.

Moreover, deposition by a thermal CVD method may be performed in such a manner that a source gas and an oxidizer are supplied to a chamber at a time, the inside of the chamber is set to an atmospheric pressure or a reduced pressure, and reaction is caused in the vicinity of the substrate or over the substrate so as to deposit a film over the substrate.

In an ALD method, the inside of a chamber is set to an atmospheric pressure or a reduced pressure, source gases for reaction are introduced into the chamber and reacted, and this is repeated so as to form a film. An inert gas (argon, nitrogen, or the like) may be introduced as a carrier gas together with the source gases. For example, two or more kinds of source gases may be sequentially supplied to the chamber. In that case, after reaction of a first source gas, an inert gas is introduced, and then a second source gas is introduced so that the source gases of different kinds are not mixed. Alternatively, the first source gas may be exhausted by vacuum evacuation instead of introduction of an inert gas, and then the second source gas may be introduced. The first source gas is adsorbed on the surface of the substrate and reacted to form a first layer, and the second source gas introduced subsequently is adsorbed and reacted, whereby a second layer is stacked over the first layer and a thin film is formed. The sequence of the gas introduction is controlled and repeated more than once until a desired thickness is obtained, whereby a thin film with excellent step coverage can be formed. The thickness of the thin film can be adjusted by the number of repetitions of gas introduction; therefore, an ALD method makes it possible to accurately adjust a film thickness and thus is suitable for a case of manufacturing a minute FET.

Furthermore, a facing-target-type sputtering apparatus can be used to form the oxide semiconductor layer. A deposition method using the facing-target-type sputtering apparatus can be referred to as VDSP (vapor deposition SP).

When the oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables deposition under low pressure; accordingly, the concentration of impurities (e.g., hydrogen, a rare gas (such as argon), water, and the like) in the deposited oxide semiconductor layer can be lowered.

The structure described in this embodiment can be used in appropriate combination with the structure described in any of the other embodiments.

(Embodiment 5)

In this embodiment, the material of an oxide semiconductor that can be used for one embodiment of the present invention will be described.

An oxide semiconductor preferably contains at least indium or zinc. In particular, indium and zinc are preferably contained. In addition to them, aluminum, gallium, yttrium, tin, or the like is preferably contained as an element M. Furthermore, one or more kinds selected from boron, silicon, titanium, iron, nickel, germanium, zirconium, molybdenum, lanthanum, cerium, neodymium, hafnium, tantalum, tungsten, magnesium, or the like may be contained as an element M.

Here, the case where an oxide semiconductor contains indium, an element M, and zinc is considered.

First, preferred ranges of atomic ratios of indium, the element M, and zinc contained in an oxide semiconductor according to the present invention are described with reference to FIG. 33(A), FIG. 33(B), and FIG. 33(C). Note that the proportion of oxygen atoms is not shown. The terms of the atomic ratio of indium, the element M, and zinc contained in the oxide semiconductor are denoted by [In], [M], and [Zn], respectively.

Figure 33A:
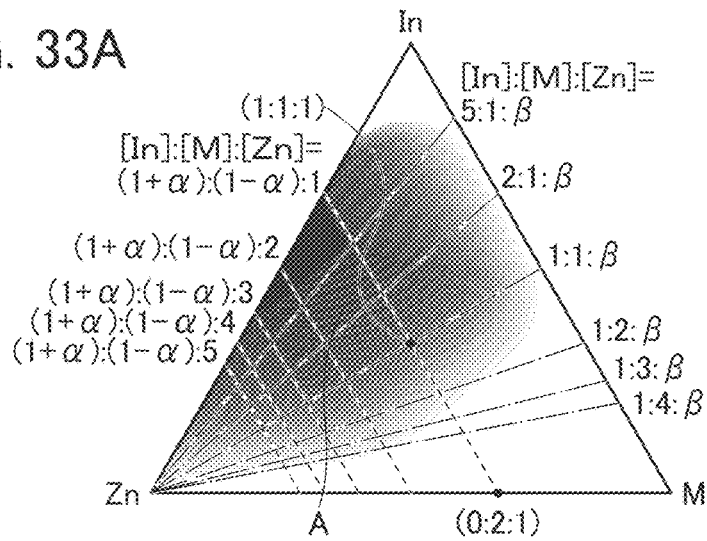
FIG. 33 Drawings showing the ranges of atomic ratios of oxide semiconductors.
Figure 33B:
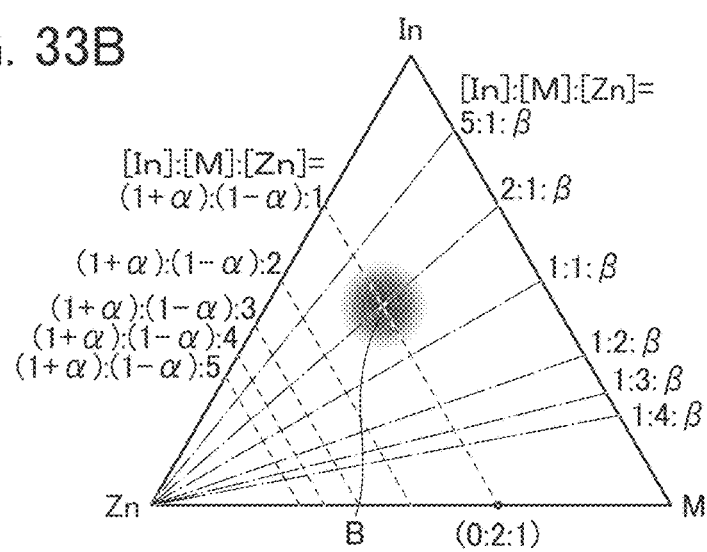
Figure 33C:
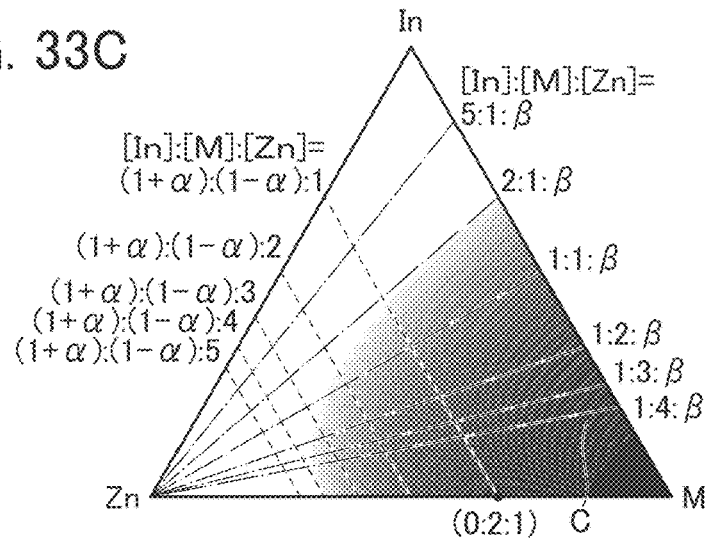

In FIG. 33(A), FIG. 33(B), and FIG. 33(C), broken lines indicate a line where the atomic ratio is $[In]:[M]:[Zn]=(1+\alpha):(1-\alpha):1$ (where $-1\leq\alpha\leq1$), a line where the atomic ratio is $[In]:[M]:[Zn]=(1+\alpha):(1-\alpha):2$, a line where the atomic ratio is $[In]:[M]:[Zn]=(1+\alpha):(1-\alpha):3$, a line where the atomic ratio is $[In]:[M]:[Zn]=(1+\alpha):(1-\alpha):4$, and a line where the atomic ratio is $[In]:[M]:[Zn]=(1+\alpha):(1-\alpha):5$.

Furthermore, dashed-dotted lines indicate a line where the atomic ratio is $[In]:[M]:[Zn]=1:1:\beta$ (where $\beta\geq0$), a line where the atomic ratio is $[In]:[M]:[Zn]=1:2:\beta$, a line where the atomic ratio is $[In]:[M]:[Zn]=1:3:\beta$, a line where the atomic ratio is $[In]:[M]:[Zn]=1:4:\beta$, a line where the atomic ratio is $[In]:[M]:[Zn]=2:1:\beta$, and a line where the atomic ratio is $[In]:[M]:[Zn]=5:1:\beta$.

Furthermore, the oxide semiconductor with the atomic ratio $[In]:[M]:[Zn]=0:2:1$ or a value in the neighborhood thereof in FIG. 33 tends to have a spinel crystal structure.

FIG. 32(A) and FIG. 32(B) illustrate examples of the preferred ranges of atomic ratios of indium, the element M, and zinc contained in an oxide semiconductor of one embodiment of the present invention.

Figure 34:
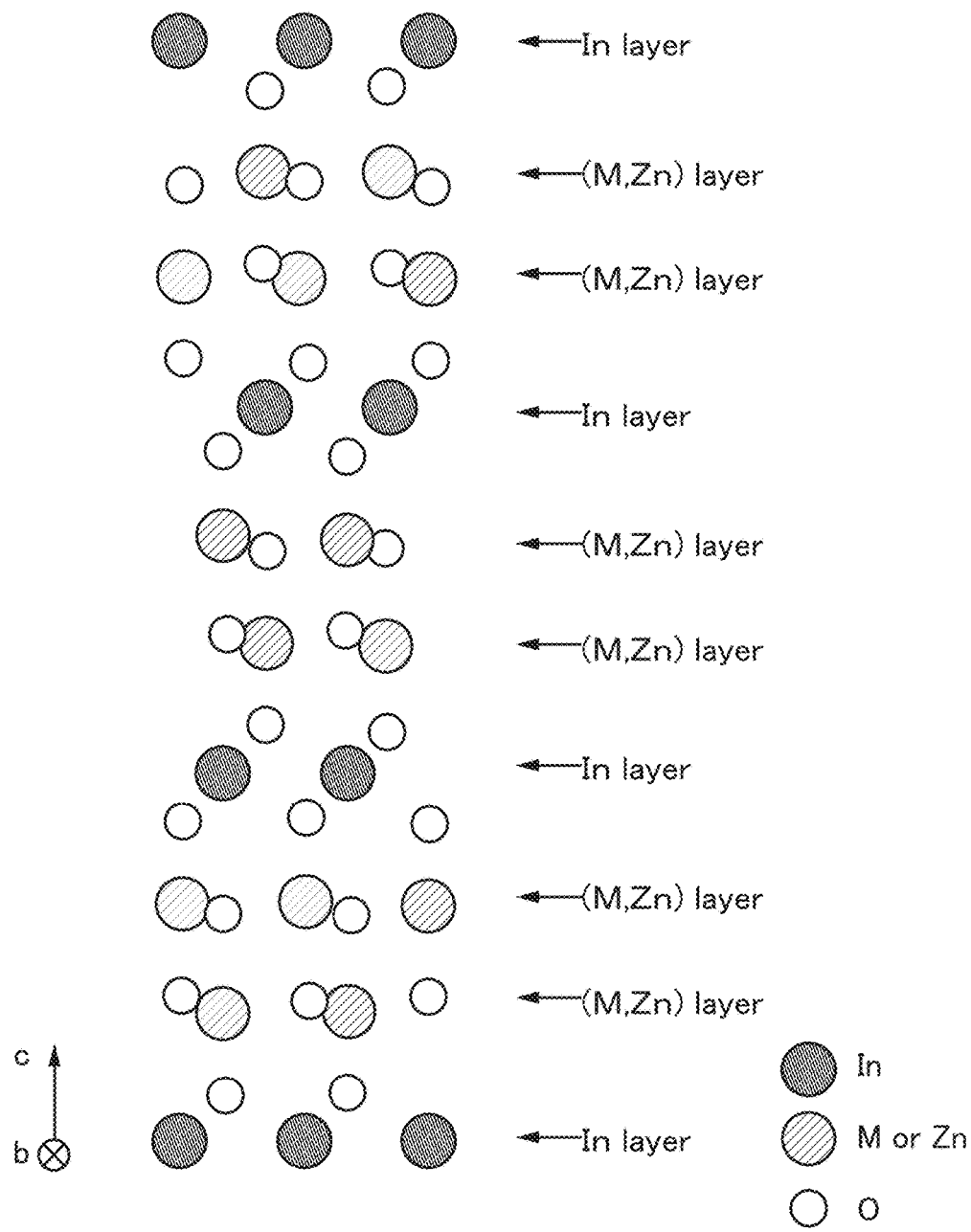
FIG. 34 A drawing illustrating a crystal of $InMZnO_4$.

As an example, FIG. 34 illustrates the crystal structure of $InMZnO_4$ with $[In]:[M]:[Zn]=1:1:1$. Furthermore, FIG. 34 is the crystal structure of $InMZnO_4$ in the case observed from a direction parallel to the b-axis. Note that a metal element in a layer that contains M, Zn, and oxygen (hereinafter, (M,Zn) layer) in FIG. 34 represents the element M or zinc. In that case, the proportion of the element M is the same as that of zinc. The element M and zinc can be replaced with each other, and their arrangement is random.

$InMZnO_4$ has a layered crystal structure (also referred to as layered structure) and includes two (M,Zn) layers that contain the element M, zinc, and oxygen with respect to one layer that contains indium and oxygen (hereinafter, In layer), as illustrated in 52.

Furthermore, indium and the element M can be replaced with each other. Accordingly, the (M,Zn) layer whose element M is replaced by indium can also be referred to as (In,M,Zn) layer. In that case, a layered structure that includes two (In,M,Zn) layers with respect to one In layer is obtained.

An oxide semiconductor with an atomic ratio $[In]:[M]:[Zn]=1:1:2$ has a layered structure that includes three (M,Zn) layers with respect to one In layer. In other words, if [Zn] is larger than [In] and [M], the proportion of the (M,Zn) layer to the In layer becomes higher in the case where the oxide semiconductor is crystallized.

Note that in the case where the number of (M,Zn) layers with respect to one In layer is not an integer in the oxide semiconductor, the oxide semiconductor might have a plurality of kinds of layered structures where the number of (M,Zn) layers with respect to one In layer is an integer. For example, in the case of $[In]:[M]:[Zn]=1:1:1.5$, the oxide semiconductor may have a layered structure in which a layered structure including two (M,Zn) layers with respect to one In layer and a layered structure including three (M,Zn) layers with respect to one In layer are mixed.

In the case where the oxide semiconductor is deposited with a sputtering apparatus, for example, a film having an atomic ratio deviated from the atomic ratio of a target is formed. In particular, [Zn] in the film might be smaller than [Zn] in the target depending on the substrate temperature in deposition.

Furthermore, a plurality of phases exist in the oxide semiconductor in some cases (two-phase coexistence, three-phase coexistence, or the like). For example, with an atomic ratio having a value in the neighborhood of an atomic ratio of $[In]:[M]:[Zn]=0:2:1$, two phases of a spinel crystal structure and a layered crystal structure are likely to coexist. Moreover, with an atomic ratio having a value in the neighborhood of an atomic ratio of $[In]:[M]:[Zn]=1:0:0$, two phases of a bixbyite crystal structure and a layered crystal structure are likely to coexist. In the case where a plurality of phases coexist in the oxide semiconductor, a grain boundary may be formed between different crystal structures.

In addition, by increasing the content of indium, the carrier mobility (electron mobility) of the oxide semiconductor can be increased. This is because in an oxide semiconductor containing indium, the element M, and zinc, the s orbital of heavy metal mainly contributes to carrier conduction, and a higher indium content enlarges a region where the s orbitals overlap; therefore, an oxide semiconductor with a high indium content has higher carrier mobility than an oxide semiconductor with a low indium content.

In contrast, when the indium content and the zinc content in an oxide semiconductor become lower, the carrier mobility becomes lower. Thus, with an atomic ratio indicating $[In]:[M]:[Zn]=0:1:0$ and an atomic ratio having a value in the neighborhood thereof (e.g., a region C illustrated in FIG. 33(C)), insulation performance becomes better.

Accordingly, an oxide semiconductor in one embodiment of the present invention preferably has an atomic ratio represented by a region A in FIG. 33(A), with which a layered structure with high carrier mobility and fewer grain boundaries is easily obtained.

In addition, a region B illustrated in FIG. 33(B) represents values of $[In]:[M]:[Zn]=4:2:3$ to 4.1 and in the neighborhood thereof. The values in the neighborhood includes an atomic ratio $[In]:[M]:[Zn]=5:3:4$, for example. An oxide semiconductor with an atomic ratio represented by the region B is an excellent oxide semiconductor that has particularly high crystallinity and high carrier mobility.

Note that a condition where an oxide semiconductor has a layered structure is not uniquely determined by an atomic ratio. The atomic ratio affects difficulty in forming a layered structure. Meanwhile, even with the same atomic ratio, whether a layered structure is formed or not depends on a formation condition in some cases. Therefore, the illustrated regions are regions each representing atomic ratios with which an oxide semiconductor has a layered structure, and boundaries of the region A to the region C are not clear.

Next, the case where the oxide semiconductor is used for a transistor will be described.

Note that when the oxide semiconductor is used for a transistor, carrier scattering or the like at a grain boundary can be reduced; thus, a transistor with high field-effect mobility can be achieved. In addition, a transistor with high reliability can be achieved.

Furthermore, in the case where the object is to inhibit the negative shift of the threshold voltage of the transistor or reduce the off-state current of the transistor, the carrier density of the oxide semiconductor is preferably reduced. In the case where the carrier density of the oxide semiconductor is to be reduced, the concentration of impurities in the oxide semiconductor is reduced so that the density of defect states is reduced. In this specification and the like, having a low impurity concentration and a low density of defect states is referred to as highly purified intrinsic or substantially highly purified intrinsic. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, in the case where the object is to improve the on-state current of a transistor or improve field-effect mobility of a transistor, the carrier density of an oxide semiconductor is preferably increased. In the case where the carrier density of the oxide semiconductor is to be increased, the impurity concentration in the oxide semiconductor is slightly increased, or the density of defect states in the oxide semiconductor is slightly increased. Alternatively, the bandgap of the oxide semiconductor is narrowed. An oxide semiconductor that has a slightly high impurity concentration or a slightly high density of defect states in the range where a favorable on/off ratio is obtained in the Id–Vg characteristics of the transistor can be regarded as substantially intrinsic, for example. Furthermore, an oxide semiconductor that has a high electron affinity and accordingly a narrowed bandgap, and has an increased density of thermally excited electrons (carriers) as a result can be regarded as substantially intrinsic. Note that in the case where an oxide semiconductor with higher electron affinity is used, the threshold voltage of the transistor is further reduced.

The above-described oxide semiconductor with an increased carrier density has somewhat n-type conductivity. Thus, an oxide semiconductor with an increased carrier density can be referred to as being "slightly-n".

The carrier density of a substantially intrinsic oxide semiconductor is preferably higher than or equal to $1\times10^{5}$ cm$^{-3}$ and lower than $1\times10^{18}$ cm$^{-3}$, further preferably higher than or equal to $1\times10^{7}$ cm$^{-3}$ and lower than or equal to $1\times10^{17}$ cm$^{-3}$, still further preferably higher than or equal to $1\times10^{9}$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still further preferably higher than or equal to $1\times10^{11}$ cm$^{-3}$ and lower than or equal to $1\times10^{15}$ cm$^{-3}$.

Furthermore, a highly purified intrinsic or substantially highly purified intrinsic oxide semiconductor has a low density of defect states and accordingly has a low density of trap states in some cases. Charge trapped by the trap states in the oxide semiconductor takes a long time to disappear and may behave like fixed charge. Thus, a transistor whose channel region is formed in an oxide semiconductor with a high density of trap states has unstable electrical characteristics in some cases.

Accordingly, to stabilize electrical characteristics of a transistor, it is effective to reduce the concentration of impurities in the oxide semiconductor. Furthermore, to reduce the concentration of impurities in the oxide semiconductor, the concentration of impurities in an adjacent film is also preferably reduced. Examples of impurities include hydrogen, nitrogen, alkali metal, alkaline earth metal, iron, nickel, and silicon.

Here, the influence of the impurities in the oxide semiconductor is described.

When silicon or carbon, which is a Group 14 element, is contained in the oxide semiconductor, defect states are formed in the oxide semiconductor. For that reason, a region where the concentration of silicon or carbon (the concentration obtained by secondary ion mass spectrometry (SIMS)) is lower than or equal to $2\times10^{18}$ atoms/cm$^{3}$, preferably lower than or equal to $2\times10^{17}$ atoms/cm$^{3}$ is controlled to be provided in the oxide semiconductor or around an interface between the oxide semiconductor and a layer in contact therewith.

Furthermore, when the oxide semiconductor contains alkali metal or alkaline earth metal, defect states are formed and carriers are generated in some cases. Thus, a transistor using an oxide semiconductor that contains alkali metal or alkaline earth metal is likely to have normally-on characteristics. Accordingly, it is preferable to reduce the concentration of alkali metal or alkaline earth metal in the oxide semiconductor. Specifically, the oxide semiconductor is controlled to have a region where the concentration of alkali metal or alkaline earth metal (the concentration obtained by SIMS) is lower than or equal to $1\times10^{18}$ atoms/cm$^{3}$, preferably lower than or equal to $2\times10^{16}$ atoms/cm$^{3}$.

Furthermore, when containing nitrogen, the oxide semiconductor easily becomes by generation of electrons that are carriers and an increase of carrier density. As a result, a transistor in which an oxide semiconductor containing nitrogen is used as a semiconductor is likely to have normally-on characteristics. For this reason, nitrogen in the oxide semiconductor is preferably reduced as much as possible. Specifically, the oxide semiconductor is controlled to have a region where the nitrogen concentration (the concentration obtained by SIMS) is lower than $5\times10^{19}$ atoms/cm$^{3}$, preferably lower than or equal to $5\times10^{18}$ atoms/cm$^{3}$, further preferably lower than or equal to $1\times10^{18}$ atoms/cm$^{3}$, still further preferably lower than or equal to $5\times10^{17}$ atoms/cm$^{3}$.

Furthermore, hydrogen contained in an oxide semiconductor reacts with oxygen bonded to a metal atom to be water, and thus forms an oxygen vacancy in some cases. Due to entry of hydrogen into the oxygen vacancy, an electron that is a carrier is sometimes generated.

Furthermore, in some cases, bonding of part of hydrogen to oxygen bonded to a metal atom causes generation of an electron that is a carrier. Thus, a transistor using an oxide semiconductor that contains hydrogen is likely to have normally-on characteristics. Accordingly, it is preferable that hydrogen in the oxide semiconductor be reduced as much as possible. Specifically, the oxide semiconductor is controlled to have a region where the hydrogen concentration (the concentration obtained by SIMS) is lower than $1\times10^{20}$ atoms/cm$^{3}$, preferably lower than $1\times10^{19}$ atoms/cm$^{3}$, further preferably lower than $5\times10^{18}$ atoms/cm$^{3}$, still further preferably lower than $1\times10^{18}$ atoms/cm$^{3}$.

When an oxide semiconductor with sufficiently reduced impurities is used for a channel formation region in a transistor, the transistor can have stable electrical characteristics. In addition, the off-state current of a transistor in which the above highly purified oxide semiconductor is used for a channel formation region is extremely low. When a voltage between a source and a drain is set to approximately 0.1 V, 5 V, or 10 V, for example, the off-state current per channel width of the transistor can be as low as several yoctoamperes per micrometer to several zeptoamperes per micrometer.

Next, the case where the oxide semiconductor has a two-layer structure or a three-layer structure will be described. With reference to FIG. 35, the description is made of a band diagram of insulators in contact with a stacked-layer structure of an oxide semiconductor S1, an oxide semiconductor S2, and an oxide semiconductor S3; and a band diagram of insulators in contact with a layered structure of the oxide semiconductor S2 and the oxide semiconductor S3. Note that the oxide semiconductor S1, the oxide semiconductor S2, and the oxide semiconductor S3 correspond to the oxide semiconductor layer 130a, the oxide semiconductor layer 130b, and the oxide semiconductor layer 130c, respectively.

Figure 35A:
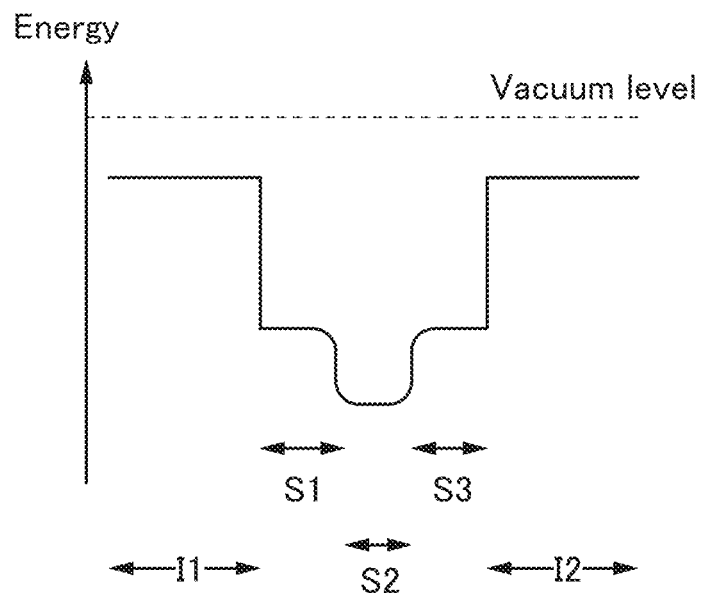
FIG. 35 Band diagrams of layered structures of oxide semiconductors.
Figure 35B:
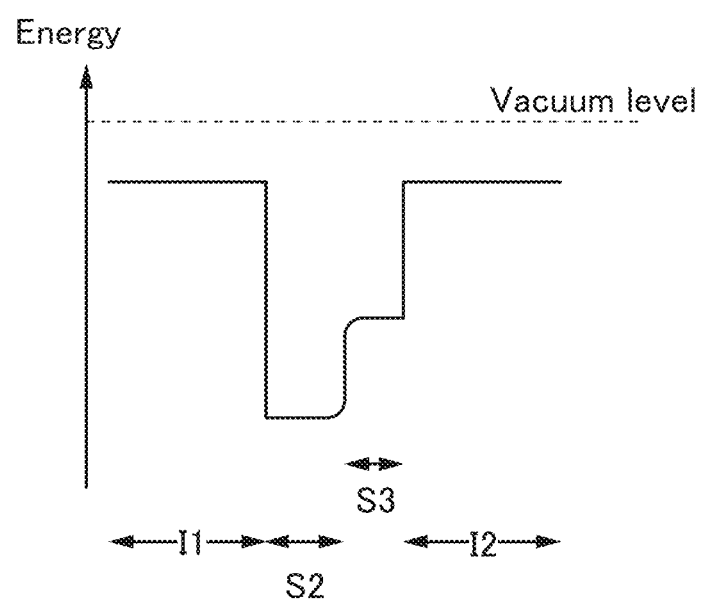

FIG. 35(A) is an example of a band diagram of a layered structure including an insulator the oxide semiconductor S1, the oxide semiconductor S2, the oxide semiconductor S3, and an insulator I2 in the thickness direction. Furthermore, FIG. 35(B) is an example of a band diagram of a layered structure including the insulator I1, the oxide semiconductor S2, the oxide semiconductor S3, and the insulator I2 in the thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductor S1 and the oxide semiconductor S3 is closer to the vacuum level than that of the oxide semiconductor S2; typically, a difference between the energy level of the conduction band minimum of the oxide semiconductor S2 and the energy level of the conduction band minimum of each of the oxide semiconductor S1 and the oxide semiconductor S3 is preferably greater than or equal to 0.15 eV or greater than or equal to 0.5 eV, and less than or equal to 2 eV or less than or equal to 1 eV. That is, it is preferable that the electron affinity of the oxide semiconductor S2 be higher than the electron affinity of each of the oxide semiconductor S1 and the oxide semiconductor S3, and that the difference between the electron affinity of the oxide semiconductor S2 and the electron affinity of each of the oxide semiconductor S1 and the oxide semiconductor S3 be greater than or equal to 0.15 eV or greater than or equal to 0.5 eV, and less than or equal to 2 eV or less than or equal to 1 eV.

As illustrated in FIG. 35(A) and FIG. 35(B), the energy level of the conduction band minimum of each of the oxide semiconductor S1, the oxide semiconductor S2, and the oxide semiconductor S3 is gradually varied. In other words, the energy level of the conduction band minimum is continuously varied or continuous junction is formed. To obtain such a band diagram, the density of defect states in a mixed layer formed at an interface between the oxide semiconductor S1 and the oxide semiconductor S2 or an interface between the oxide semiconductor S2 and the oxide semiconductor S3 is preferably made low.

Specifically, when the oxide semiconductor S1 and the oxide semiconductor S2 or the oxide semiconductor S2 and the oxide semiconductor S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as the oxide semiconductor S1 and the oxide semiconductor S3.

At this time, a main carrier path is the oxide semiconductor S2. Since the density of defect states at the interface between the oxide semiconductor S1 and the oxide semiconductor S2 and the interface between the oxide semiconductor S2 and the oxide semiconductor S3 can be made low, the influence of interface scattering on carrier conduction is small, and a high on-state current can be obtained.

When an electron is trapped by a trap state, the trapped electron behaves like fixed charge; thus, the threshold voltage of the transistor is shifted in a positive direction. The provision of the oxide semiconductor S1 and the oxide semiconductor S3 can make the trap state apart from the oxide semiconductor S2. This structure can prevent the threshold voltage of the transistor from shifting in the positive direction.

A material whose conductivity is sufficiently low as compared with the oxide semiconductor S2 is used for the oxide semiconductor S1 and the oxide semiconductor S3. At this time, the oxide semiconductor S2, the interface between the oxide semiconductor S2 and the oxide semiconductor S1, and the interface between the oxide semiconductor S2 and the oxide semiconductor S3 mainly function as a channel region. For example, an oxide semiconductor with high insulation performance and the atomic ratio represented by the region C in FIG. 33(C) is used as the oxide semiconductor S1 and the oxide semiconductor S3.

When an oxide semiconductor with the atomic ratio represented by the region A is used as the oxide semiconductor S2, an oxide semiconductor with an atomic ratio where [M]/[:In] is 1 or greater, preferably 2 or greater is preferably used as the oxide semiconductor S1 and the oxide semiconductor S3. Moreover, an oxide semiconductor with an atomic ratio where [M]/([Zn]+[In]) is 1 or greater to obtain sufficiently high insulation performance is preferably used as the oxide semiconductor S3.

The structure described in this embodiment can be used in appropriate combination with the structure described in any of the other embodiments.

(Embodiment 6)

In this embodiment, examples of a package and a camera module in each of which an image sensor chip is placed will be described. For the image sensor chip, the structure of an imaging device of one embodiment of the present invention can be used.

Figure 36A:
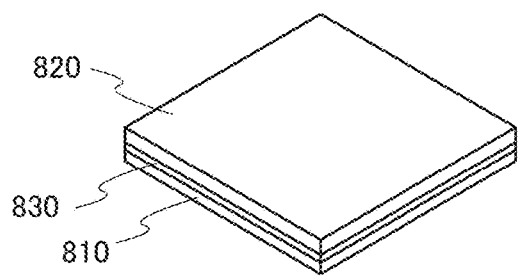
FIG. 36 Perspective views and a cross-sectional view of a package including an imaging device.

FIG. 36(A) is an external perspective view of the top surface side of a package in which an image sensor chip is placed. The package includes a package substrate 810 to which an image sensor chip 850 is fixed, a cover glass 820, an adhesive 830 for bonding the package substrate 810 and the cover glass 820, and the like.

Figure 36B:
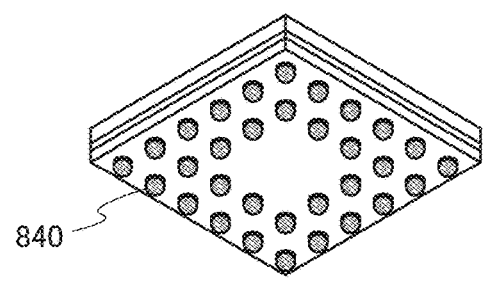

FIG. 36(B) is an external perspective view of the bottom surface side of the package. A BGA (ball grid array) structure in which solder balls are provided as bumps 840 on the bottom surface of the package is used. Note that, not limited to the BGA, an LGA (land grid array), a PGA (pin grid array), or the like may be employed.

Figure 36C:
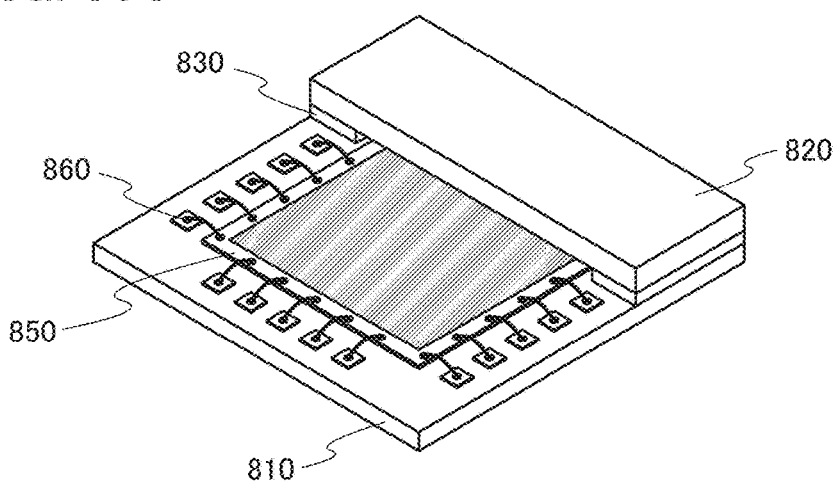
Figure 36D:
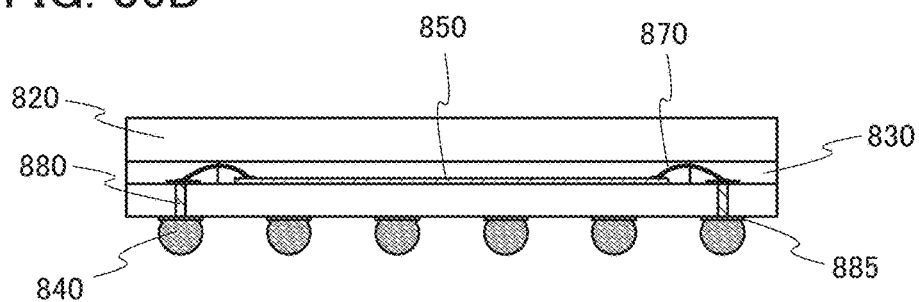

FIG. 36(C) is a perspective view of the package, in which part of the cover glass 820 and adhesive 830 is not illustrated, and FIG. 36(D) is a cross-sectional view of the package. Electrode pads 860 are formed over the package substrate 810, and the electrode pads 860 and the bumps 840 are electrically connected via through-holes 880 and lands 885. The electrode pads 860 are electrically connected to electrodes of the image sensor chip 850 through wires 870.

Figure 37A:
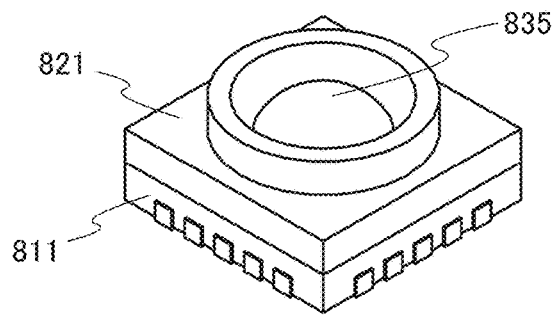
FIG. 37 Perspective views and a cross-sectional view of a package including an imaging device.

Furthermore, FIG. 37(A) is an external perspective view of the top surface side of a camera module in which an image sensor chip is placed in a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851; thus, the structure as an SiP (system in package) is formed.

Figure 37B:
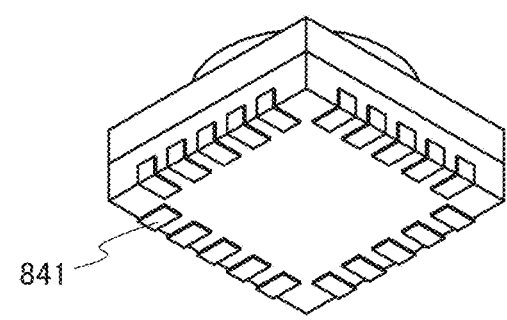

FIG. 37(B) is an external perspective view of the bottom surface side of the camera module. On the bottom surface and four side surfaces of the package substrate 811, a QFN (quad flat no-lead package) structure in which lands 841 for mounting are provided is used. Note that this structure is just an example, and a QFP (quad flat package), the above-mentioned BGA, or the like may also be employed.

Figure 37C:
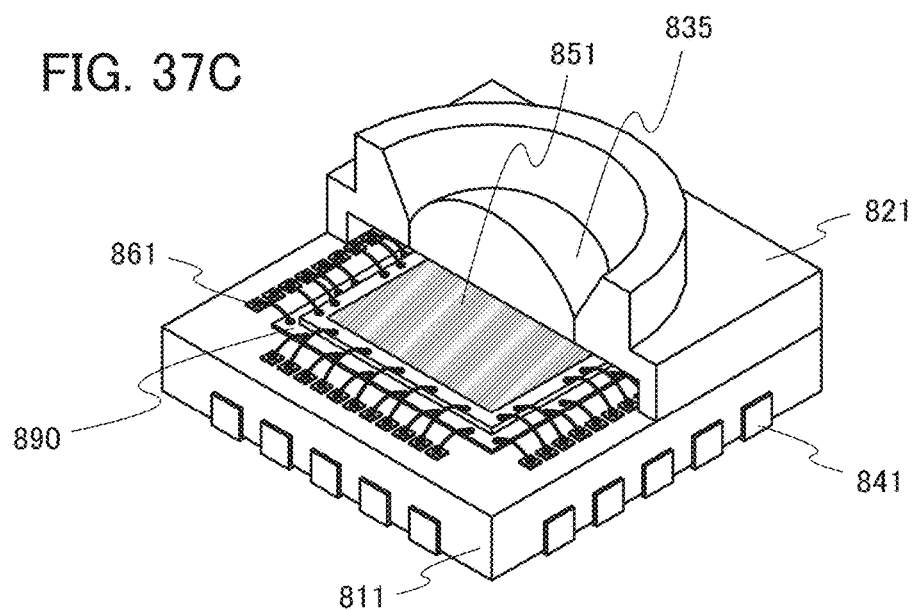
Figure 37D:
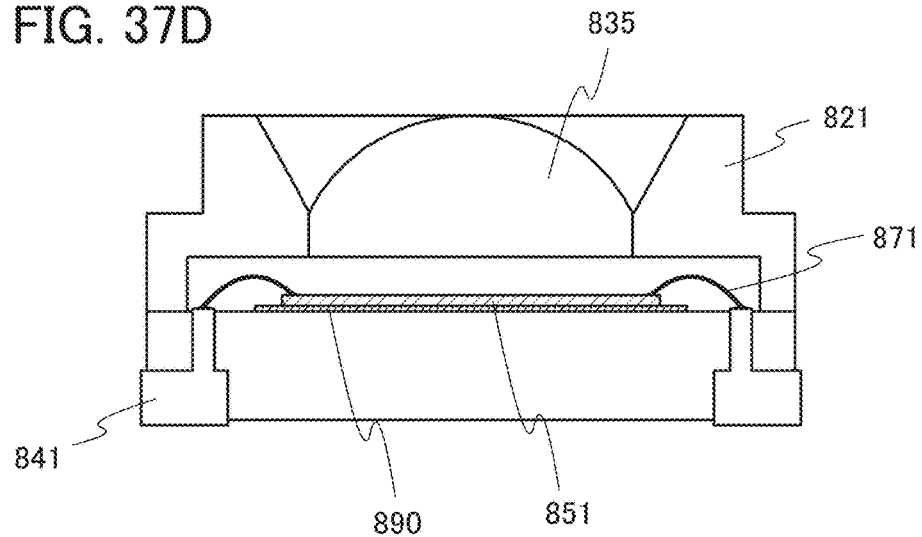

FIG. 37(C) is a perspective view of the module, in which part of the lens cover 821 and lens 835 is not illustrated, and FIG. 37(D) is a cross-sectional view of the camera module. The lands 841 are partly used as electrode pads 861, and the electrode pads 861 are electrically connected to electrodes of the image sensor chip 851 and the IC chip 890 through wires 871.

The image sensor chip placed in a package having the above form can be easily mounted on a printed substrate or the like, and the image sensor chip can be incorporated into a variety of semiconductor devices and electronic devices.

The structure described in this embodiment can be used in appropriate combination with the structure described in any of the other embodiments.

(Embodiment 7)

As electronic devices that can include an imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIG. 38.

Figure 38A:
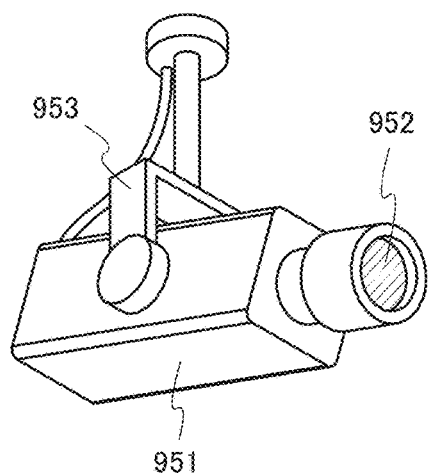
FIG. 38 Drawings illustrating electronic devices.

FIG. 38(A) is a surveillance camera, which includes a housing 951, a lens 952, a support portion 953, and the like. The imaging device of one embodiment of the present invention can be included, as a component for obtaining an image, in the surveillance camera. Note that a surveillance camera is a name in common use and does not limit the use thereof. A device that has a function of a surveillance camera can also be called a camera or a video camera, for example.

Figure 38B:
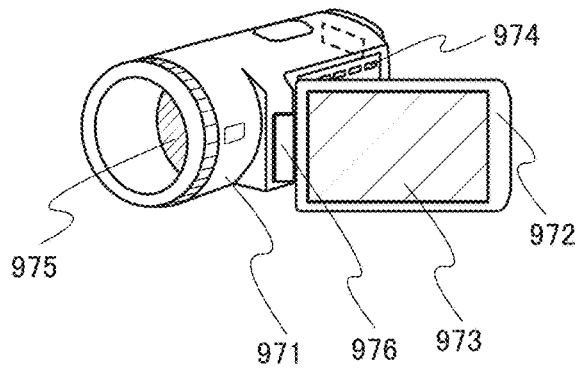

FIG. 38(B) is a video camera, which includes a first housing 971, a second housing 972, a display portion 973, an operation key 974, a lens 975, a connection portion 976, and the like. The operation key 974 and the lens 975 are provided on the first housing 971, and the display portion 973 is provided on the second housing 972. The imaging device of one embodiment of the present invention can be included, as a component for obtaining an image, in the video camera.

Figure 38C:
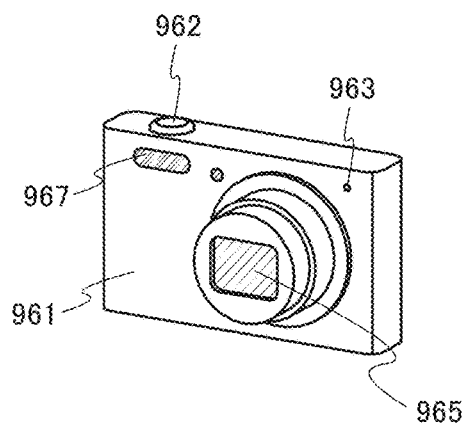

FIG. 38(C) is a digital camera, which includes a housing 961, a shutter button 962, a microphone 963, a light-emitting portion 967, a lens 965, and the like. The imaging device of one embodiment of the present invention can be included, as a component for obtaining an image, in the digital camera.

Figure 38D:
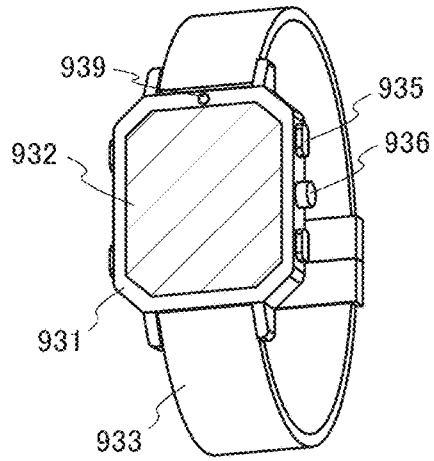

FIG. 38(D) is a wrist-watch-type information terminal, which includes a housing 931, a display portion 932, a wristband 933, an operation button 935, a crown 936, a camera 939, and the like. The display portion 932 may be a touch panel. The imaging device of one embodiment of the present invention can be included, as a component for obtaining an image, in the information terminal.

Figure 38E:
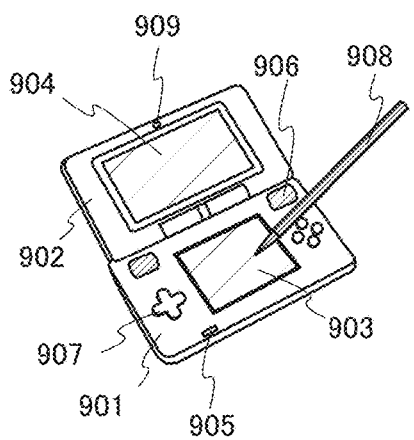

FIG. 38(E) is a portable game machine, which includes a housing 901, a housing 902, a display portion 903, a display portion 904, a microphone 905, a speaker 906, an operation key 907, a stylus 908, a camera 909, and the like. Note that although the portable game machine illustrated in FIG. 38(E) includes the two display portions 903 and 904, the number of display portions included in the portable game machine is not limited to this. The imaging device of one embodiment of the present invention can be included, as a component for obtaining an image, in the portable game machine.

Figure 38F:
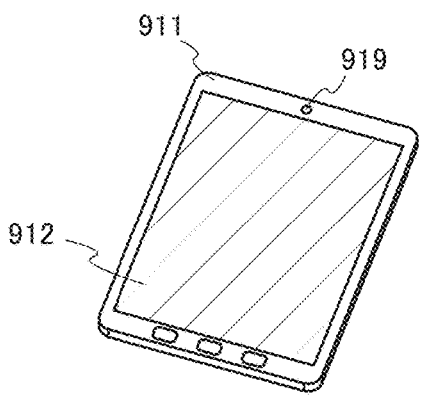

FIG. 38(F) is a portable data terminal, which includes a housing 911, a display portion 912, a camera 919, and the like. A touch panel function of the display portion 912 enables input and output of information. The imaging device of one embodiment of the present invention can be included, as a component for obtaining an image, in the portable data terminal.

Note that this embodiment can be combined with any of the other embodiments in this specification as appropriate.

REFERENCE NUMERALS 20 pixel
20a pixel
20b pixel
20c pixel
21 pixel array
22 circuit
23 circuit
24 circuit
25 circuit
26 circuit
27 circuit
28 circuit
29 circuit
31 comparator circuit
32 comparator circuit
33 NAND circuit
34 NAND circuit
35 NOR circuit
36 inverter circuit
37 level shifter circuit
41 transistor
42 transistor
43 transistor
44 transistor
45 transistor
46 transistor
47 transistor
51 transistor
52 transistor
53 transistor
54 transistor
55 transistor
56 transistor
57 transistor
58 transistor
59 transistor
60 transistor
61 wiring
62 wiring
63 wiring
65 wiring
66 wiring
69 wiring
71 wiring
71a conductive layer
71b conductive layer
72 wiring
73 wiring
74 wiring
75 wiring
79 wiring 80 insulating layer
80a insulating layer
80b insulating layer
81 insulating layer
81a insulating layer
81b insulating layer
81e insulating layer
81h insulating layer
81i insulating layer
81j insulating layer
81k insulating layer
82 conductor
82a conductor
82b conductor
83 insulating layer
84 conductive layer
85 conductive layer
88 wiring
90 wiring
91 wiring
92 wiring
93 wiring
94 wiring
101 transistor
102 transistor
103 transistor
104 transistor
105 transistor
106 transistor
107 transistor
115 substrate
120 insulating layer
130 oxide semiconductor layer
130a oxide semiconductor layer
130b oxide semiconductor layer
130c oxide semiconductor layer
130d oxide semiconductor layer
140 conductive layer
141 conductive layer
145 insulating layer
150 conductive layer
151 conductive layer
155 insulating layer
160 insulating layer
170 conductive layer
171 conductive layer
172 conductive layer
173 conductive layer
180 insulating layer
200 conductor
201 conductor
210 insulating layer
231 region
232 region
402 connection portion
402a metal layer
402b metal layer
403 connection portion
403a metal layer
403b metal layer
405 metal layer
443 transistor
546 transistor
547 transistor
561 photoelectric conversion layer
562 light-transmitting conductive layer
563 semiconductor layer
564 semiconductor layer
565 semiconductor layer
566 electrode
566a conductive layer
566b conductive layer
567 partition wall
568 hole-injection blocking layer
569 electron-injection blocking layer
588 wiring
600 single-crystal silicon substrate
620 p+ region
630 p− region
640 n-type region
650 p+ region
660 active layer
710 wiring
711 wiring
712 wiring
713 wiring
810 package substrate
811 package substrate
820 cover glass
821 lens cover
830 adhesive
835 lens
840 bump
841 land
850 image sensor chip
851 image sensor chip
860 electrode pad
861 electrode pad
870 wire
871 wire
880 through-hole
885 land
890 IC chip
901 housing
902 housing
903 display portion
904 display portion
905 microphone
906 speaker
907 operation key
908 stylus
909 camera
911 housing
912 display portion
919 camera
931 housing
932 display portion
933 wristband
935 button
936 crown
939 camera
951 housing
952 lens
953 support portion
961 housing
962 shutter button
963 microphone
965 lens
967 light-emitting portion
971 housing
972 housing
973 display portion
974 operation key
975 lens 976 connection portion
1100 layer
1200 layer
1300 layer
1400 layer
1530 light-blocking layer
1540 microlens array
1550a optical conversion layer
1550b optical conversion layer
1550c optical conversion layer

The invention claimed is:

1. An imaging device comprising:
a first pixel circuit, a second pixel circuit, a first circuit, a second circuit, a third circuit, a fourth circuit, a fifth circuit, and a first wiring,
wherein the first pixel circuit is electrically connected to the first circuit,
wherein the first pixel circuit is electrically connected to the fourth circuit,
wherein the second pixel circuit is electrically connected to the second circuit,
wherein the second pixel circuit is electrically connected to the fifth circuit,
wherein the first circuit is electrically connected to the first wiring,
wherein the second circuit is electrically connected to the first wiring,
wherein the first wiring is electrically connected to the third circuit,
wherein the third circuit is electrically connected to the fourth circuit,
wherein the third circuit is electrically connected to the fifth circuit,
wherein the first and the second pixel circuit have a function of outputting an analog signal,
wherein the first and the second pixel circuit have a function of outputting a difference in potential between two different frames,
wherein the first and the second circuit have a function of outputting a third potential to the first wiring in a case where the difference in potential is greater than or equal to a first potential,
wherein the first and the second circuit have a function of outputting the third potential to the first wiring in a case where the difference in potential is less than or equal to a second potential,
wherein the first and the second circuit have a function of outputting a fourth potential to the first wiring in a case where the difference in potential is greater than the second potential and less than the first potential,
wherein the third circuit has a function of supplying power to the fourth and the fifth circuit,
wherein the fourth and the fifth circuit have a function of converting the analog signal to a digital signal, and
wherein the third circuit has a function of supplying power to the fourth and the fifth circuit when the first wiring is at the third potential and not supplying power to the fourth and the fifth circuit when the first wiring is at the fourth potential.

2. The imaging device according to claim 1, further comprising a sixth circuit and a seventh circuit,
wherein the sixth circuit is electrically connected to the first and the second pixel circuit,
wherein the seventh circuit is electrically connected to the fourth and the fifth circuit,
wherein the sixth circuit is electrically connected to the third circuit,
wherein the seventh circuit is electrically connected to the third circuit,
wherein the sixth circuit has a function of selecting the first and the second pixel circuit,
wherein the seventh circuit has a function of selecting the fourth or the fifth circuit, and
wherein the third circuit has a function of supplying power to the seventh circuit when the first wiring is at the third potential and not supplying power to the seventh circuit when the first wiring is at the fourth potential.

3. The imaging device according to claim 2, further comprising an eighth circuit and a second wiring,
wherein the eighth circuit is electrically connected to the second wiring,
wherein the eighth circuit is electrically connected to the sixth circuit,
wherein the eighth circuit is electrically connected to the first and the second pixel circuit,
wherein the eighth circuit has a function of bringing the sixth circuit and the first and the second pixel circuit into conduction,
wherein the eighth circuit has a function of bringing the sixth circuit and the first and the second pixel circuit into conduction when the second wiring is at a fifth potential and bringing the sixth circuit and the first and the second pixel circuit out of conduction when the second wiring is at a sixth potential, and
wherein the eighth circuit has a function of selecting the first and the second pixel circuit when the second wiring is at the sixth potential.

4. The imaging device according to claim 1,
wherein the first and the second pixel circuit comprise a photoelectric conversion element, a first transistor, a second transistor, a third transistor, a fourth transistor, and a capacitor,
wherein one of electrodes of the photoelectric conversion element is electrically connected to one of a source or a drain of the first transistor,
wherein the other of the source or the drain of the first transistor is electrically connected to the other of a source or a drain of the second transistor,
wherein the other of the source or the drain of the first transistor is electrically connected to one of electrodes of the capacitor,
wherein the other of the electrodes of the capacitor is electrically connected to the other of a source or a drain of the third transistor,
wherein the other of the electrodes of the capacitor is electrically connected to a gate of the fourth transistor, and
wherein one of a source or a drain of the fourth transistor is electrically connected to one of a source or a drain of the fifth transistor.

5. The imaging device according to claim 4, wherein the first to third transistors comprise an oxide semiconductor in a channel formation region, and the oxide semiconductor comprises In, Zn, and M (M is Al, Ga, Y, or Sn).

6. A module comprising:
the imaging device according to claim 1; and
a lens.

7. An electronic device comprising:
the imaging device according to claim 1; and
a display device.

* * * * *